US012604651B2

(12) United States Patent
Bulovic et al.

(10) Patent No.: US 12,604,651 B2
(45) Date of Patent: Apr. 14, 2026

(54) RAPID FABRICATION OF SEMICONDUCTOR THIN FILMS

(71) Applicant: Massachusetts Institute of Technology, Cambridge, MA (US)

(72) Inventors: Vladimir Bulovic, Lexington, MA (US); Richard Swartwout, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 34 days.

(21) Appl. No.: 18/562,679

(22) PCT Filed: May 26, 2022

(86) PCT No.: PCT/US2022/031089
§ 371 (c)(1),
(2) Date: Nov. 20, 2023

(87) PCT Pub. No.: WO2022/251463
PCT Pub. Date: Dec. 1, 2022

(65) Prior Publication Data
US 2024/0188422 A1 Jun. 6, 2024

Related U.S. Application Data

(60) Provisional application No. 63/193,349, filed on May 26, 2021.

(51) Int. Cl.
*H10K 71/15* (2023.01)
*C07F 19/00* (2006.01)
(Continued)

(52) U.S. Cl.
CPC .......... *H10K 71/15* (2023.02); *C07F 19/005* (2013.01); *C09D 11/033* (2013.01);
(Continued)

(58) Field of Classification Search
CPC .......... C30B 7/14; C30B 29/10; C30B 29/12; C30B 29/16; C30B 29/40; C30B 29/46;
(Continued)

(56) References Cited

U.S. PATENT DOCUMENTS 9,305,715 B2 4/2016 Irwin et al.
2017/0053746 A1 2/2017 Belcher et al.
(Continued)

FOREIGN PATENT DOCUMENTS

IN 201611028206 A 3/2018
JP 2020502769 A * 1/2020 .......... H10K 50/115
(Continued)

OTHER PUBLICATIONS

Extended European Search Report dated Mar. 24, 2025, for European Patent Application No. 22812137.2; 13 pages.
(Continued)

*Primary Examiner* — Edward Chin
(74) *Attorney, Agent, or Firm* — Daly, Crowley, Mofford & Durkee, LLP

(57) ABSTRACT

Semiconductor thin films and rapid methods of fabrication can include mixed cations created through recrystalization.

26 Claims, 44 Drawing Sheets

(51) Int. Cl.

| | |
|---|---|
| *C09D 11/033* | (2014.01) |
| *C09D 11/037* | (2014.01) |
| *C09D 11/52* | (2014.01) |
| *H10K 30/50* | (2023.01) |
| *H10K 71/40* | (2023.01) |
| *H10K 85/50* | (2023.01) |

(52) U.S. Cl.
CPC ............ *C09D 11/037* (2013.01); *C09D 11/52* (2013.01); *H10K 30/50* (2023.02); *H10K 71/40* (2023.02); *H10K 85/50* (2023.02)

(58) Field of Classification Search
CPC ..... C30B 29/48; C30B 29/605; C01G 21/006; C01G 21/00; C01G 55/002; C09K 11/665; C09K 11/00; C09K 11/08; C09K 11/61; C09K 11/06; C09K 11/661; C09K 11/664; C09K 11/675; C09K 11/881; C09K 11/883; C09K 2211/188; C09K 11/628; B82Y 40/00; B82Y 20/00; B82Y 30/00
See application file for complete search history.

(56) References Cited

U.S. PATENT DOCUMENTS

| | | | |
|---|---|---|---|
| 2018/0019066 A1 | 1/2018 | Hayakawa et al. | |
| 2018/0351019 A1 | 12/2018 | Zhu et al. | |
| 2020/0279964 A1 | 9/2020 | Zhu et al. | |
| 2022/0362851 A1 * | 11/2022 | Zhao ..................... | B29C 64/106 |

FOREIGN PATENT DOCUMENTS

| | | | | |
|---|---|---|---|---|
| WO | WO-2021006554 A2 * | 1/2021 | ............. | H10K 85/50 |
| WO | WO-2022251463 A1 * | 12/2022 | ............. | H10K 71/40 |

OTHER PUBLICATIONS

Chen et al., "In Situ Growth of 2D Perovskite Capping Layer for Stable and Efficient Perovskite Solar Cells"; Advanced Functional Materials, 28, 1706923; Feb. 2018; 10 pages.

Zhang et al., "Crystallinity Preservation and Ion Migration Suppression Through Dual Ion Exchange Strategy for Stable Mixed Perovskite Solar Cells"; Advanced Functional Materials, 7, 1700118; May 2017; 10 pages.

Kim et al., "A review on two-dimensional (2D) and 2D-3D multidimensional perovskite solar cells: Perovskites structures, stability, and photovoltaic performances"; Journal of Photochemistry & Photobiology, C: Photochemistry Reviews, 48, 100405; Feb. 2021; 22 pages.

Xiao et al., "Post-treatment techniques for high-performance perovskite solar cells"; Materials Research Society Bulletin, vol. 45; Jun. 2020; 8 pages.

International Search Report issued on Oct. 26, 2022 in PCT application PCT/US2022/031089.

Written Opinion of the International Searching Authority issued on Oct. 26, 2022 in PCT application PCT/US2022/031089.

Cui, Yuying et al. "Green-Solvent-Processable Perovskite Solar Cells." (2020).

Liu, Qiuju et al. "A mixed solvent for rapid fabrication of large-area methylammonium lead iodide layers by one-step coating at room temperature." Journal of Materials Chemistry A (2019): n. pag.

Li, Fengzhu et al. "A Cation-Exchange Approach for the Fabrication of Efficient Methylammonium Tin Iodide Perovskite Solar Cells." Angewandte Chemie 58 20 (2019): 6688-6692.

Liu, Tongfa et al. "Interfacial Post-Treatment for Enhancing the Performance of Printable Carbon-Based Perovskite Solar Cells." Solar RRL (2020): n. pag.

European Communication pursuant to Rules 70(2) and 70a(2) EPC dated Apr. 10, 2025 for European Patent Application No. 22812137. 2; 1 page.

Response to European Communication pursuant to Rules 70(2) and 70a(2) EPC dated Apr. 10, 2025 for European Patent Application No. 22812137.2; Response filed Oct. 9, 2025; 13 pages.

Chinese First Office Action (with English translation of Office Action and Pending Claims) dated Nov. 13, 2025 for Chinese Patent Application No. CN202280037655.9; 30 pages.

Liu et al.; "Interfacial Post-Treatment for Enhancing the Performance of Printable Carbon-Based Perovskite Solar Cells"; Solar RRL, vol. 4, No. 2; Jul. 6, 2019; 10 pages.

* cited by examiner

Methylamine    Ethylamine    Propylamine    Phenethylamine

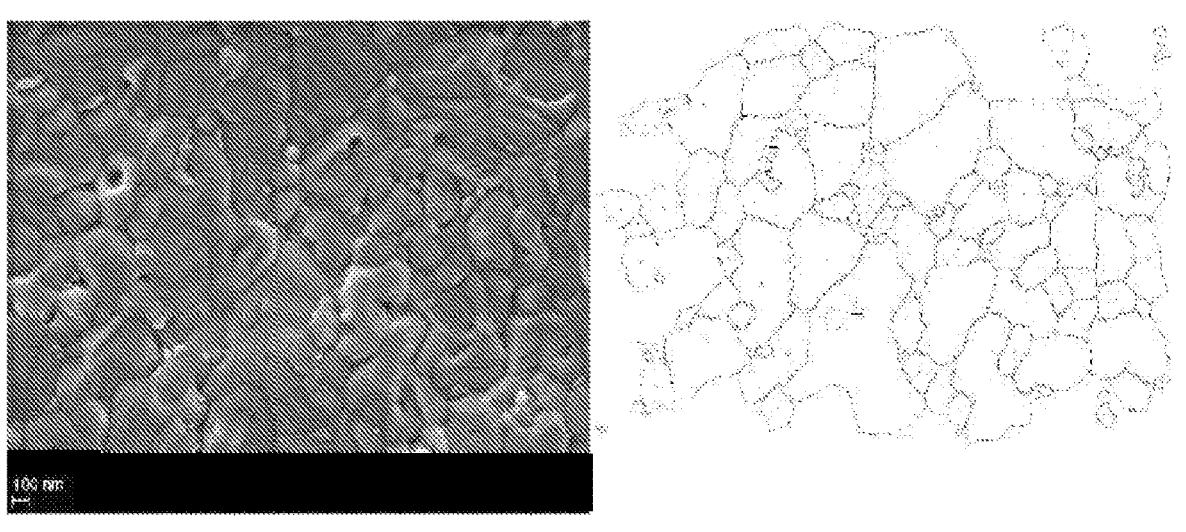
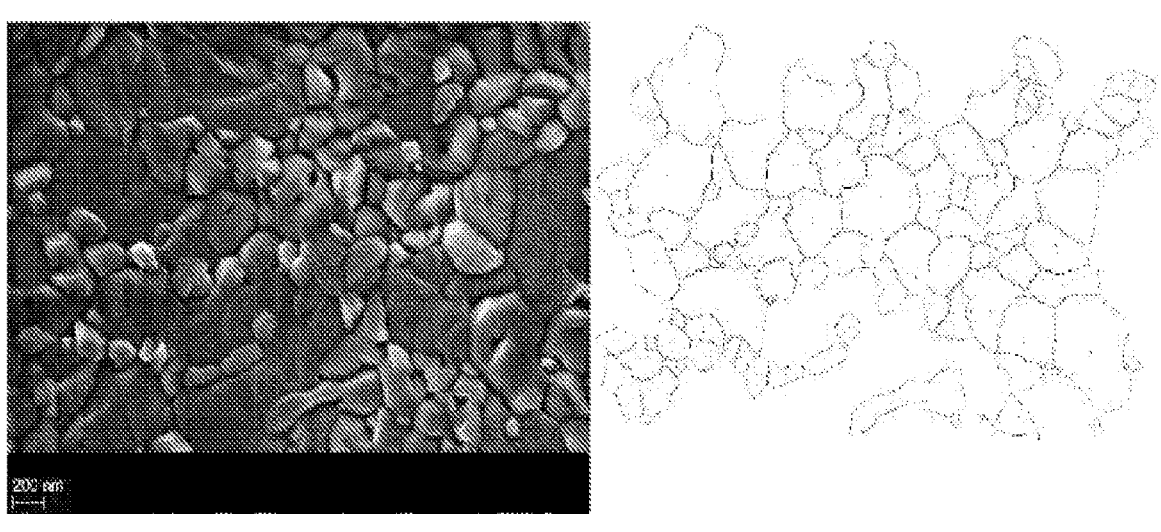
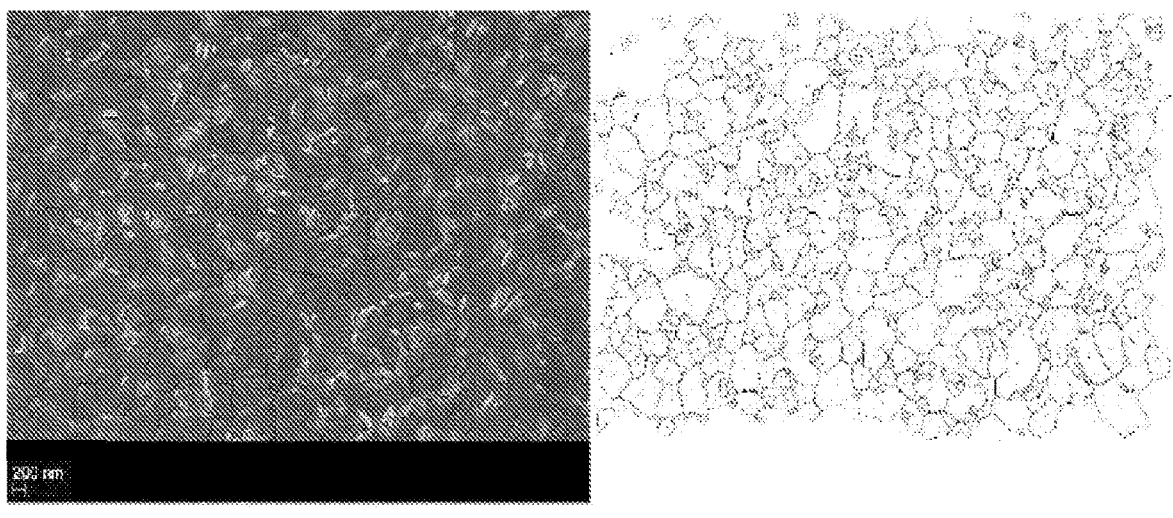
FIG. 2

| Parameter | Fit |
| --- | --- |
| Dispersion - SD | 16.69 ± 0.17 |
| Polarity - SP | 13.60 ± |
| Hydrogen Bonding | 8.12 ± 0.15 |
| Interaction Radius | 7.70 ± 0.19 |

*Grains measured by SEM:*

*Grains measured by PL Mapping:*

| Peak ID | B.E | Area | FWHM | Group % |
|---|---|---|---|---|
| C-C, C-H | 285.087 | 7233 | 1.412 | 31.841 |
| C-N | 286.481 | 5165 | 1.411 | 22.74 |
| C=N | 288.782 | 10317 | 1.412 | 45.419 |

Spot 1

Spot 2

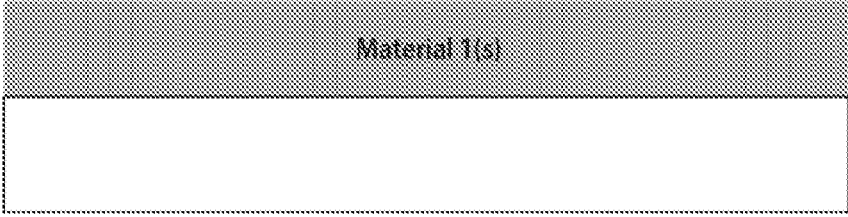
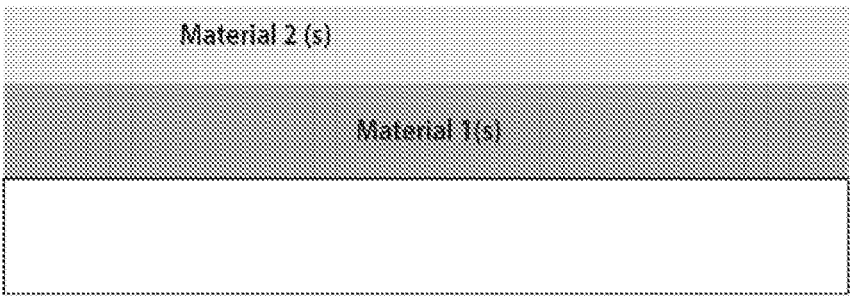
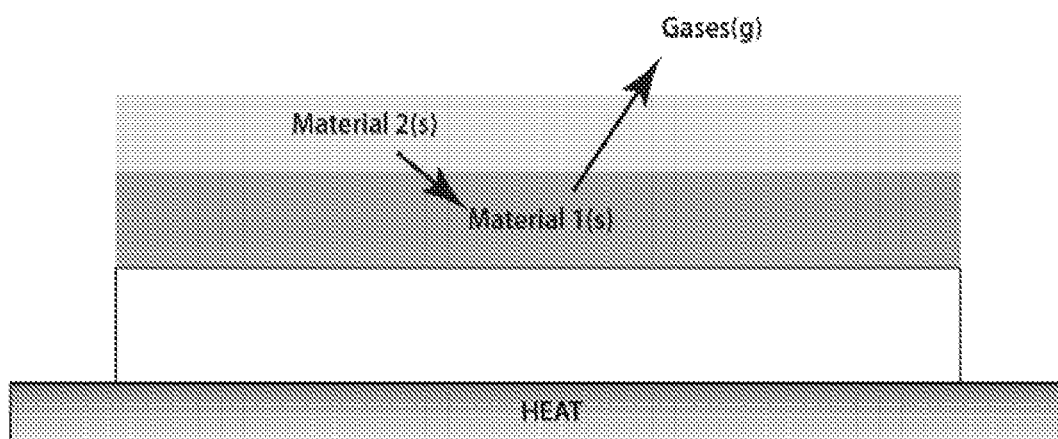
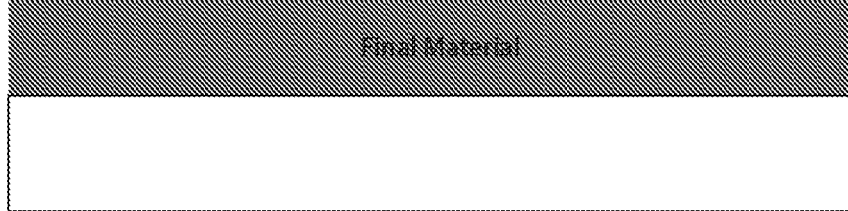
FIG. 34

General Mechanism a)   $HA$   +   $PbI_2$   $\longrightarrow$   $HA \text{---} PbI_2$   $\underset{\xleftarrow{\hspace{1cm}}}{\xrightarrow{\hspace{0.3cm}B\hspace{0.3cm}}}$   $PbIA$   $+ (BH)^+I^-$ (1)                              (2)              (3)        (4)      (5)

HA = B = butylamine b)   $CH_3(CH_2)_3NH_2$                      $CH_3(CH_2)_3NH_2$   $\underset{\xleftarrow{\hspace{1cm}}}{\xrightarrow{\hspace{0.3cm}CH_3(CH_2)_3NH_2\hspace{0.3cm}}}$   $PbI[CH_3(CH_2)_3NH]$   (6)

$+ PbI_2$   $\longrightarrow$                    $\diagdown$                                        $+$ $PbI_2$                              $CH_3(CH_2)_3NH_3^+I^-$ (2)

Formic acid = HA ≠ B = butylamine c)   $CHOOH$   +   $PbI_2$   $\xrightarrow{\text{DMF}}$   $HOCHO \text{---} PbI_2$   $\underset{\xleftarrow{\hspace{1cm}}}{\xrightarrow{\hspace{0.3cm}CH_3(CH_2)_3NH_2\hspace{0.3cm}}}$   $PbI(CHOO)$   (7)

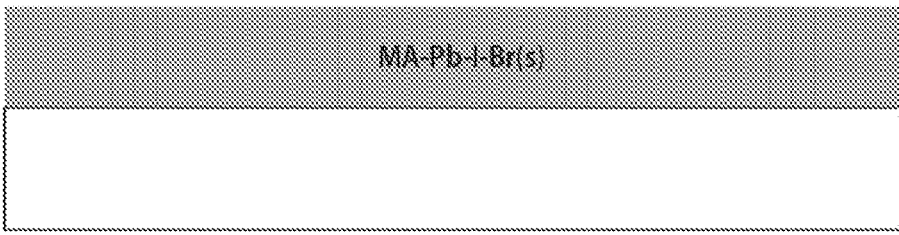
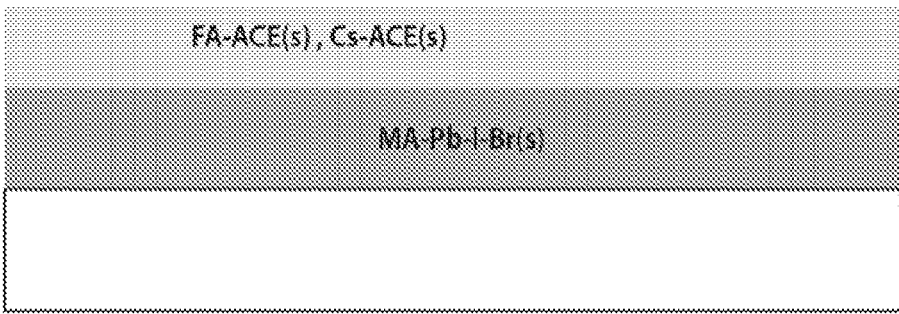
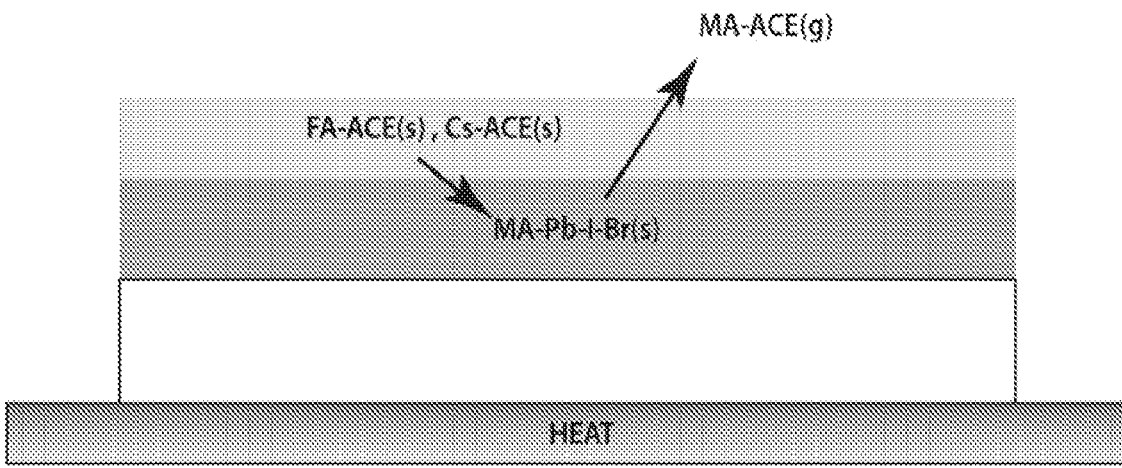
FIG. 36

'ACN_5%_0min annealing_J'     ─ ─ ─ ─ ─ 'ACN_5%_2min annealing_J'

─ · ─ · ─ 'ACN_5%_5min annealing_J'     ·············· 'ACN_5%_15min annealing_J'

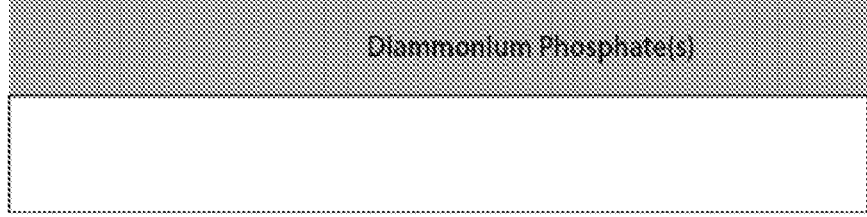
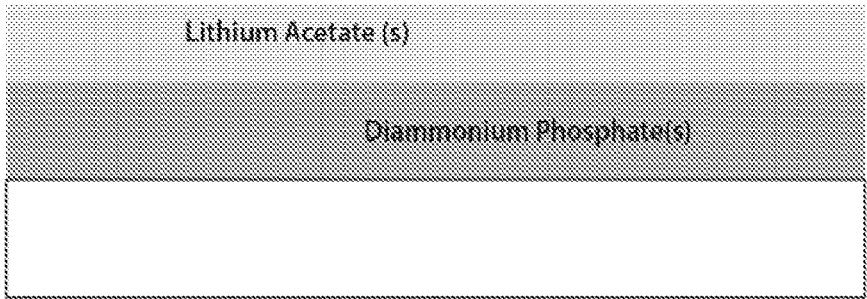
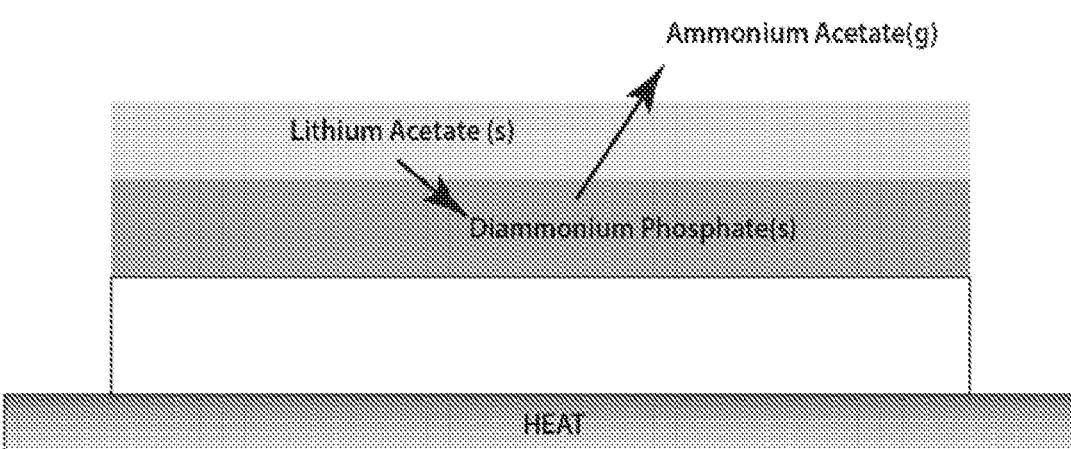
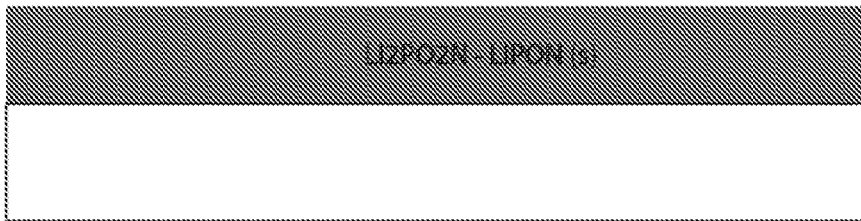
FIG. 41

Metal Conductor

Hole Transport Layer

Perovskite Material

Electron Transport Layer

Transparent Conducting Oxide

Substrate

RAPID FABRICATION OF SEMICONDUCTOR THIN FILMS

CROSS-REFERENCE TO RELATED APPLICATIONS

This application is a National Phase application filed under 35 USC § 371 of International Application No. PCT/US2022/031089, filed on May 26, 2022, which claims priority to U.S. Provisional Patent Application No. 63/193,349, filed May 26, 2021, each of which is incorporated by reference in its entirety.

FIELD OF THE INVENTION

The invention relates to semiconductor thin films and fabrication thereof.

BACKGROUND

In recent years, there has been much interest in solution-processed semiconductor thin films for large area electronics. Solution processing of semiconductors have the potential for lower cost solar cells, lower cost batteries as well as the ability to process thin films at high speeds. However, there have been limitations from current semiconductor inks that inhibit overall development, manufacturing and final yield. In addition, traditional ink systems can be challenging to remove requiring long thermal annealing times, thereby limiting final manufacturing speed.

SUMMARY

In general, a method of fabricating a semiconductor film can include applying a recrystallization additive to a perovskite material. The method can increase fabrication efficiency and create high quality semiconductor film materials for a variety of applications, including photovoltaics, photosensors, light emitting devices, or charge storage devices.

In one aspect, a method of fabricating a semiconductor thin film can include depositing a perovskite precursor in a first solvent on a substrate, the precursor forming a first perovskite layer on a surface of the substrate, applying a recrystallization additive in a second solvent to the layer on the surface of the substrate to form a second layer on the substrate, and annealing the first layer and the second layer to exchange a cation of the recrystallization additive with a cation of the perovskite precursor to form a perovskite alloy film and a volatile byproduct.

In certain circumstances, time between the applying and the annealing can be less than 60 minutes.

In certain circumstances, the method can include treating the layer with an annealing ink including an alkylammonium chloride in a third solvent that is not a solvent for the semiconductor film.

In another aspect, an ink formulation system for producing a semiconductor film can include a first ink including a perovskite precursor in a first solvent and a second ink including a recrystallization additive in a second solvent. In certain circumstances, the ink formulation can include an annealing ink.

In certain circumstances, the first perovskite layer can be a 2D perovskite layer.

In certain circumstances, the perovskite precursor can include an alkyl ammonium lead halide. In certain circumstances, the halide can be a chloride, a bromide or an iodide. For example, the perovskite precursor can include a methylammonium lead iodide.

In certain circumstances, the perovskite precursor can include an alkyl amine. For example, the alkyl amine can be methylamine, ethylamine, propylamine, isopropylamine, or phenethylamine.

In certain circumstances, the first solvent can include tetrahydrofuran, 2-methyltetrahydrofuran, a glycol ether, acetonitrile, methanol, ethanol, propanol, butanol, tris(dimethylamino)silane, bis(dimethylamino)dimethylsilane, hexamethyldisilazane, hexamethylphosphoramide (HMPA), N,N-dimethyltrimethylsilylamine, dimethylformamide, dimethylsulfoxide, propylene carbonate, gamma butyrolactone, 1,3-dimethyl-2-imidazolidinone, N,N'-dimethylpropyleneurea, N-butylpyrrolidinone, or combinations thereof. The first solvent can include tetrahydrofuran.

In certain circumstances, the second solvent can include an alcohol. The alcohol can include isopropanol, butanol, or a glycol ether. For example, the glycol ether can be propylene glycol propyl ether, propylene glycol methyl ether, propylene glycol butyl ether, ethylene glycol propyl ether, ethylene glycol methyl ether, ethylene glycol butyl ether, or combinations thereof.

In certain circumstances, the recrystallization additive can be a salt. For example, the recrystallization additive can include a formate salt, an acetate salt, or combinations thereof. In certain circumstances, the recrystallization additive can include a formamidinium formate, formamidinium acetate, cesium formate, cesium acetate, strontium formate, strontium acetate, ytterbium formate, ytterbium acetate, cerium formate, cerium acetate, germanium formate, germanium acetate, or combinations thereof.

In certain circumstances, the annealing ink can include an alkylammonium chloride in a third solvent that is not a solvent for the semiconductor film. For example, the alkylammonium chloride can include methylammonium chloride. The third solvent can include propylene glycol methyl ether.

In certain circumstances, the perovskite alloy film can include a material having the formula (I)

$$(A:A')(Pb:B')X_3 \tag{I}$$

where A is an organic cation, A' is an organic or an inorganic cation different from A', B' is a divalent metal cation or missing, and X is a halide ion. For example, B' can be Sn, Cu, Ni, Co, Fe, Mg, Mn, Sr, Zn, Pd, Cd, Ge, Yb, Ce, or Eu. In certain circumstances, A' can be formamidinium or cesium. In certain circumstances, A can be methylammonium, ethylammonium, propylammonium (including isopropylammonium), butylammonium, or phenethylammonium. In certain circumstances, a ratio of A:A' can be tuned based on a cation content of the perovskite precursor and a cation content of the recrystallization additive.

In certain circumstances, grains of the perovskite alloy can be substantially oriented to [100] rather than [010]. In certain circumstances, the grains can be generally greater than one micron, greater than 1.2 microns, greater than 1.4 microns, greater than 1.6 microns, greater than 1.8 microns, or greater than 2.0 microns. In certain circumstances, an x-ray diffraction peak of the perovskite alloy can be shifted approximated 0.025 degrees from a predicted x-ray diffraction peak.

In certain circumstances, the volatile byproduct can include an ammonium acetate or an ammonium formate, or a decomposition product thereof. For example, the ammonium can be methylammonium, ethylammonium, propylammonium (including isopropylammonium), butylammonium, or phenethylammonium.

In certain circumstances, the substrate can be glass, metal, or plastic. The substrate can include other coatings, for example, a conductive coating.

In certain circumstances, the method can include depositing a perovskite precursor. For example, depositing can include spin-coating, ink-jet printing, roll-to-roll printing, slot die coating, blade coating, or spray coating.

In certain circumstances, the method can include applying a recrystallization additive. For example, applying can include spin-coating, ink-jet printing, roll-to-roll printing, slot die coating, blade coating, or spray coating.

In certain circumstances, the method can include annealing. The annealing can include applying heat at an annealing temperature for an annealing time. For example, the annealing temperature can be between 30° C. and 200° C. In another example, the annealing time can be between 20 seconds and 60 minutes.

In another aspect, a semiconductor film can include a perovskite alloy as described above.

In another aspect, a photovoltaic device can include a first electrode, a second electrode; and a perovskite layer between the first electrode and the second electrode, wherein the perovskite layer includes a perovskite alloy described herein.

In certain circumstances, the device can be made by a method described herein.

In certain circumstances, the device can have a power conversion efficiency of over 15%. In certain circumstances, the device can have a power conversion efficiency of over 20%.

Other aspects, embodiments, and features will be apparent from the following description, the drawings, and the claims.

BRIEF DESCRIPTION OF DRAWINGS

FIG. 2 depicts grains from three different solvent systems.

FIG. 34 is a schematic showing the general process for material conversion of the two step fabrication process described herein.

FIG. 35 depicts a reaction scheme for amine complexation with lead salts.

FIG. 36 depicts the cation exchange process for multi-cation perovskites as described.

FIG. 41 depicts the two step method described herein applied to a lithium phosphate thin film system.

DETAILED DESCRIPTION

Figure 1:
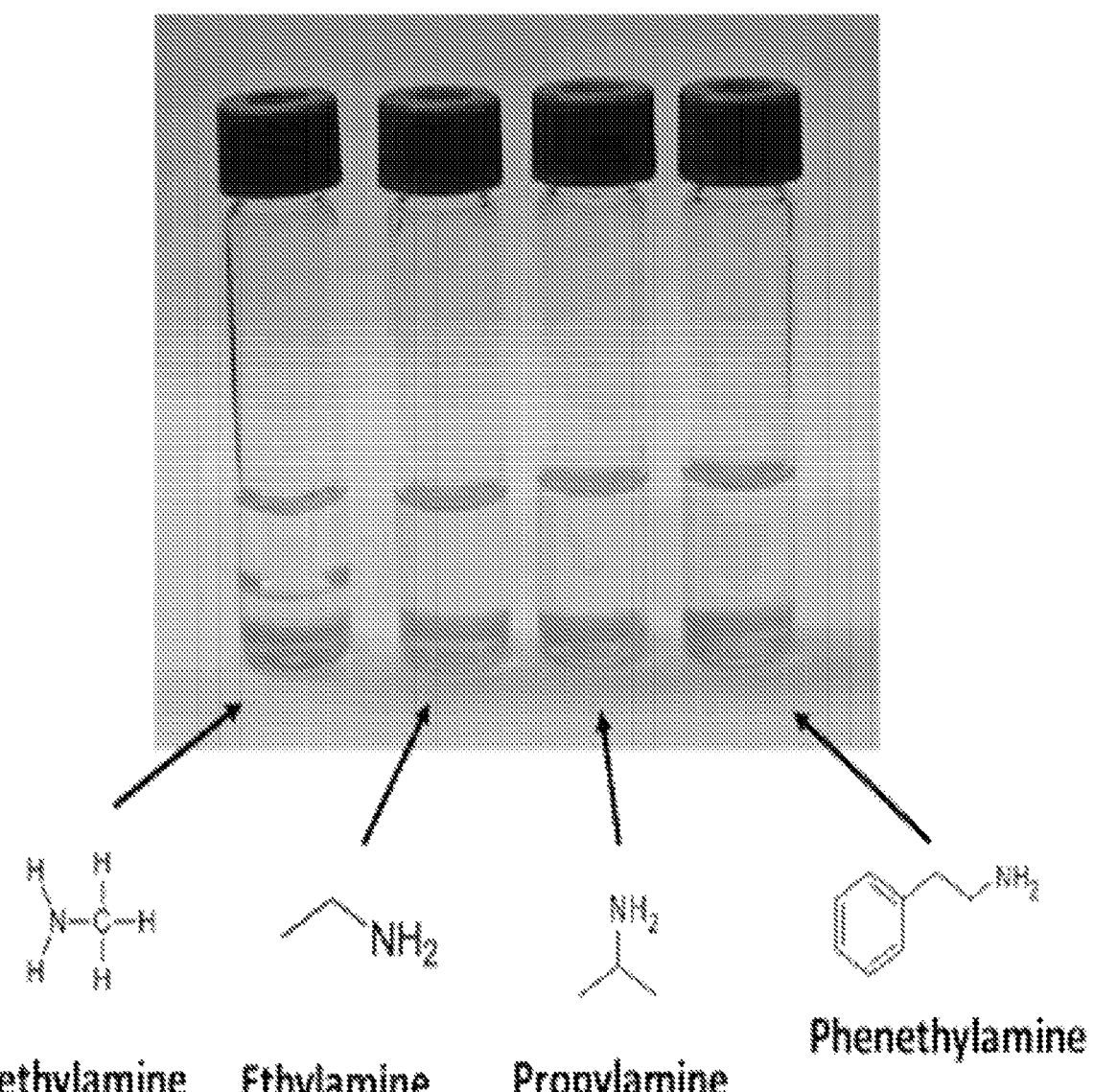
FIG. 1 depicts solubility of perovskites in a solvent.

A method of fabricating a semiconductor film can include applying a recrystallization additive to a perovskite material. The fabrication can use an ink, for example, a perovskite precursor ink. The precursor ink can be deposited on a substrate to form a perovskite film. A second ink can then be deposited on the perovskite film. The second ink can include a recrystallization additive, for example, formamidinium formate, cesium formate, formamidinium acetate, cesium acetate, strontium formate, strontium acetate, ytterbium formate, ytterbium acetate, cerium formate, cerium acetate, germanium formate, germanium acetate, or combinations thereof. This fabrication process can be implemented on a moving substrate and can achieve a high throughput rate of forming the semiconductor film. The process can be selected to reduce the toxicity of solvents used in the first, precursor ink and still achieve a high quality film.

Highly toxic solvent systems impinge scalability of printed electronics due to the increased need for atmospheric and material handling control. For example, solvents can be the most prevalent air contaminant in cleanrooms. As described herein, the two-step recrystallization additive process, for example, with formamidinium acetate post treatment, allows for fabrication of a perovskite device with over 20% power conversion efficiency (PCE) while simultaneously depositing perovskite materials from industrially accepted coating solvents. These improvements pave the way for economically scalable manufacturing of high efficiency printed perovskite solar cells for thin-film and next generation photovoltaics. The surprising simplicity of the fabrication method allows it either to be completed in house or through toll manufacturers who already have industrial printing lines. The new procedures have focused extending solubility into new solvents, further decreasing toxicity, translating solvent systems onto standard roll-to-roll (R2R) processing equipment and increasing device efficiency In this way, perovskite manufacturing can be outsourced, which highly reduces costs in an end consumer product with safer solvents and better quality semiconductor material. The ink formulations and deposition methods described herein are instrumental to this improved method and produces improved products.

The method described herein utilizes a two-step process to form a multi-cation and multi-halide perovskite using non-traditional solvents. The benefit of this is that traditional solvents are under a significant amount of regulatory pressure. As an example, dimethyl formamide (DMF) was recently added to REACH restrictions. From 12 Dec. 2023, DMF cannot be placed on the market, manufactured or used as a substance on its own, as a constituent in other substances or in mixtures in a concentration equal to or greater than 0.3%. This, in turn, requires the adoption of other ink systems for perovskite semiconductors if they are to be low-cost ink printed at scale. No current methods, except for the method described herein, has such versatility for perovskite composition while simultaneously utilizing low toxicity solvents and be directly translatable for large scale manufacturing.

A method of fabricating a semiconductor thin film can include depositing a perovskite precursor in a first solvent on a substrate, the precursor forming a first perovskite layer on a surface of the substrate, applying a recrystallization additive in a second solvent to the layer on the surface of the substrate to form a second layer on the substrate, and annealing the first layer and the second layer to exchange a cation of the recrystallization additive with a cation of the perovskite precursor to form a perovskite alloy film and a volatile byproduct.

For example, the method can be a two-step chemical process combined with a single annealing stage:

1. Ink 1, a variant of methylammonium lead iodide in a THF/amine mixed solvent is deposited, dries rapidly and forms a perovskite thin-film at room temperature in the range of 400 nm.

2. A second ink, composing of formamidinium acetate, formic acid (or formamidinium formate), potentially other metal or organic salts and halides, and dissolved in an alcohol (either isopropanol or propylene glycol propyl ether) is coated over the thin film from (1). This ink can either dry at room temperature or with accelerated drying at 100° C.

3. The combination film is then annealed at 100° C. to cation exchange, release methylammonium acetate/formate as a byproduct and leaving a formamidinium rich perovskite film with good grain morphology, low pinholes and good performance.

The perovskite layer can be formed with a first ink including a perovskite precursor and a first solvent. The solvent can be a single solvent or a solvent mixture. The perovskite precursor can include an alkyl ammonium lead halide. In certain circumstances, the halide can be chloride, bromide, or iodide. For example, the perovskite precursor can include a methylammonium lead iodide. The perovskite precursor can include an alkyl amine. For example, the alkyl amine can be methylamine, ethylamine, propylamine, isopropylamine, or phenethylamine. The mole ratio of the perovskite precursor to the alkyl amine can be 1:0.1 to 1:14, for example, 1:0.2, 1:0.3, 1:0.4, 1:0.5, 1:0.6, 1:0.7, 1:0.8, 1:0.9, 1:1, 1:1.1, 1:1.2, 1:1.3, 1:1.4, 1:1.5, 1:1.6, 1:1.7, 1:1.8, 1:1.9, 1:2, 1:3, 1:4, 1.5, 1:6, 1:7, 1:8, 1:9, 1:10, 1:11, 1:12, 1:13, or 1:14. The alkyl amine can be selected to improve the solubility of the perovskite precursor in the solvent selected for the first ink.

The perovskite precursor can be combined with a solvent to form the first ink. In certain circumstances, the first ink can include a protic solvent or an aprotic solvent. The solvent of the first ink can be tetrahydrofuran, 2-methyltetrahydrofuran, acetonitrile, methanol, ethanol, propanol, butanol, hexamethylphosphoramide (HMPA), tris(dimethylamino)silane (TDMAS), bis(dimethylamino)dimethylsilane, N,N-dimethyltrimethylsilylamine (TMSDMA), hexamethyldisilazane (HMDS), dimethylformamide, dimethylsulfoxide, propylene carbonate, gamma butyrolactone, 1,3-dimethyl-2-imidazolidinone, N,N'-dimethylpropyleneurea, N-butylpyrrolidinone, or combinations thereof. In certain circumstances, the first ink can include an additive. The additive can be an organophosphate, an organosilane, an organosulfate, or an organometallic liquid. The additive can be an alkylamino silane, an alkylamino phosphate, or an alkylamino phosphate. For example, the additive can assist with crystallization. The additive can provide humidity resistance. The perovskite precursor can be processed to form a first perovskite layer, for example, a 3D perovskite layer or a 2D perovskite layer. When the ratio of lead to amine is 1:6 or greater, the perovskite layer can be a 2D perovskite layer.

The recrystallization additive can be provided by a second ink. The second ink includes a recrystallization additive. The recrystallization additive can be a salt, for example, a formate salt, an acetate salt, or combinations thereof. The salt can have a cation that can exchange with a cation of the perovskite layer, thereby forming a perovskite alloy. The cation can be a metal ion or a pnictide cation such as a nitrogen-containing cation. The cation can have a 1+, 2+ or 3+ charge. The cation can be cesium or formaminidium. In certain circumstances, the recrystallization additive can include a formamidinium formate, formamidinium acetate, cesium formate, cesium acetate, strontium formate, strontium acetate, ytterbium formate, ytterbium acetate, cerium formate, cerium acetate, germanium formate, germanium acetate, or combinations thereof.

The second ink can include a solvent that is selected to facilitate recrystallization of the perovskite layer to form a perovskite alloy. In certain circumstances, the solvent of the second ink can include isopropanol, butanol, or a glycol ether. For example, the glycol ether can be propylene glycol propyl ether, propylene glycol methyl ether, propylene glycol butyl ether, ethylene glycol propyl ether, ethylene glycol methyl ether, ethylene glycol butyl ether, or combinations thereof. The second ink may also include a carboxylic acid. In certain circumstances, the acid may include formic acid, acetic acid, glycolic acid, or combinations thereof.

The method can be modified as follows, for example, with a further treatment combined in the second step or as an additional step. Some perovskite additives (like methylammonium chloride (MACL) have solubility limits in THF much lower than what is sometimes used. Adding MACL to the second step can cause a similar cation exchange forming formamidinium chloride (FACL) in some cases or is not soluble at all. In small amounts, FACL can be good for perovskite thin-films but in general an over saturation can cause accelerated degradation of the perovskite film to a yellow, non-semiconductor, phase. In general, MACL has the opposite effect, maintaining black semiconductor phases. This modification can allow for the incorporation of high amounts of MACL that can be required with some perovskite chemistries.

It was also discovered that for the cation exchange process described herein, some solvents, such as, propylene glycol propyl ether (DOW PnP), has poor solubility for MACL but is non-damaging to the perovskite thin-film. Isopropanol, another common solvent, has an upper solubility limit for MACL around 10 mg/mL but is, unfortunately, damaging to the perovskite thin-film. However, propylene glycol methyl ether (DOW PM) had uniquely high MACL solubility (20-25 mg/ml) while not being damaging to the underlying perovskite thin-film. Therefore, it becomes possible to post treat perovskite films with a high amount of MACL for systems that require it.

For example, a method can include the following steps:

1. Ink 1, a variant of methylammonium lead iodide in a THF/amine mixed solvent is deposited, dries rapidly and forms a perovskite thin-film at room temperature in the range of 400 nm.

2. A second ink, composing of formamidinium acetate, formic acid (or formamidinium formate), potentially other metal or organic salts and halides, and dissolved in an alcohol (either isopropanol or propylene glycol propyl ether) is coated over the thin film from (1). This ink can either dry at room temperature or with accelerated drying at 100C.

3. The combination film is then annealed at 100C to cation exchange, release methylammonium acetate/formate as a byproduct and leaving a formamidinium rich perovskite film. This can be done quickly (<2 minutes).

4. The formamidinium rich perovskite film is then treated with MACL in DOW PM and annealed for the remaining amount of time required. MACL is slowly released over the course of annealing and therefore acts as a recrystallization promoter.

This additional (third step) offers a way to finely tune film cation or halide stoichiometry or add polymer, organic, amine, or chelating surface passivation agents in combination with MACL treatment, optionally with DOW PM as a solvent. Many of the passivation agents are traditionally deposited onto perovskite using isopropanol which is more damaging. Many of these surface passivation agents are also not soluble in anti-solvents like chlorobenzene or anisole. This can allow for polymer, small molecule hybrid passivation approaches.

MACL treatment in this way reduces hysteresis.

As described above, an ink formulation system for producing a semiconductor film can include a first ink including a perovskite precursor in a first solvent and a second ink including a recrystallization additive in a second solvent. The ink formulation system can be used in a two-step fabrication process as described herein to form a semiconductor thin film that is recrystallize to form a perovskite allow film. The content of the alloy, for example, second cation in the recrystallized layer, can be selected to adjust properties of the recrystallized layer. For example, the recrystallized layer can include less than 120%, less than 110%, less than 100%, less than 90%, less than 80%, less than 70%, less than 60%, less than 50%, less than 45%, less than 40%, less than 35%, less than 30%, less than 25%, less than 20%, less than 15%, less than 10%, less than 5%, less than 2%, or less than 1% of a second cation (mole % relative to the Pb:B' component of $(A:A')(Pb:B')X_3$), such as formamidinium or cesium, or a combination thereof.

In certain circumstances, the perovskite alloy film can include a material having the formula (I)

$$(A:A')(Pb:B')X_3 \tag{I}$$

where A is an organic cation, A' is an organic or an inorganic cation different from A', B' is a divalent metal cation or missing, and X is a halide ion. For example, B' can be Sn, Cu, Ni, Co, Fe, Mg, Mn, Sr, Zn, Pd, Cd, Ge, Yb, Ce, or Eu. In certain circumstances, A' can be formamidinium, strontium, ytterbium, cerium, germanium, or cesium. In certain circumstances, A can be methylammonium, ethylammonium, propylammonium (including isopropylammonium), butylammonium, or phenethylammonium. The composition can be 100% A or 100% A'. The ratio of A:A' can be between 1:0.01 and 0.01:1, for example, 1:0.1, 1:0.2, 1:0.3, 1:0.4, 1:0.5, 1:0.6, 1:0.7, 1:0.8, 1:0.9, 1:1, 0.9:1, 0.8:1, 0.7:1, 0.6:1, 0.5:1, 0.4:1, 0.3:1, 0.2:1, or 0.1:1.

The method can include depositing a perovskite precursor (e.g., the first ink). For example, depositing can include spin-coating, ink-jet printing, roll-to-roll printing, slot die coating, or blade coating. The method can further include applying a recrystallization additive (e.g, the second ink). For example, applying can include spin-coating, ink-jet printing, roll-to-roll printing, slot die coating, blade coating, or spray coating. Blade coating or slot die coating can be particularly efficient. Once the two layers are formed, they can be annealed by applying heat at an annealing temperature for an annealing time. For example, the annealing temperature can be between 30° C. and 200° C., between 50° C. and 180° C., between 60° C. and 160° C., between 70° C. and 150° C., or between 80° C. and 140° C. The annealing time can be relatively rapid, for example, the annealing time can be between 20 seconds and 60 minutes, less than 45 minutes, less than 30 minutes, less than 20 minutes, less than 15 minutes, less than 10 minutes, less than 8 minutes, less than 6 minutes, less than 5 minutes, less than 4 minutes, less than 3 minutes, less than 2 minutes, or 1 minute or less. The annealing can produce a volatile byproduct.

The recrystallization can produce a volatile byproduct. The volatile byproduct can be driven off the film from the heat of an annealing step. The volatile byproduct can be produced by the anion of the recrystallization additive with the cation of the perovskite. In certain circumstances, the volatile byproduct can be a decomposition product of the original formate or acetates. For example, MAI can degrade into a number of secondary products like hydroiodic acid or molecular iodide. The volatile byproduct can include an ammonium acetate or an ammonium formate. The volatile byproduct can be a decomposition product of the ammonium acetate or ammonium formate, for example, an amine and acetic acid or formic acid, respectively. For example, the ammonium can be methylammonium, ethylammonium, propylammonium (including isopropylammonium), butylammonium, or phenethylammonium. In one example, when a methylammonium lead iodide perovskite is exposed to a formate, the volatile byproduct can by methylammonium formate, which include a vapor of methylamine and formic acid. In another example, when a methylammonium lead iodide perovskite is exposed to an acetate, the volatile byproduct can by methylammonium acetate, which include a vapor of methylamine and acetic acid.

In certain circumstances, the perovskite film is deposited on a substrate. The substrate can be glass, metal, or plastic. The substrate can include other coatings, for example, a conductive coating or a semiconducting coating.

In another aspect, a semiconductor film can include a perovskite alloy as described above.

In another aspect, a photovoltaic device can include a first electrode, a second electrode; and a perovskite layer between the first electrode and the second electrode, wherein the perovskite layer includes a perovskite alloy described herein.

In certain circumstances, the device can be made by a method described herein.

In certain circumstances, the device can have a power conversion efficiency of over 10%, over 15%, over 20%, over 25%, or over 30%.

A method of manufacturing a photovoltaic device structure can include coating a perovskite precursor in a solvent on a substrate, the precursor forming a layer on surface of the substrate. In certain circumstances, the precursor is deposited on an underlying perovskite structure.

Choice of ligand in the first ink can increase solubility. In general, any ligand of the form: R—CH$_2$—NH$_2$ is applicable for coordinating with any primary amine perovskite formulation (including self-forming 2D formulations). Solvation depends on the ligand used, but typically occurs at the 1:1 Pb to ligand mol ratio—although dissolution can occur at <1:1 for longer chain ligands. It is believed that this process self-forms nanoparticles of perovskite allowing for dispersion. Longer chain ligands also increase the solubility regime as shown by the 0.5M perovskite inks in THF (FIG. 1).

The choice of solvent or solvent system has minimal effect on crystallization. Through experimentation, a 1:1:1 (MAI:PbI$_2$:MA) Methylammonium Iodide (MAI):Lead Iodide (PbI$_2$):Methylamine (MA) Complex dissolves in aprotic solvents with Guttman Donor Number above 10 and below 25. Assuming a Pb coordination number of 6 (as is true in the perovskite crystal) then a highly soluble complex is forming with the formula (MAPbI$_3$):(MA):(S)—where S is the solvent. It is not clear that a low-donor solvent plays a role in aggregation and crystallization of the perovskite bulk thin-film. However, solvent choice has seemingly little effect on the grain size of the resulting perovskite thin-film. Surface experiments and grain locations from three different solvent systems are shown in FIG. 2.

Figure 3:
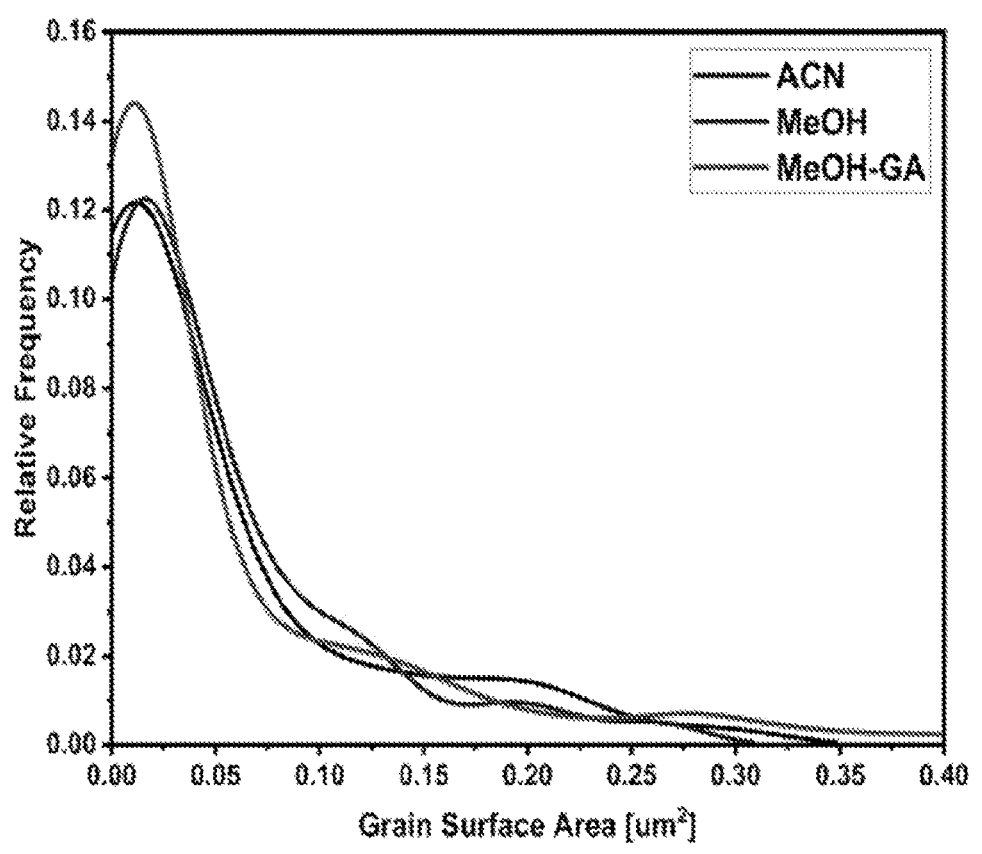
FIGS. 3 and 4 depict grain area for different solvent systems.
Figure 4:
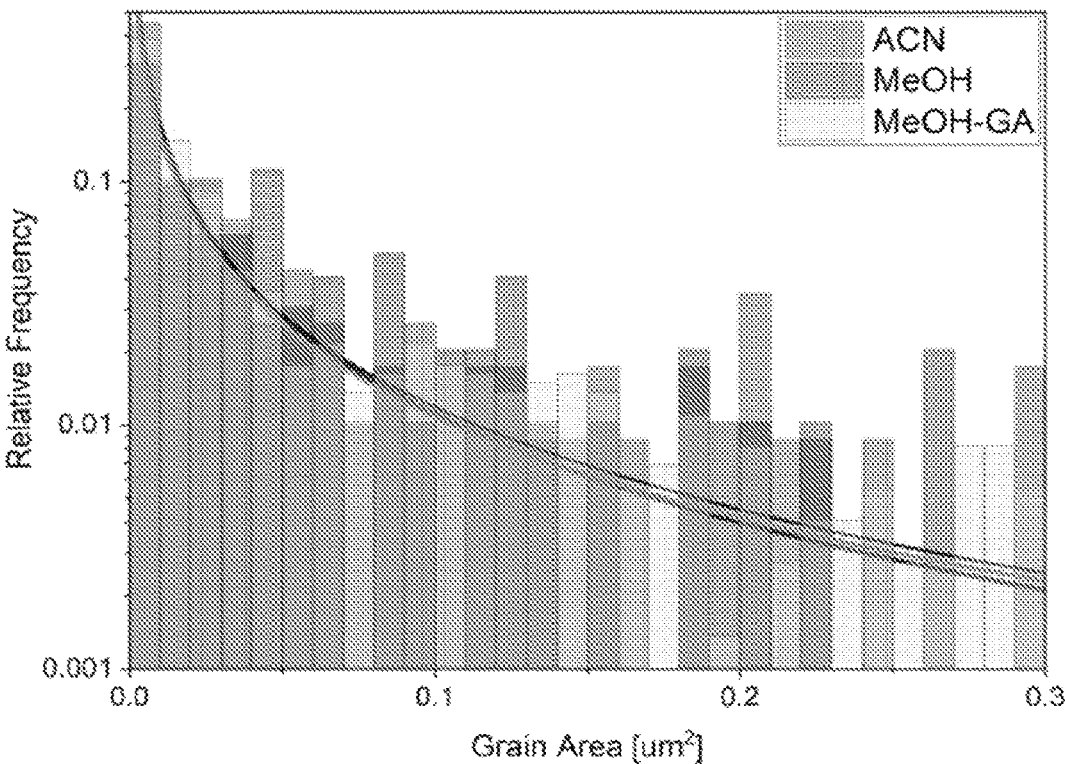

Despite different solvent chemistry on with each film, grain size distribution remains quite similar between each sample and fits a lognormal distribution—commonly used to fit grain distributions in crystalline materials (see FIGS. 3 and 4).

Figure 5:
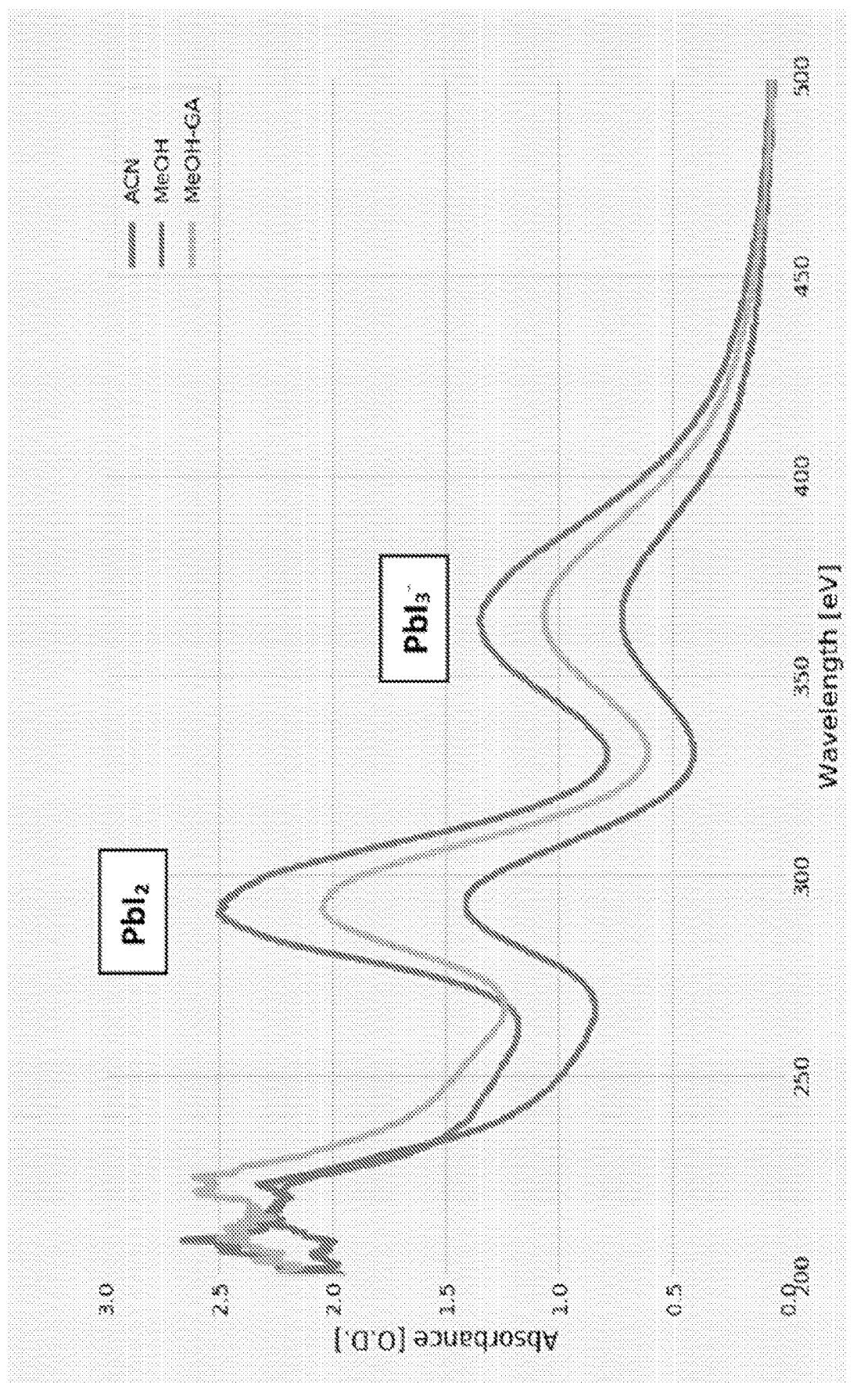
FIG. 5 depicts a spectrum showing solution species.

Solution chemistry can be similar between solvent systems. In solution, multiple Pb species may exist simultaneously. In each solvent system tested, Pb primarily exists as either PbI$_2$ or PbI$_3^-$. Both peaks, and peak ratios are associated with tri-iodoplumbate complex formation in a 4,3-a configuration with a single amine. In this nomenclature, 4 refers to the number of highly coordinated species, 3 the number of halides and 'a' for amine. Other species that are present for charge neutrality but not highly coordinating would have little effect on the absorption maxima. Therefore, bulk solvent has little effect on the coordination complex chemistry and reinforces that the core tri-iodoplumbate complex is robust and stable in various solvents. The complex can be treated as a pseudo-molecular species and pseudo molecular source of perovskite material. No PbI$_3^{2-}$ is detected, indicating that the 4,3-a configuration, likely surrounded by a MA$^+$ and solvent shell is the primary solvation and dissolution pathway (see FIG. 5).

Figure 6:
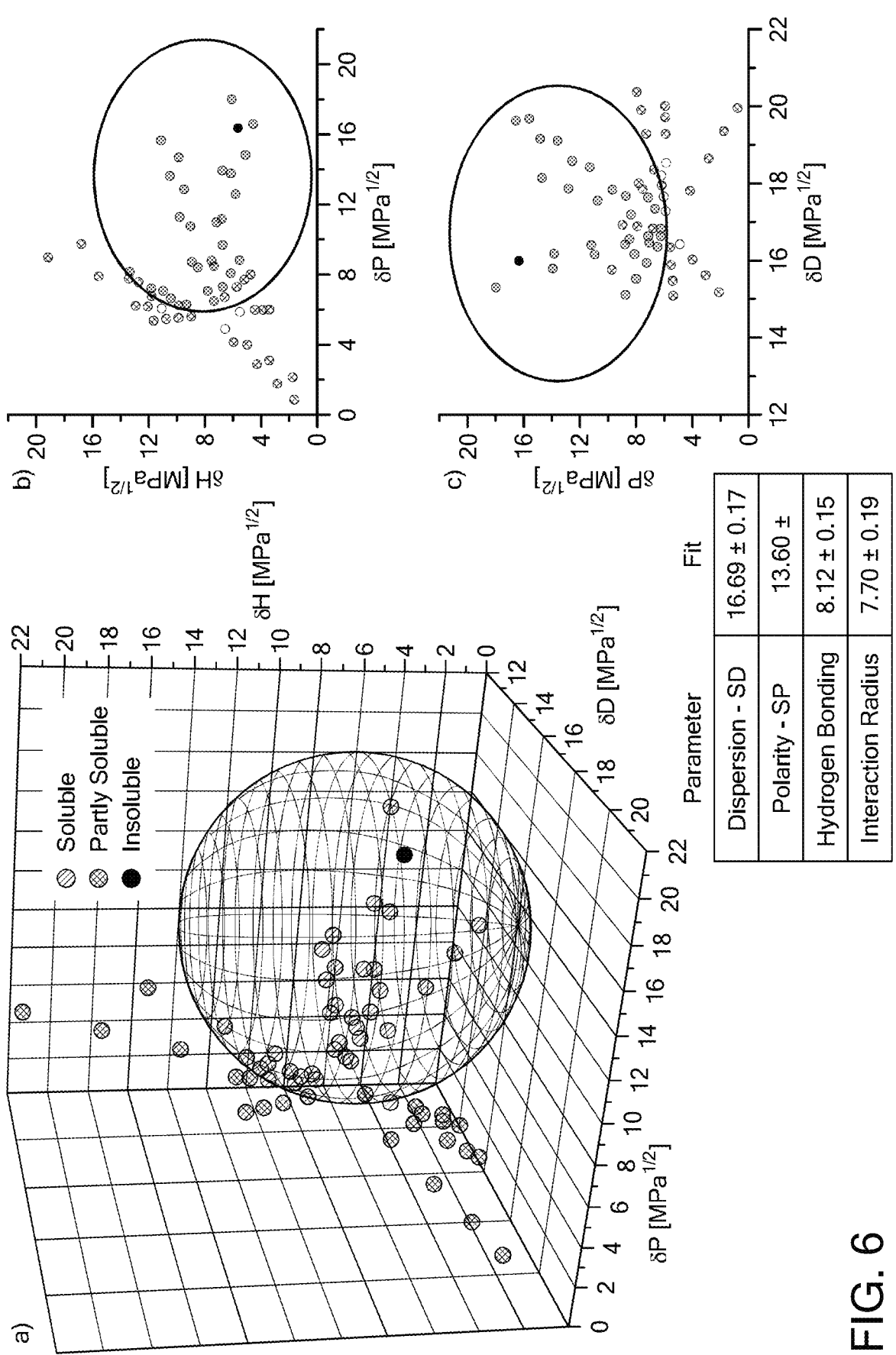
FIG. 6 depicts a Hansen model for perovskite precursor solutions.

Full solubility limits can be determined with Hansen parameters. Since the tri-iodoplumbate coordination complex can be viewed as stable and pseudo-molecular, organic solubility rules can be applied after tri-iodoplumbate formation to inform solvent systems for manufacturing. Single solvent systems are usually highly polar and highly aprotic, and therefore undesirable in a roll-to-roll manufacturing setting due to high toxicity. Therefore, transitioning to low-toxicity safer systems is desirable. Since the pseudo-molecular coordination complex can be treated as an organic system, a traditional Hansen model works well with informing the boundaries of solubility for the perovskite precursors (see FIG. 6).

Figure 7:
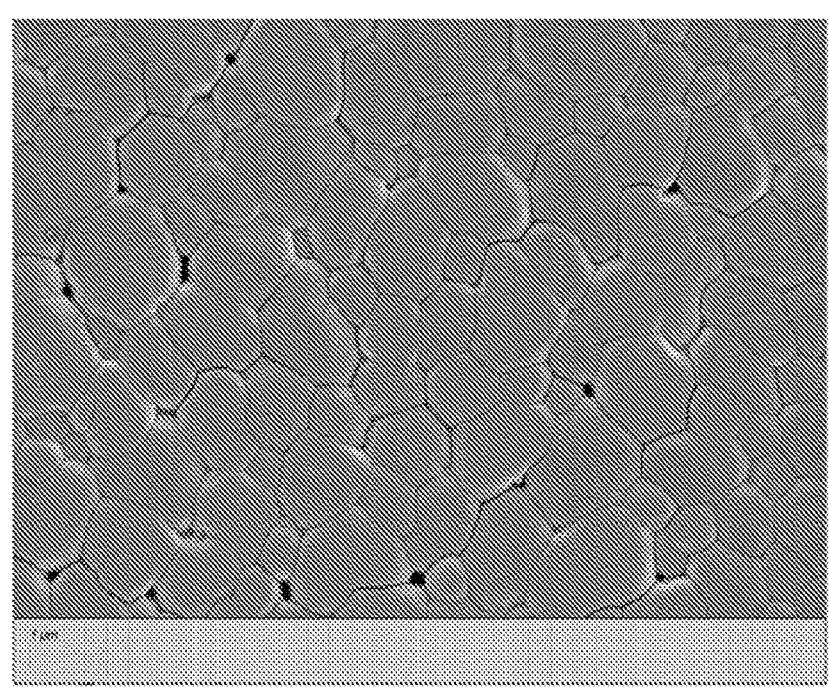
FIGS. 7 and 8 depicts grain size of perovskite crystals.
Figure 8:
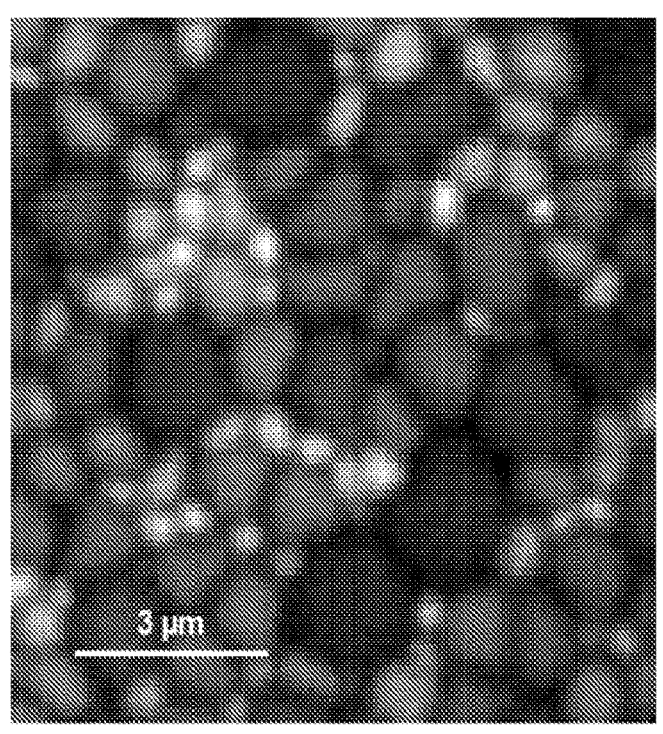
Figure 9:
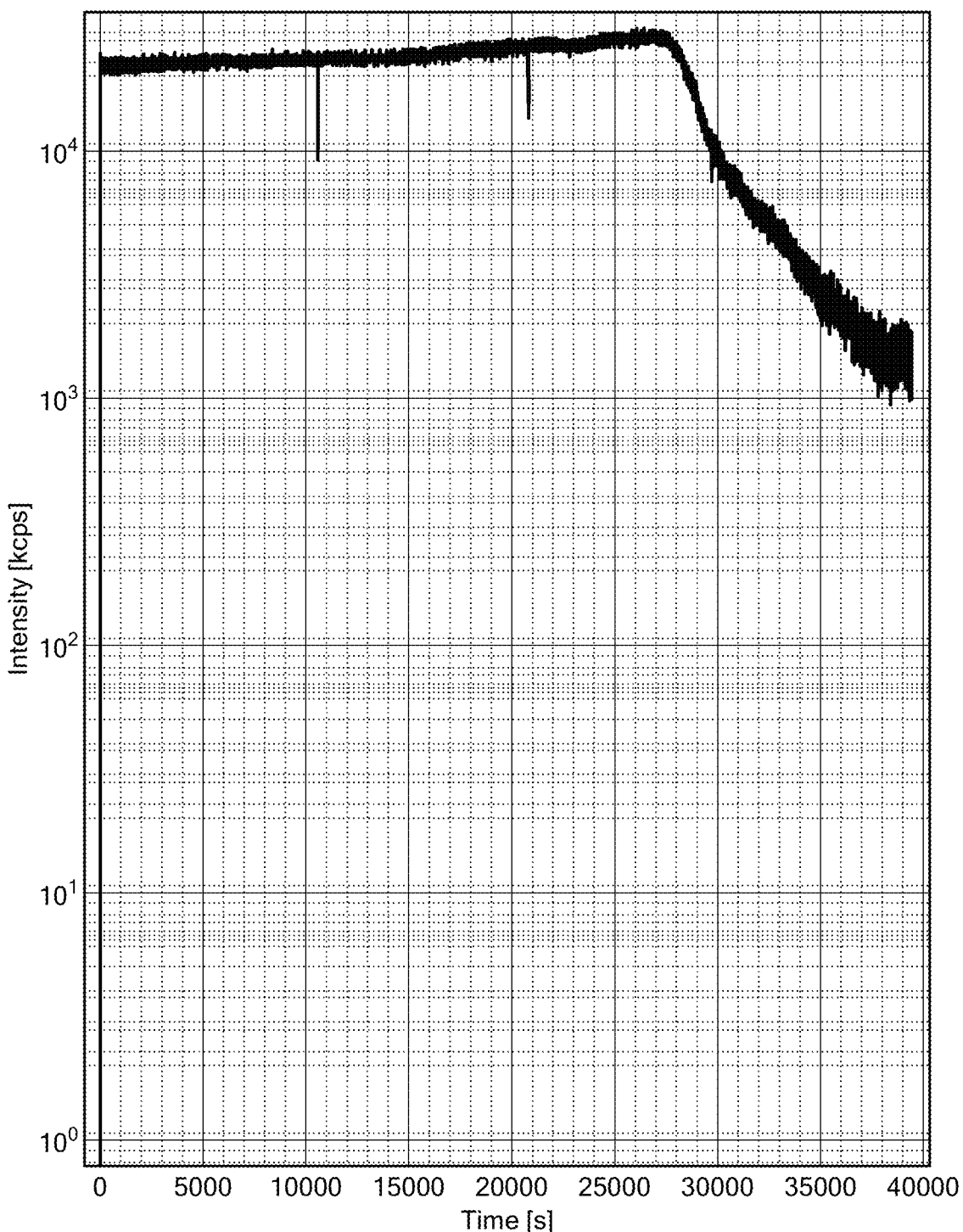
FIG. 9 depict photoluminescence stability of perovskite films.
Figure 10:
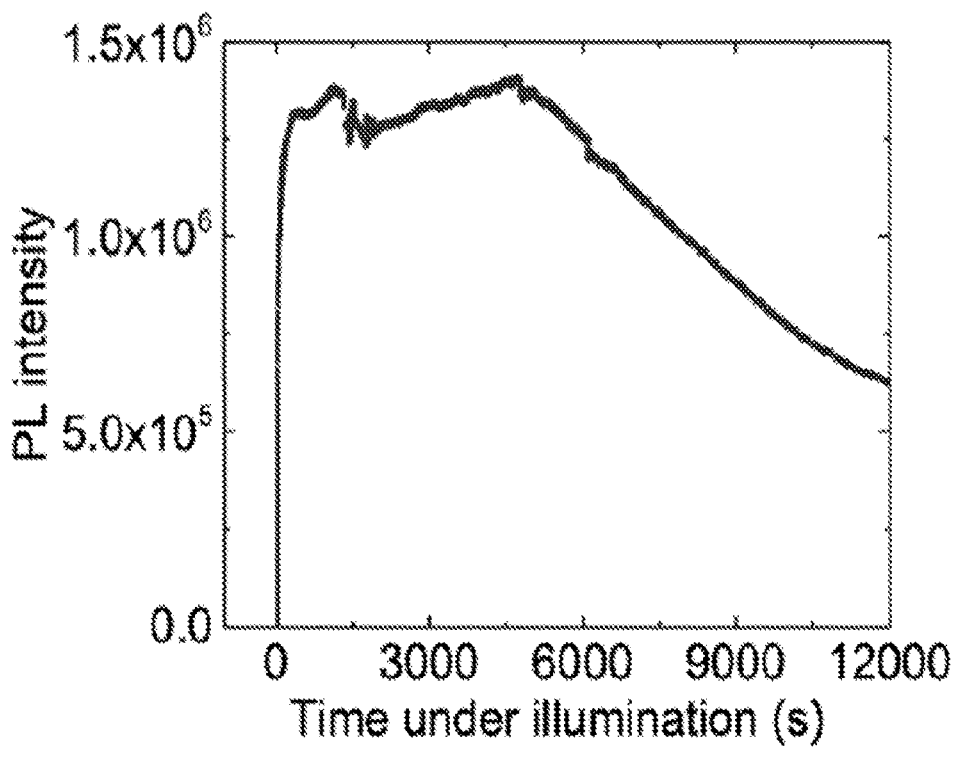
FIGS. 10 and 11 depict photoluminescence stability of perovskite films in air (FIG. 10) and under vacuum (FIG. 11).
Figure 11:
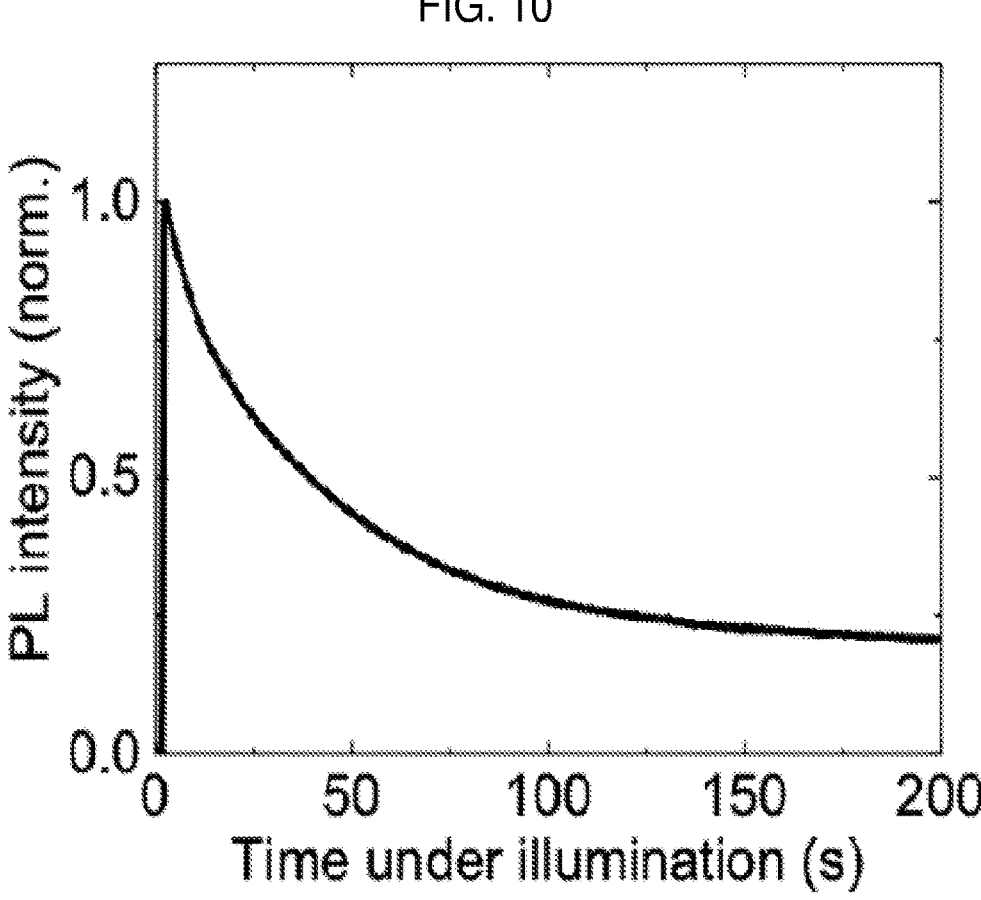

Low boiling point solvents and complex optimization can increase grains size and stability and coating. Although full solubility occurs at a 1:1:1 ratio of PbI$_2$ to Ammonium Salt to Amine ligand, additional ligand can be added as a recrystallization additive to increase grain size (as most ligands are low boiling point volatile liquids). With a 1:1:2 ratio, large grains in the range of 1 um can be grown (see FIGS. 7 and 8). Films manufactured with this method are photoluminescence (PL) stable at high injection (~10$^{17}$ charges/cm$^2$ vs 10$^{15}$ charges/cm$^2$ for solar illumination) for over 25000 seconds (7 hours) unencapsulated in air (see FIG. 9). Traditional multi-cation films—which are generally considered stable—are usually only PL stable at injection rates of 10$^{16}$ (10× less carriers) for around 6000 seconds (1.6 hours) in air (FIG. 10) and completely unstable in vacuum (FIG. 11). These results indicate that solvents and crystallization route play a large role in film stability.

Figure 12:
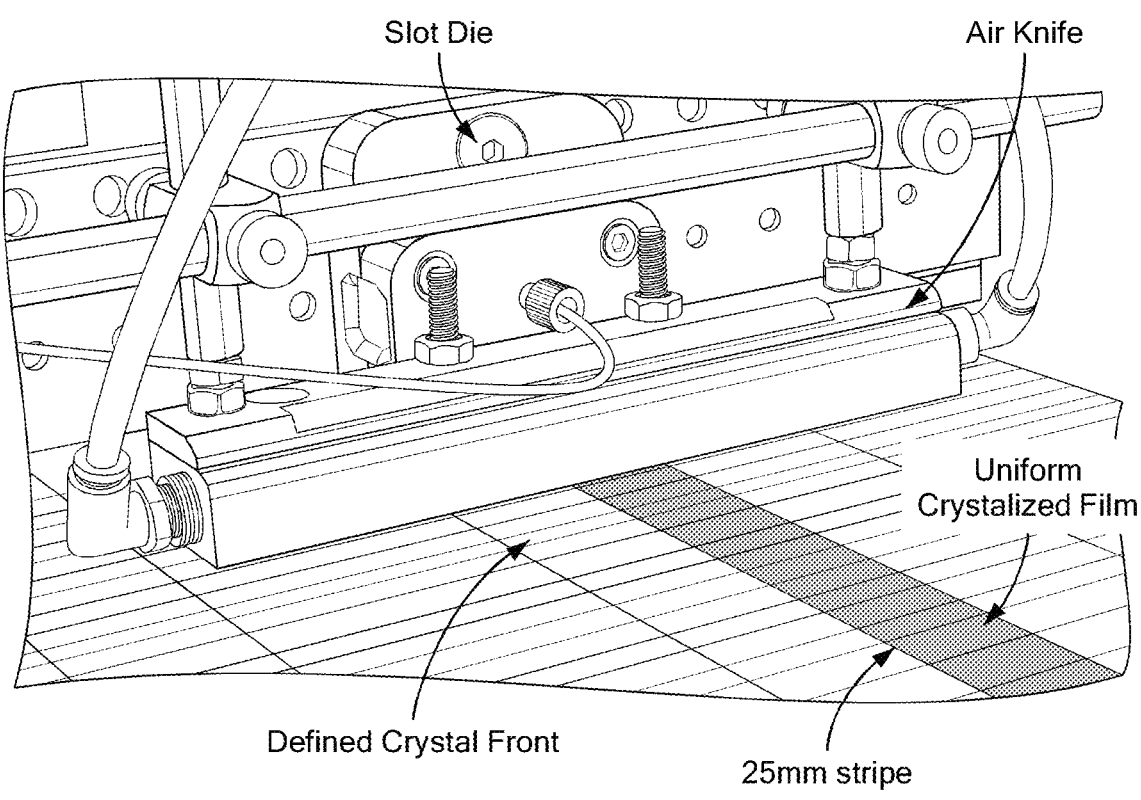
FIGS. 12, 13 and 14 depict a coating system and resulting semiconductor films.
Figure 13:
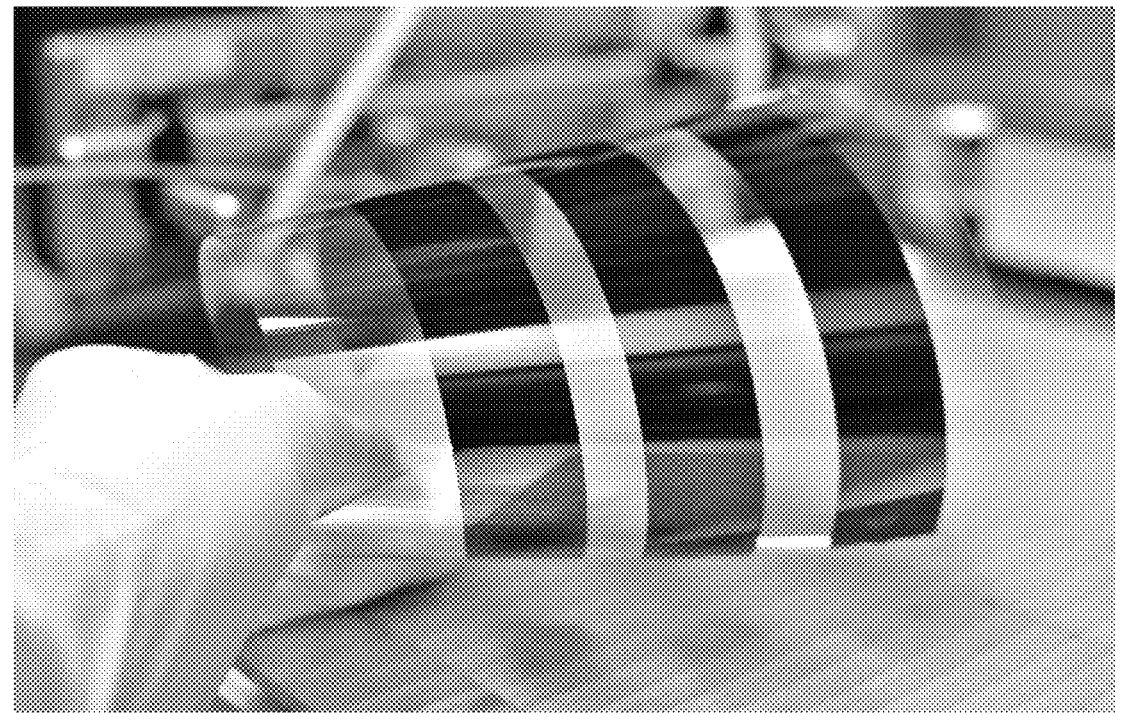
Figure 14:
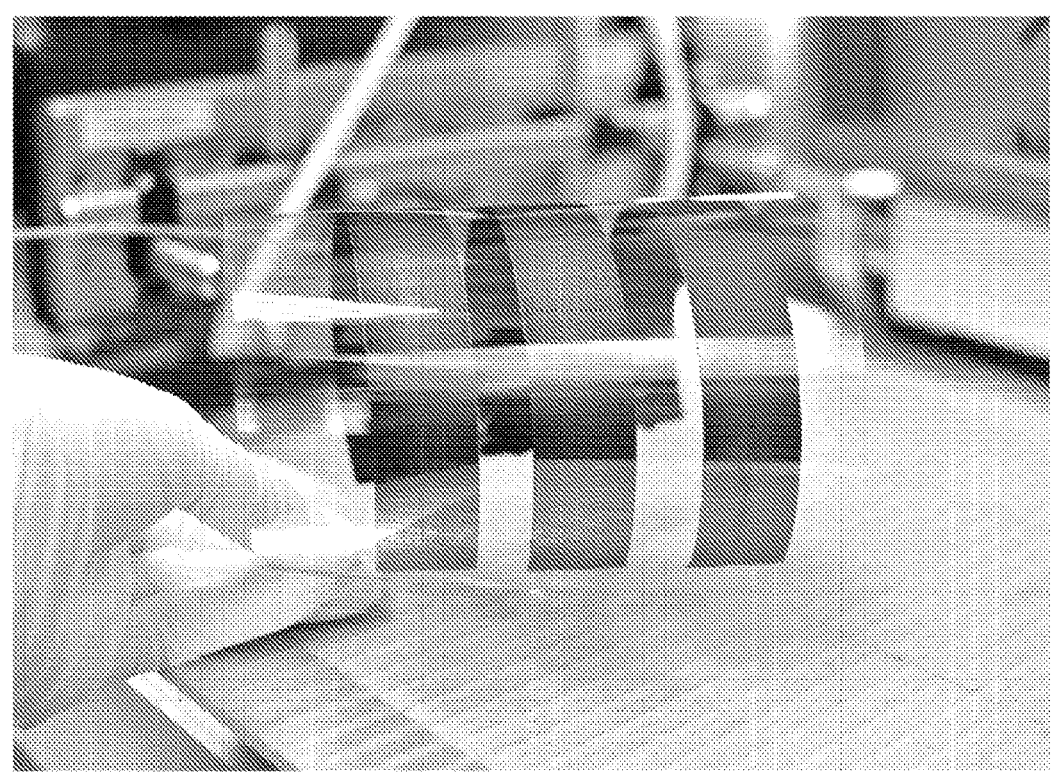

Tuning the coordination environment, with a composition of 1:1:2:0.5 of PbI$_2$ to Ammonium Salt to methylamine ligand to high boiling point coalescing solvent allows for the precise control of crystallization kinetics for high speed roll-to-roll printing. Selected solvents include hexamethylphosphoramide (HMPA), dimethylformamide (DMF), dimethylsulfoxide (DMSO), propylene carbonate, gamma butyrolactone (GBL), 1,3-dimethyl-2-imidazolidinone, N,N'-dimethylpropyleneurea, N-butylpyrrolidinone, and other high boiling point aprotic solvents. HPMA is unique in that it also imparts humidity resistance on the ink. With this, manufacturing speeds of 3 m/min are easily achievable and speeds greater than 10 m/min are possible (FIGS. 12, 13 and 14).

Volatile cation exchange can arise from antisolvents. Although control of the 4,3-a coordination complex is useful for high speed manufacturing, the complex only forms with the use of primary amines and primary amine ligands. However, amidine and metal cations are important in order to improve material stability and control optoelectronic properties. The chemical process described herein is compatible with high speed manufacturing that uniformly converts methylammonium lead iodide (MAPI) films into formamidinium/methylammonium (FAMA) and cesium, formamidinium, methylammonium (CsFAMA) lead iodide alloys. Therefore, the fabrication process enjoys both the benefits of fast, simple processing but also stable alloy formulations.

The chemical process involves the generation of a formamidinium formate or cesium formate liquid solution (or combinations thereof). These formates are highly soluble in organic solvents. When deposited on a methylammonium lead iodide film, the methylammonium and formate react—forming a volatile ionic liquid that recrystallizes and eventually leaves the film. This process then leaves a formamidinium (FA) or cesium (Cs) rich perovskite thin-film.

To ease processing, FA and Cs Acetates can be mixed with pure formic acid to form the soluble species. The formic/acetate salts are then diluted in propylene glycol propyl ether (DOW PnP). Although the reaction is unknown, all possible reaction pathways involve the formation of recrystallization entities, leaving more stable FA$^+$ or Cs$^+$ species in the film:

$$MA^+ + FA : CH_3COOH \rightarrow MA : CH_3COOH\uparrow + FA^+$$

$$MA^+ + FA : CHCOOH \rightarrow MA : CH_3COOH\uparrow + FA^+$$

$$MA^+ + FA : CH_3COOH \rightarrow MAT + CH_3COOH\uparrow + FA^+$$

$$MA^+ + FA : CHCOOH \rightarrow MAT + CH_3COOH\uparrow + FA^+$$

$$MA^+ + Cs : CH_3COOH \rightarrow MA : CH_3COOH\uparrow + Cs^+$$

$$MA^+ + Cs : CHCOOH \rightarrow MA : CH_3COOH\uparrow + Cs^+$$

$$MA^+ + Cs : CH_3COOH \rightarrow MAT + CH_3COOH\uparrow + Cs^+$$

$$MA^+ + Cs : CHCOOH \rightarrow MAT + CH_3COOH\uparrow + Cs^+$$

Figure 15:
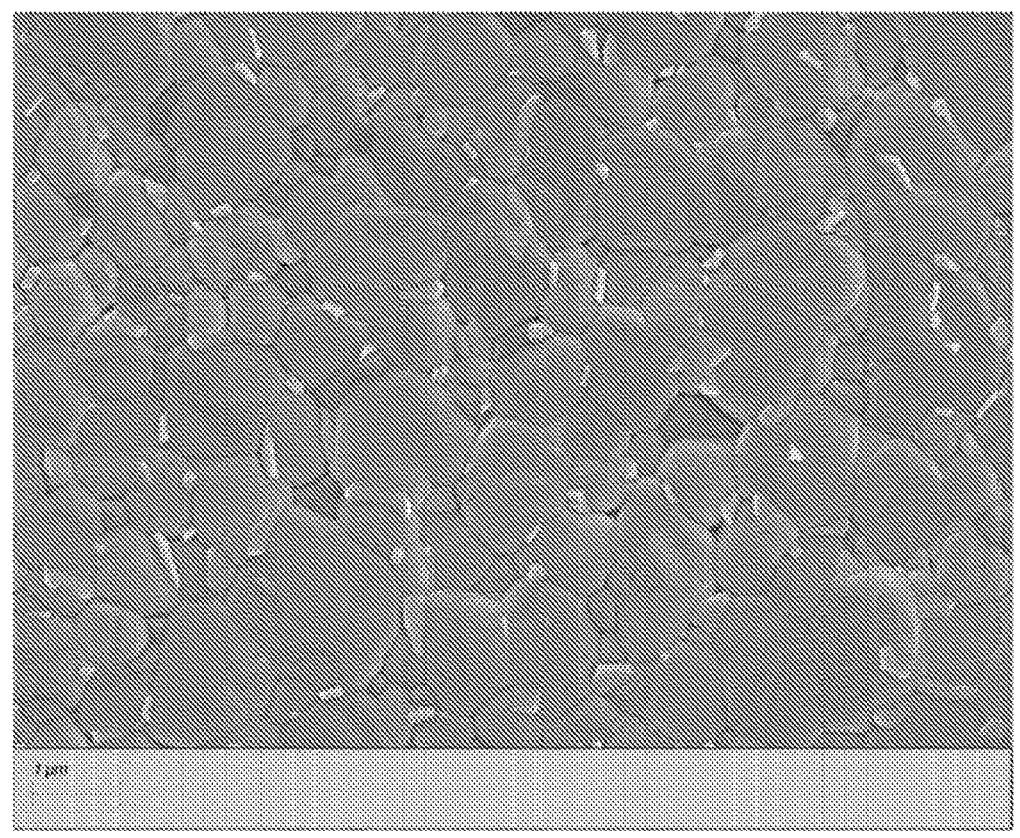
FIG. 15 depicts grain size of an alloy film.
Figure 16:
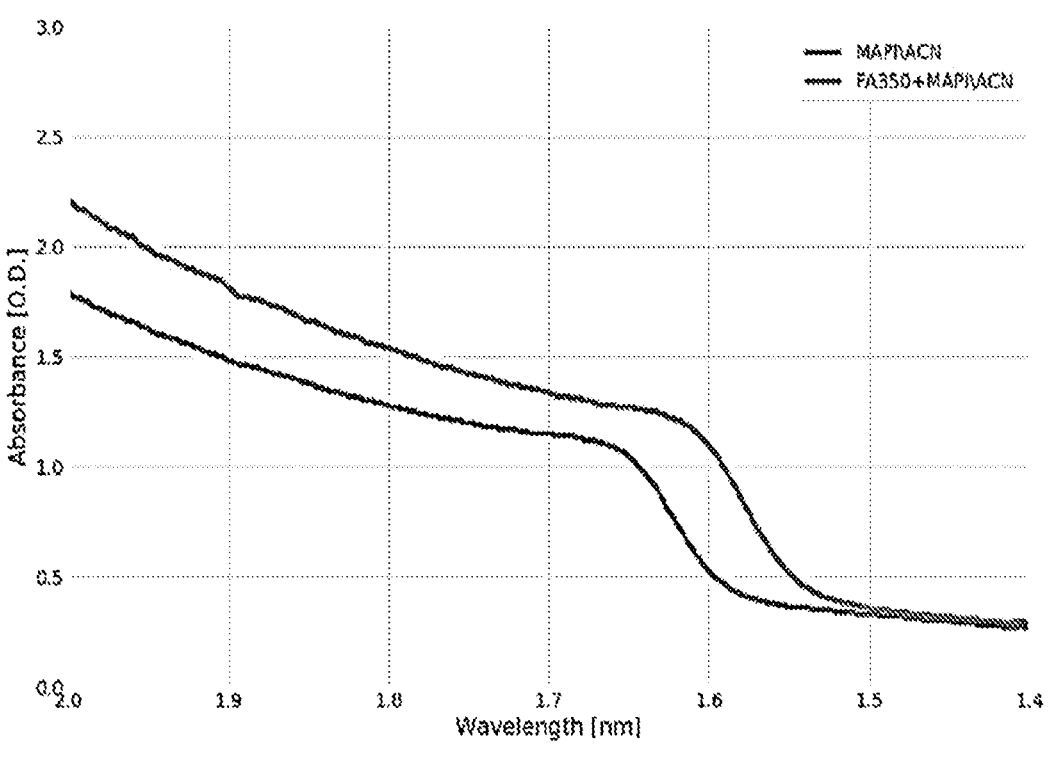
FIG. 16 depicts an absorbance spectrum of an alloy film.
Figure 17:
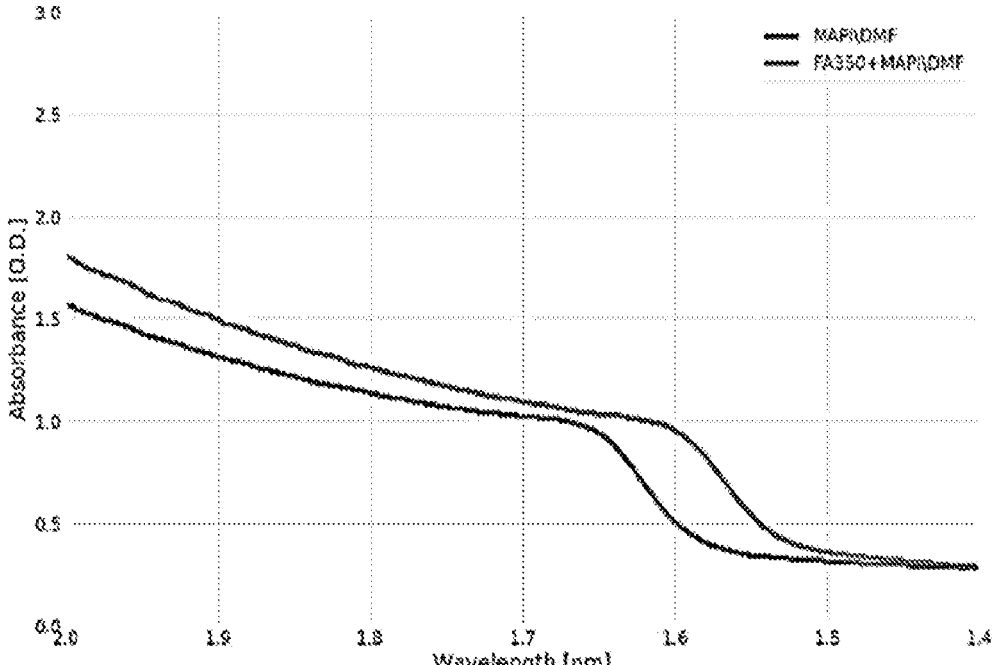
FIG. 17 depicts an absorbance spectrum of an alloy film.

Properties of cation exchanged films were studied. Morphology of cation exchanged films generally retain similar grain size as the MAPI precursor films (see FIG. 15). After cation exchange, the perovskite film shows a clear redshift in the bandgap and strong absorption (see FIG. 16). Traditional MAPI films deposited from traditional DMF/DMSO and antisolvent quench processes can also be similarly cation exchanged (see FIG. 17).

Figure 18:
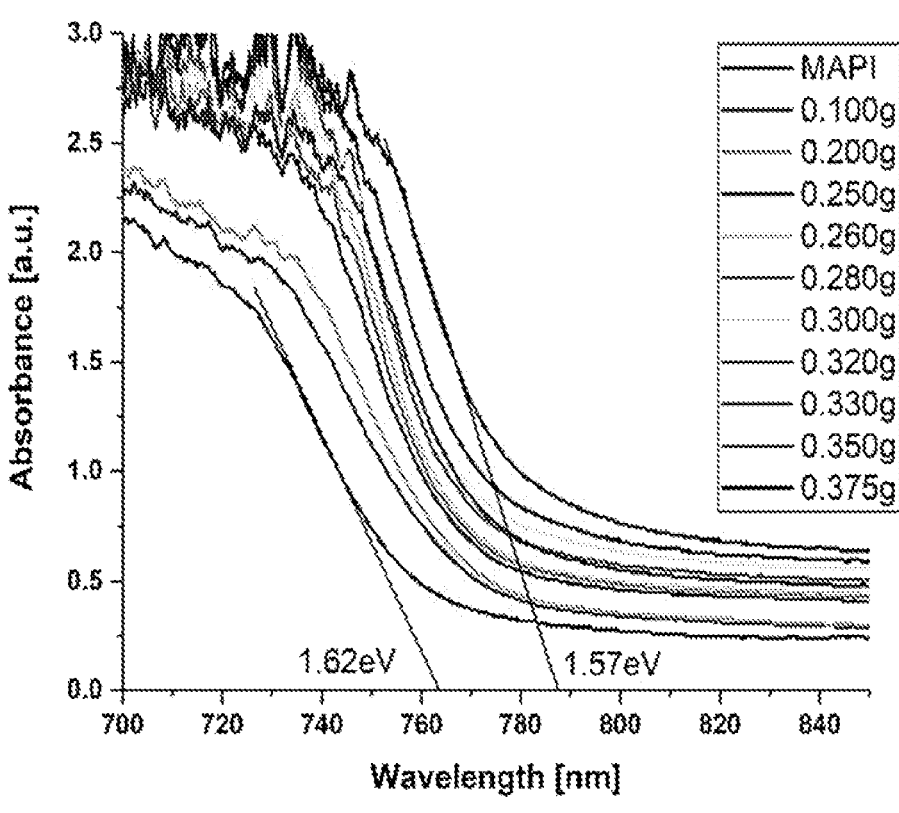
FIG. 18 depicts an absorbance spectrum based on formate treatment of an alloy film.
Figure 19:
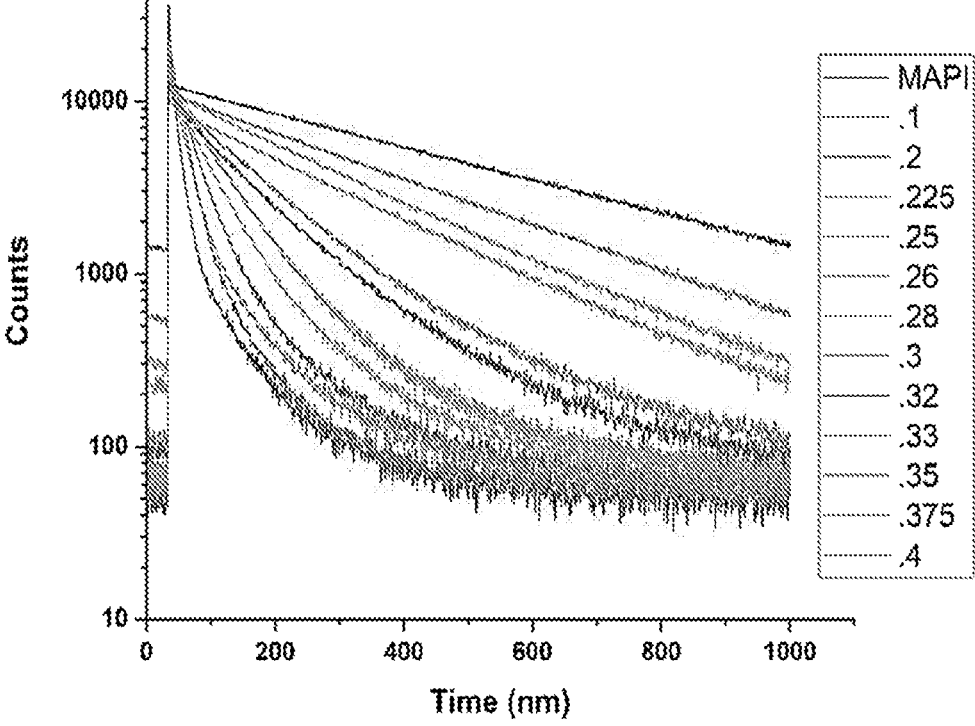
FIG. 19 depicts radiative lifetime based on formate treatment of an alloy film.
Figure 20:
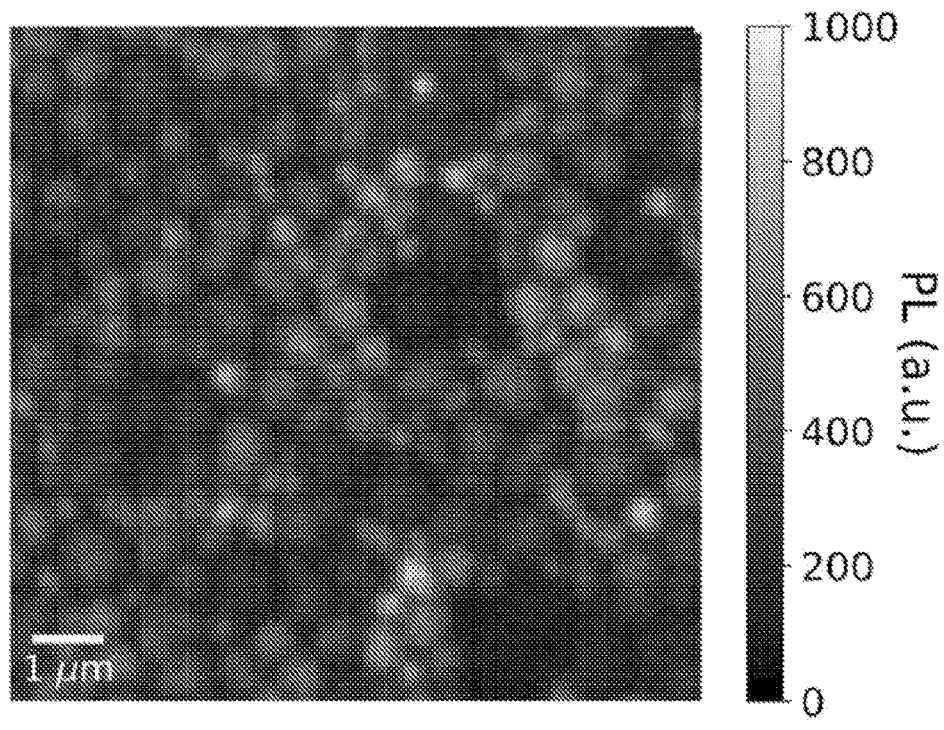
FIG. 20 depicts mapped micro PL for an alloy film.
Figure 21:
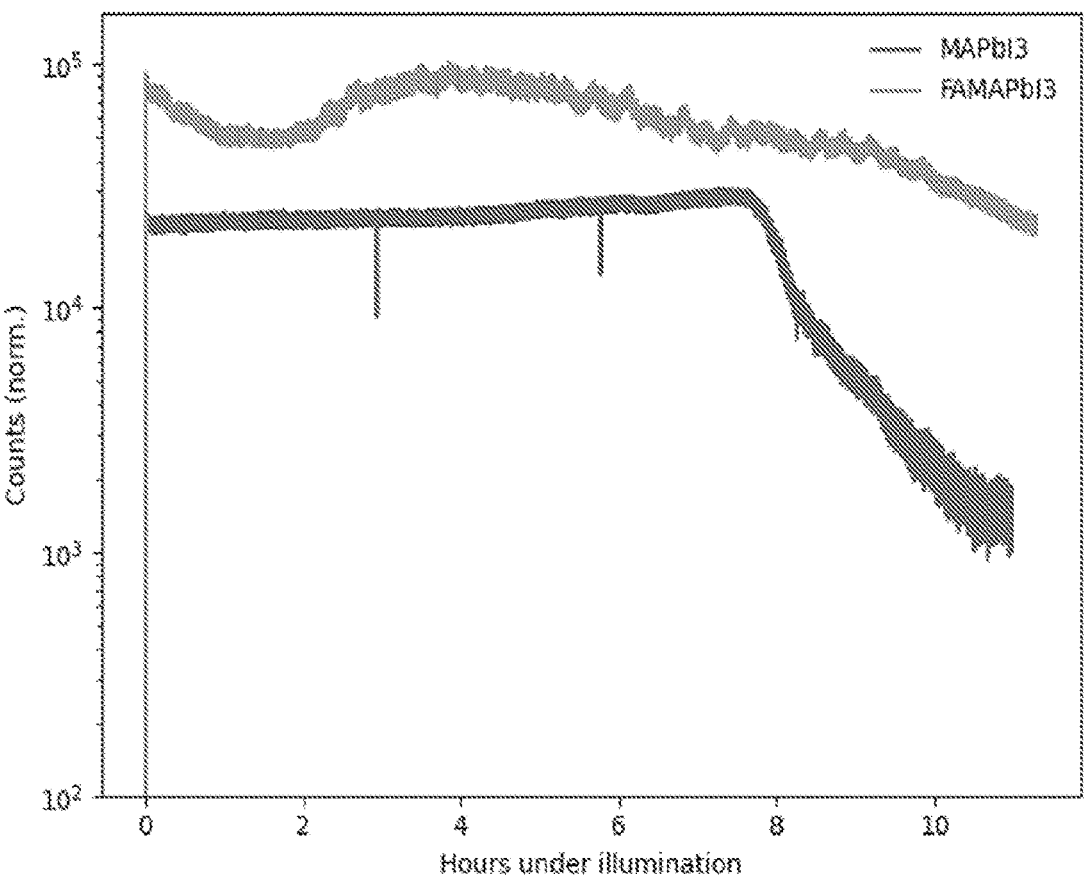
FIG. 21 depicts PL stability for an alloy film.

The absorption onset and photoluminescence of thin-films manufactured with this method are able to be tuned through the amount of recrystallization treatment. In this example, MAPI is deposited and is then recrystallized with different amounts of formamidinium acetate and formic acid. It was also found that the gap of the perovskite film is tunable based on the treatment level of the formate salt (see FIG. 18). By varying the treatment amounts of formamidinium acetate and formic acid it is possible to obtain an absorption profile that matches an MA-rich perovskite as well as a FA-rich perovskite and everything in between. This is shown in FIG. 18. Radiative lifetimes are also tunable with formate salt treatment, shown in the time-resolved photoluminescence can be tuned through treatment level as seen in FIG. 19. FIG. 20 depicts mapped micro PL for an alloy film showing the PL is relatively uniform. PL stability at high injection (~10$^{17}$) of a FAMA alloy film also increases above base MAPI samples (over 11 h vs 7 h) (see FIG. 21).

Figure 22:
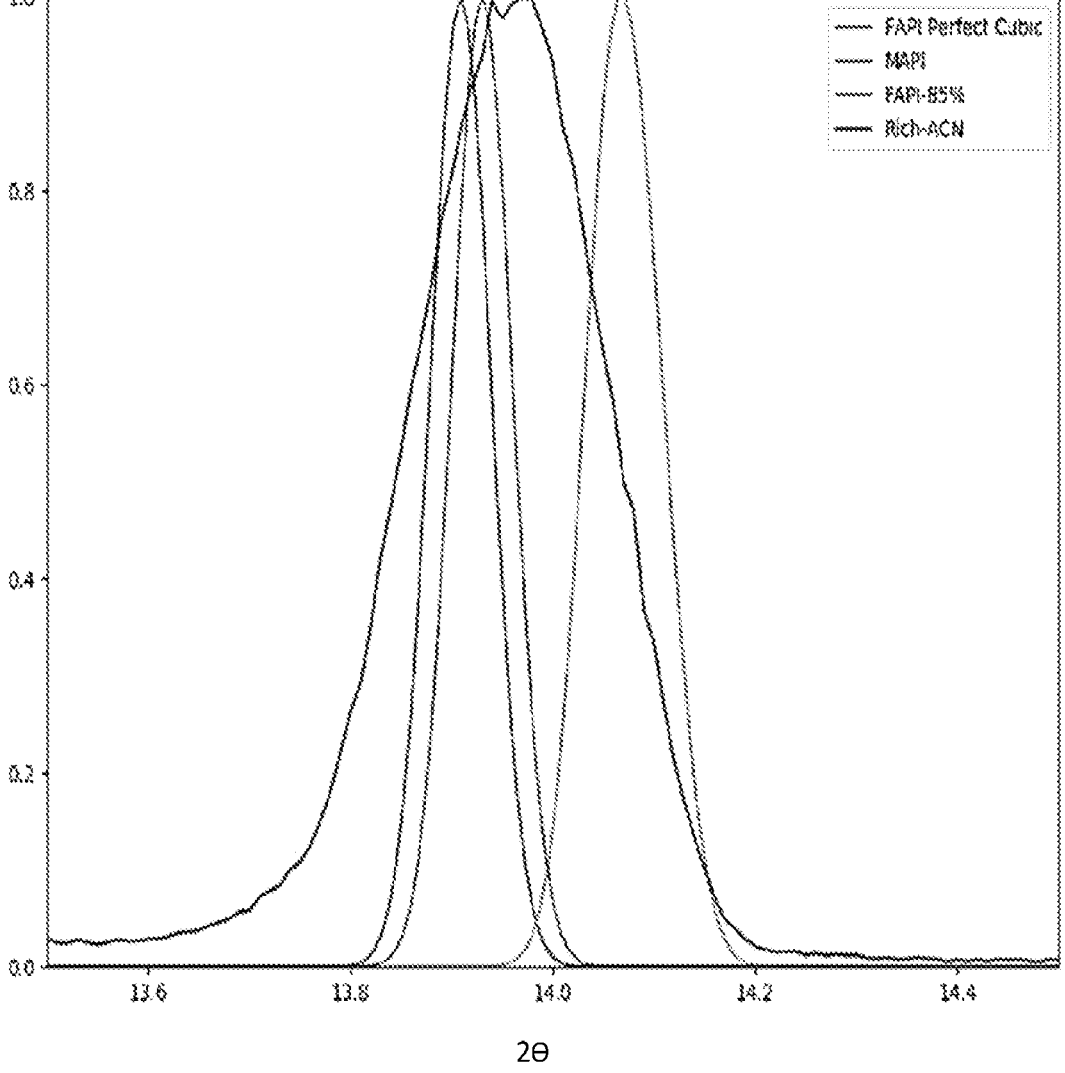
FIG. 22 depicts an x-ray diffraction spectrum of films.
Figure 47:
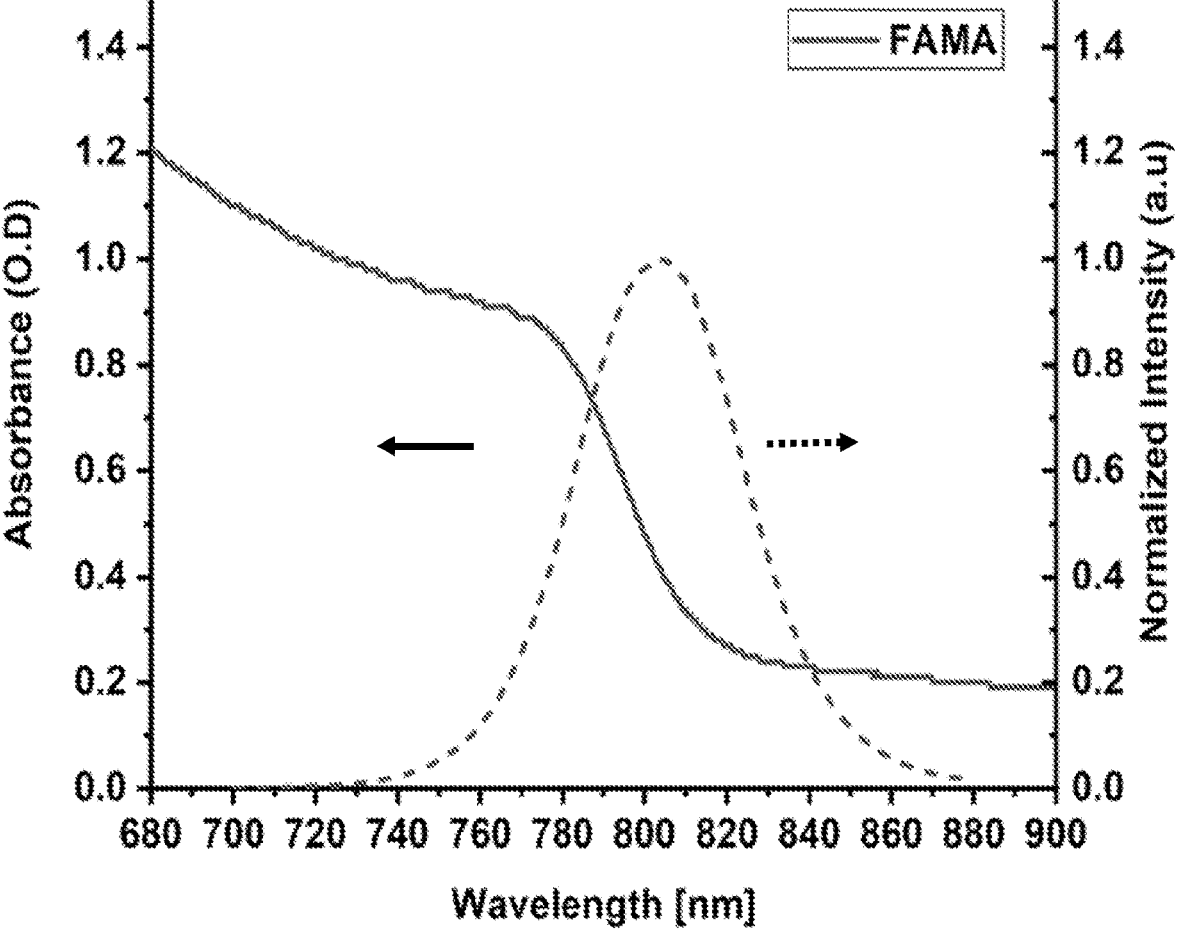
FIG. 47 depicts a graph showing absorption and PL emission spectra of a recrystallized film.
Figure 50:
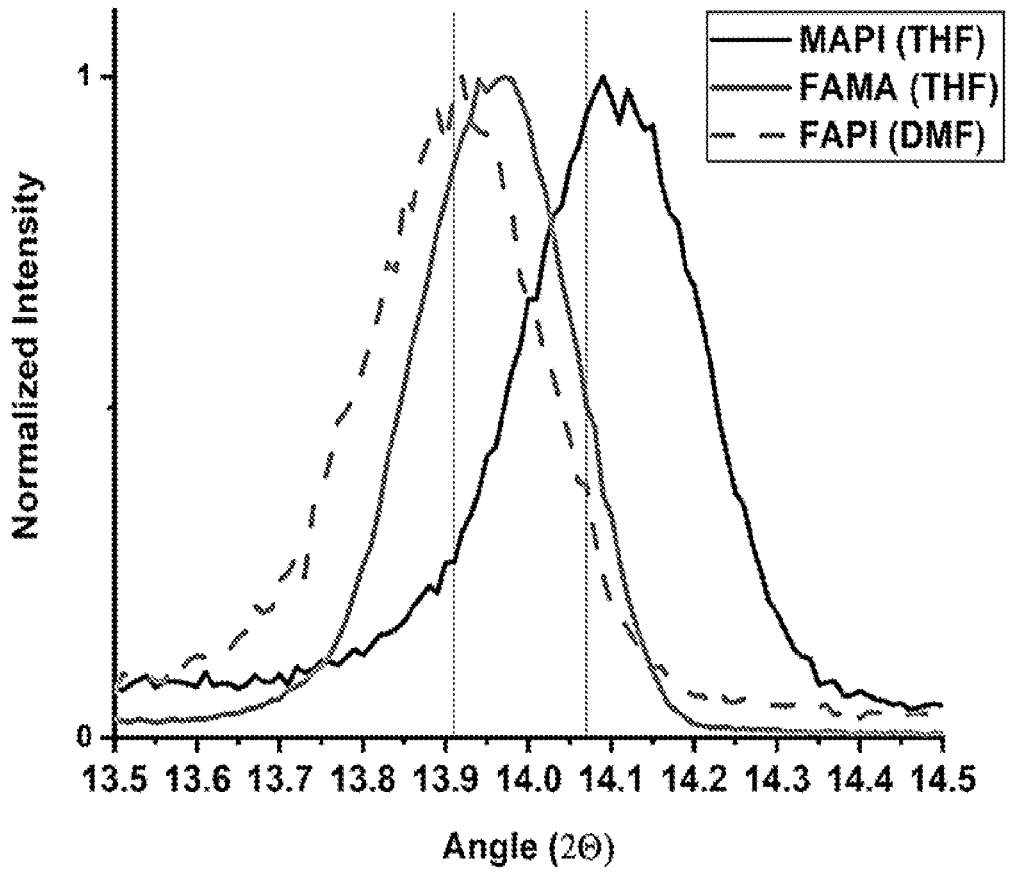
FIG. 50 is an x-ray diffraction spectrum showing main [110] diffraction peak of perovskite thin films manufactured with this method compared to theoretical diffraction positions (vertical lines) and films made from DMF/DMSO routes.

Composition and uniformity of volatile cation exchanged films was also examined. As a two-step process, composition of the final film is not easily determined from precursor concentration. X-Ray Diffraction (XRD) showed that there is a peak shift to lower 2$\Theta$, which is indicative of an increase in lattice parameter that is expected with incorporation of FA. XRD spectra showed a single phase with a FA incorporation above 70% (third peak from left) (see FIG. 22). Bulk crystalline phase purity was studied through X-Ray Diffraction. Similar to the PL study in FIG. 47, films made using this method are phase pure any only show single peaks in-between the theoretical diffraction angles of 14.07 for MAPI and 13.91 for FAPI. Films with MAPI in THF as a solvent as a precursor all show a 0.025 degree shift to higher angles for an unknown reason. Peaks are also narrower than compared to films manufactured through a DMF/DMSO route (see FIG. 50).

Figure 23:
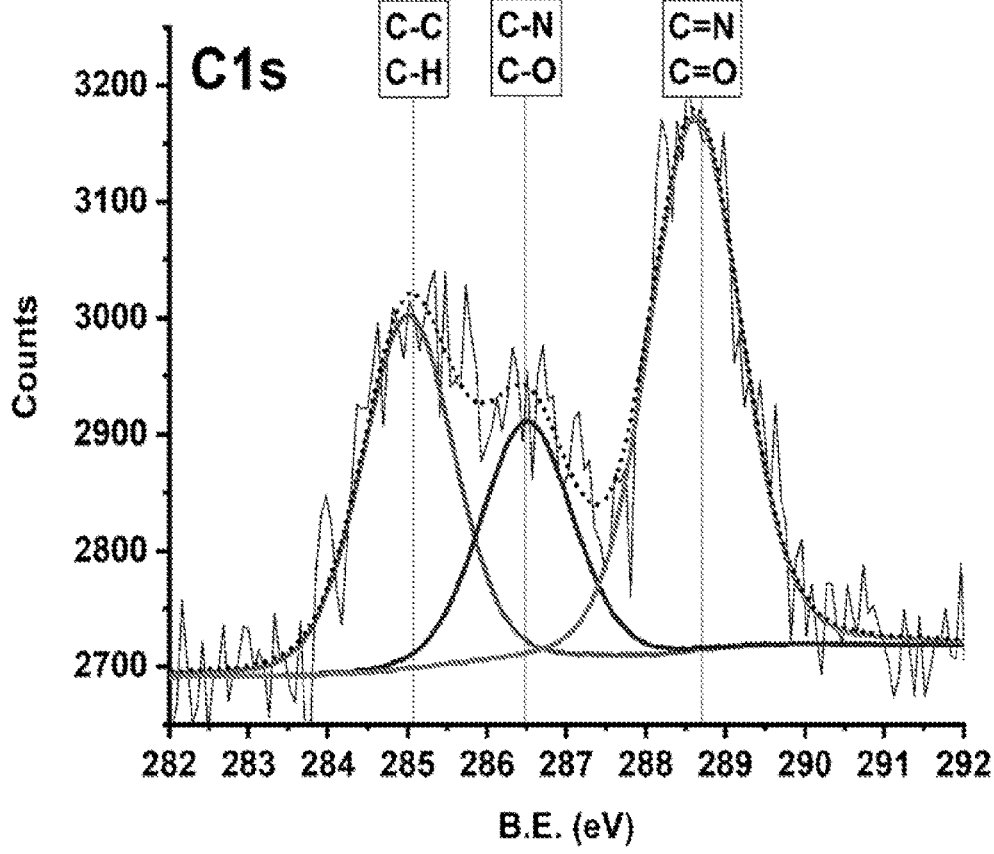
FIG. 23 depicts an x-ray photoelectron spectroscopy spectrum showing carbon peaks for a perovskite thin-film using the recrystallization methods described herein.
Figure 48:
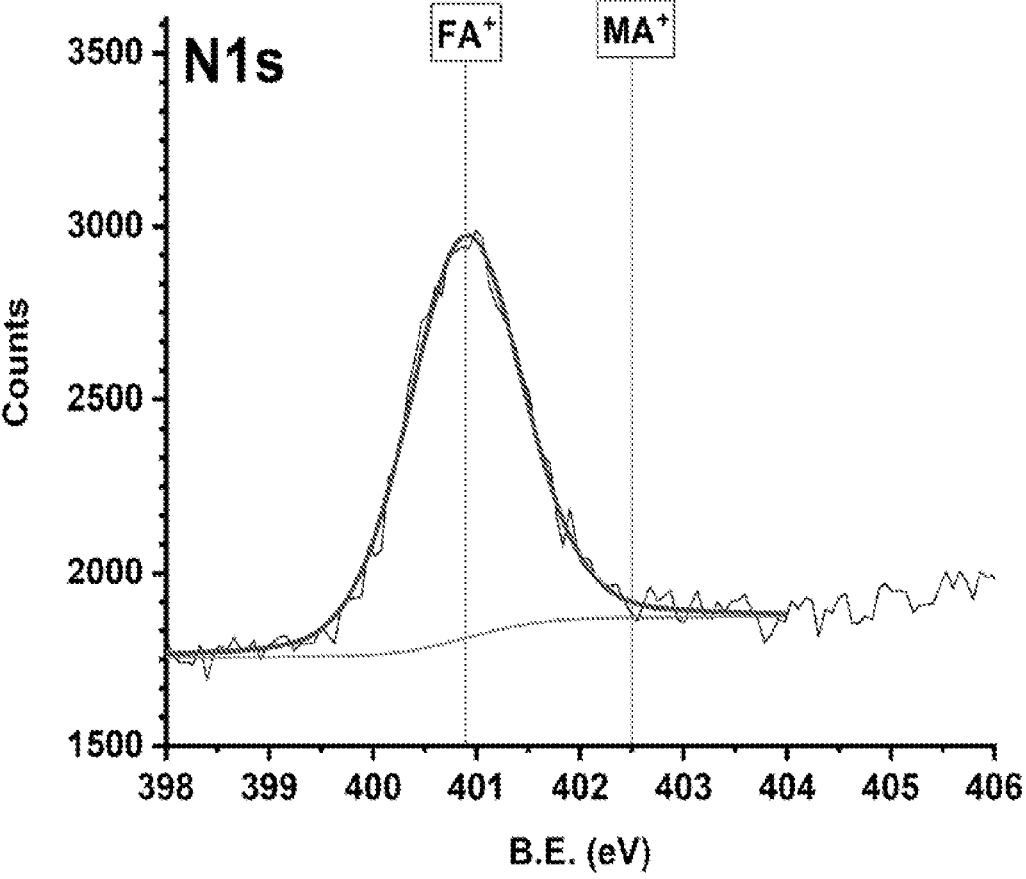
FIG. 48 depicts an x-ray photoelectron spectroscopy spectrum showing nitrogen peaks for perovskite thin-films using the recrystallization method described herein. Nitrogen peaks show that the film is near 100% FA+ with no detectable MA+.
Figure 49:
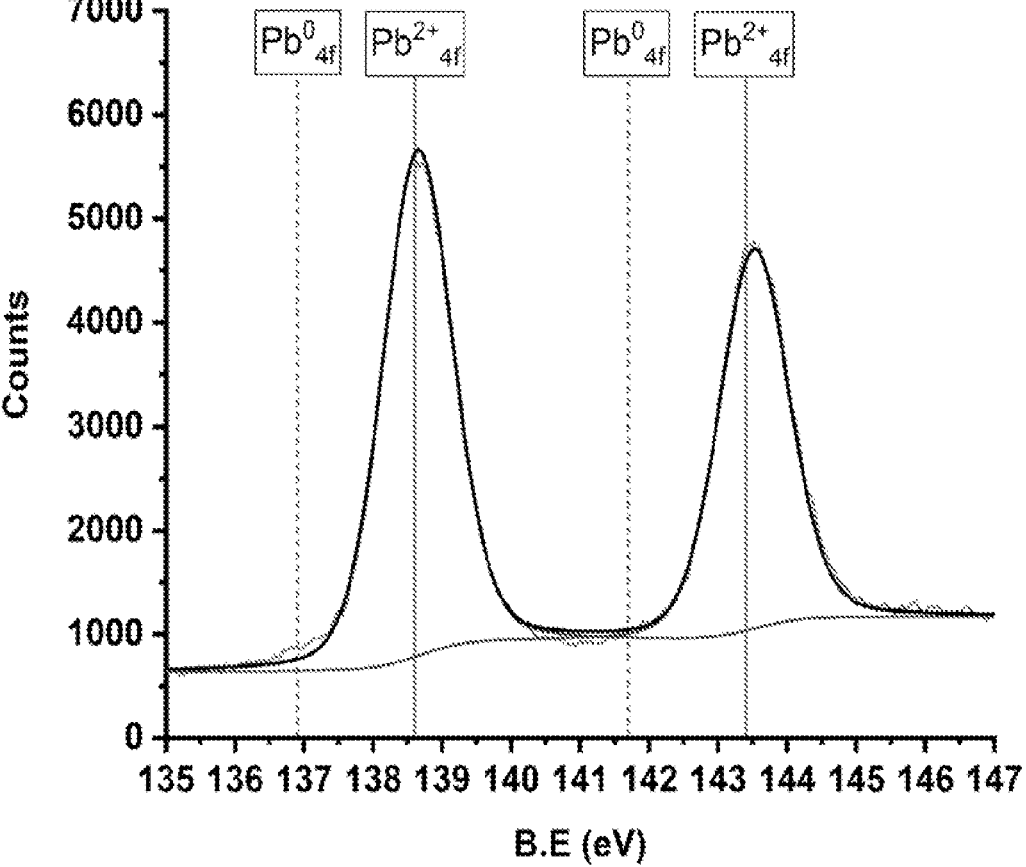
FIG. 49 depicts an x-ray photoelectron spectroscopy spectrum showing lead peaks for a perovskite thin-film using the recrystallization method described herein. All lead in the system is $Pb^{2+}$.

X-Ray Photoelectron (XPS) was used to study the composition of recrystallization treated films. In this example, films were treated with a high amount of FA and formic acid (60 mg/mL). Surface XPS shows that the thin-film is near 100% FA as shown in FIG. 48. The sample has various carbon chemistries which could be attributed to FA+, MA+ cations or acetate and formate impurities as shown in FIG. 23. XPS implies that the cation exchange renders a film that is 85-100% FA+. In addition, there are no lead oxide or metallic lead species that might be present with formic acid acting as a reducing agent (see FIG. 49). XPS showed a lower bound from fitting the C=N and C—N signal. Nitrogen signals only showed signal from FA (see FIG. 23). In FIG. 23, carbon peaks showed Carbon-Oxygen and Carbon-Nitrogen chemistry overlaps and therefore could be attributed to cations or anion impurities.

Figure 24:
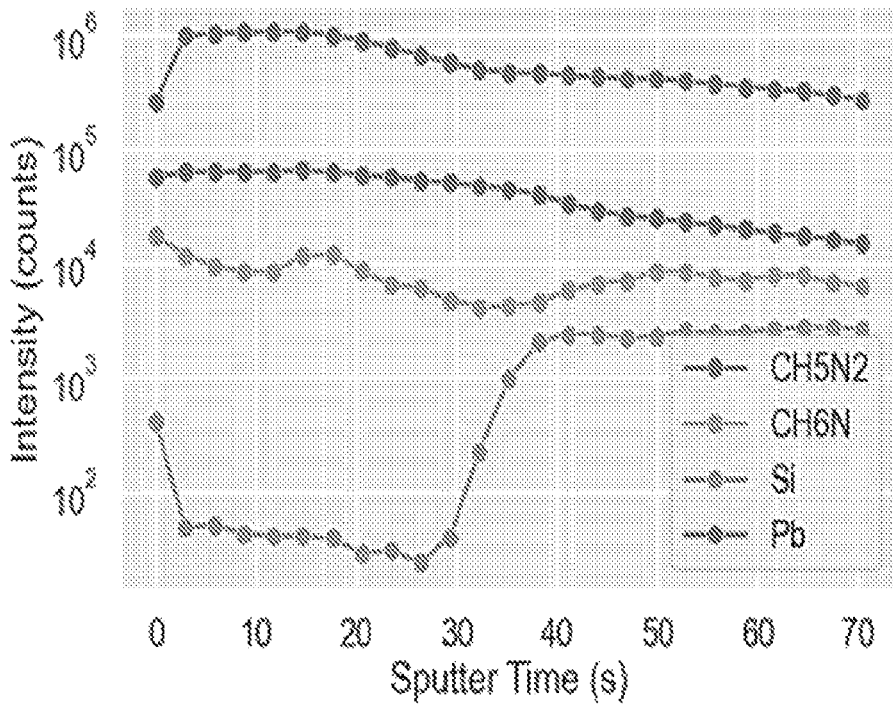
FIGS. 24 and 25 depict time-of-flight secondary ion mass spectrometry data for formamidinium exchanged films.
Figure 25:
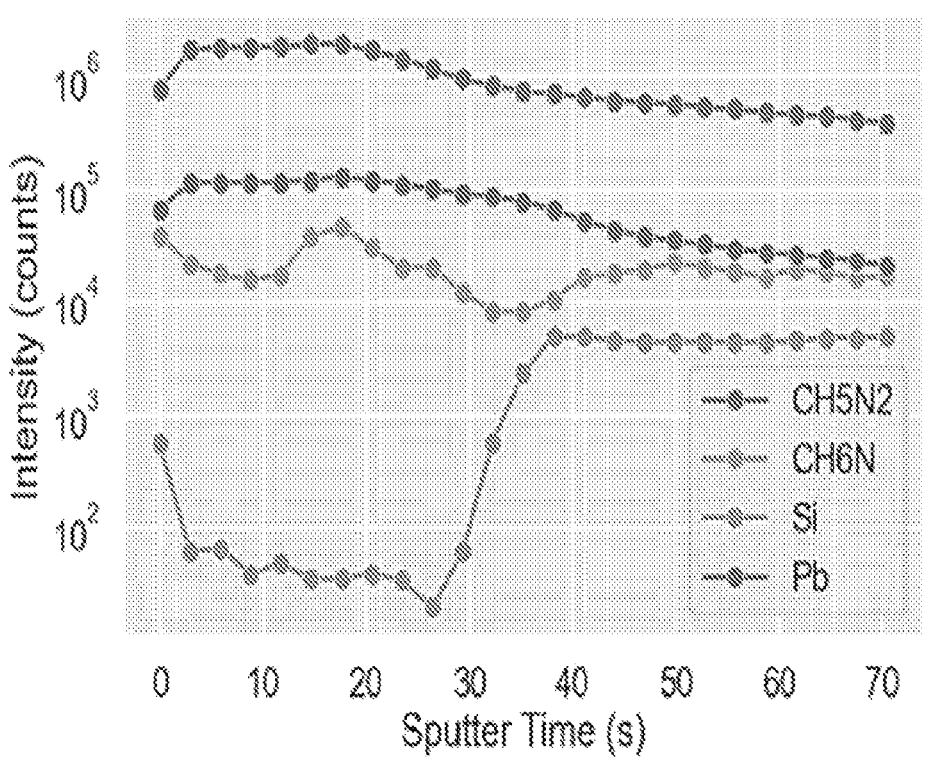
Figure 26:
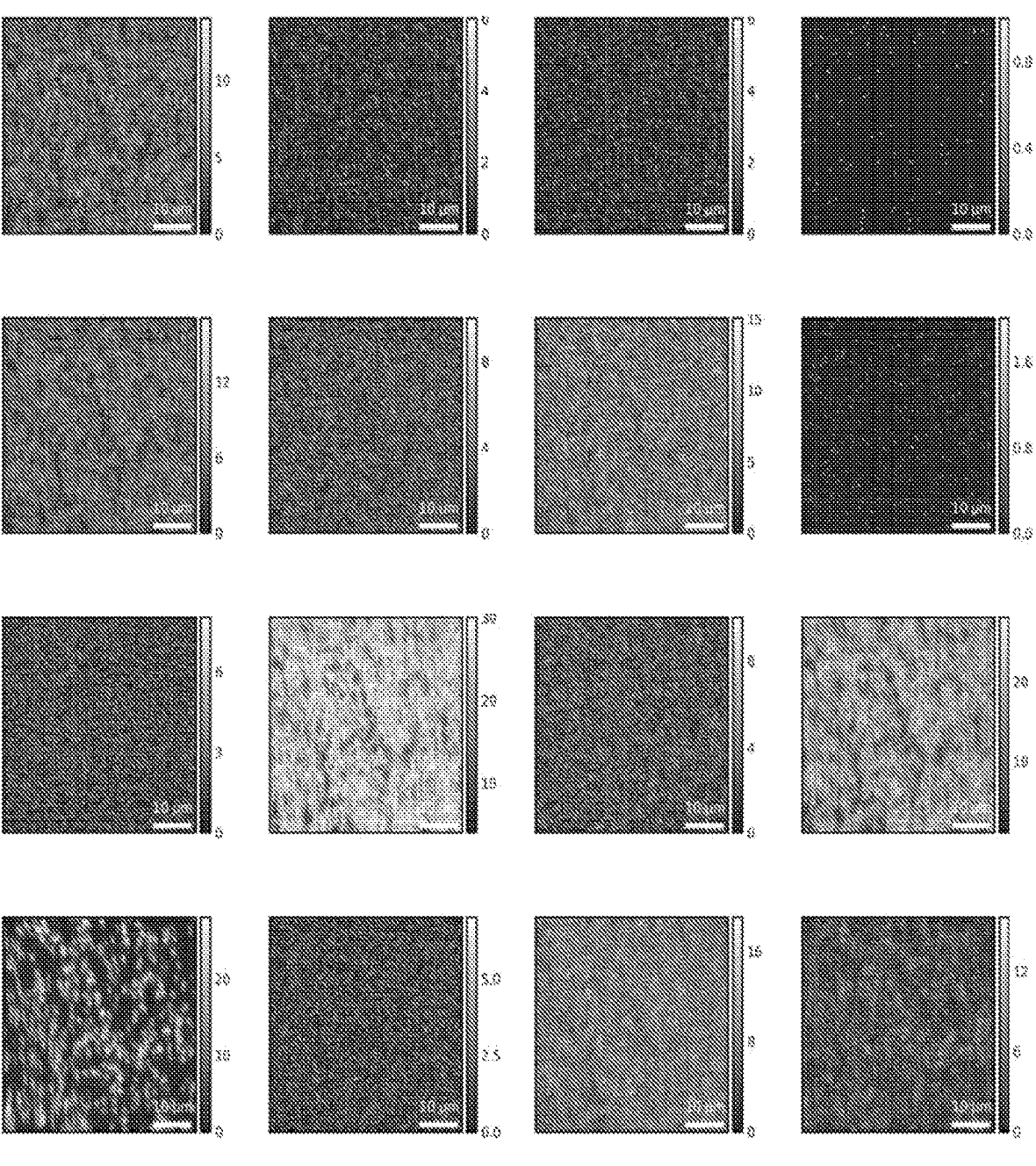
FIG. 26 depicts 2D time-of-flight secondary ion mass spectrometry data for formamidinium exchanged films.

Time-of-Flight Secondary Ion Mass Spectrometry (TOF-SIMS) data was also taken to determine the uniformity of the formamidinium (FA) exchanged films in three dimensions. For the z axis (through film) all measured ions are uniform throughout the film and consistent between spots (FIGS. 24 and 25). 2D TOF-SIMS data was taken to determine x-y uniformity. All measured ion species are uniform AMU of 45 and 72 are anti-correlated but both correspond to nitrogen-carbon species and therefore may be coming from the same source material (see FIG. 26).

Figure 27:
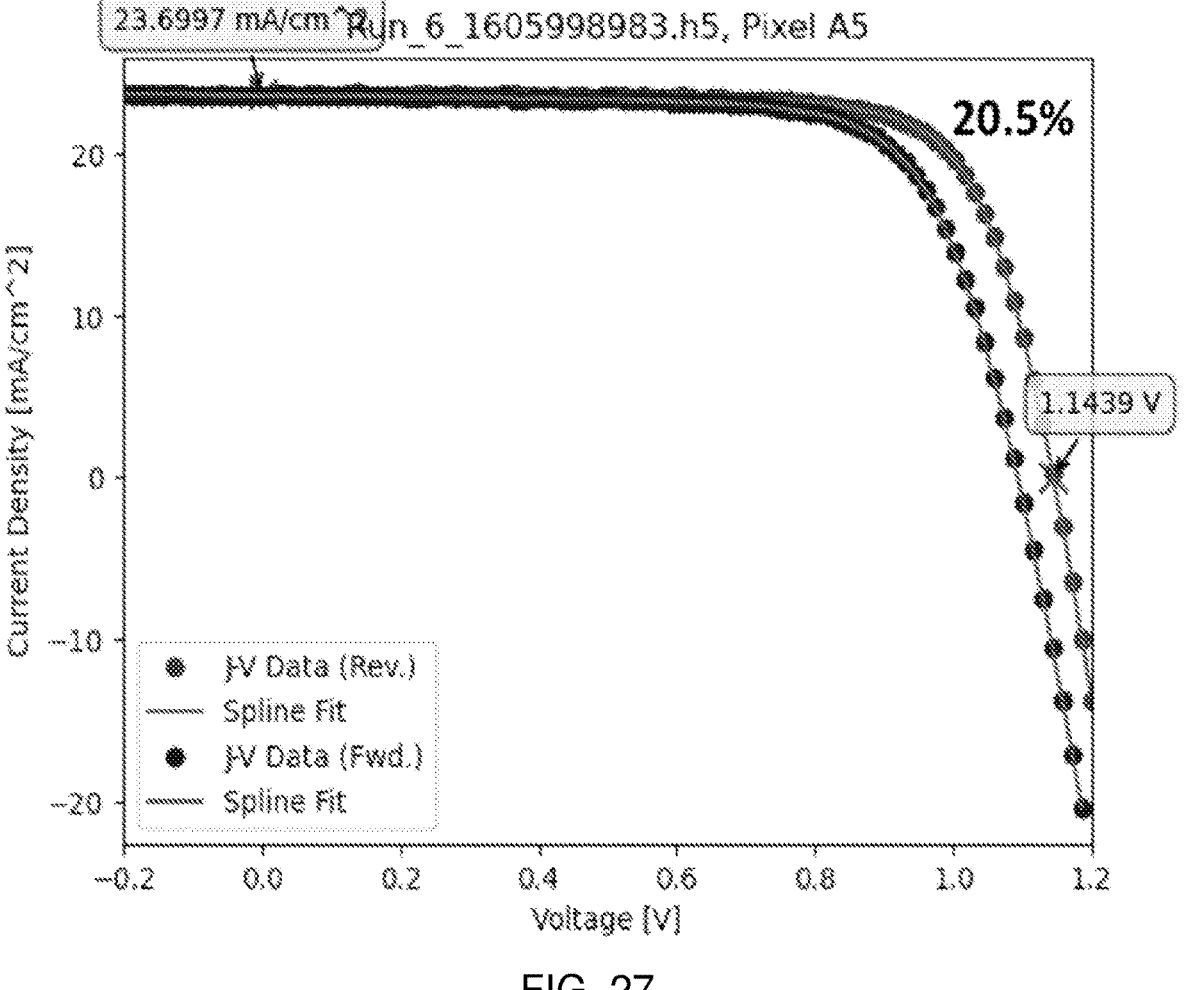
FIG. 27 depicts power conversion efficiency of a device.

Device performance of FA cation exchange inks was studied. FA cation exchanged inks perform equivalently to DMF/DMSO perovskite thin films in a SnO$_2$/FAMAPbI$_3$/Spiro-OMeTAD/Au structure. (Spiro-OMeTAD is N$^2$,N$^2$, N$^{2'}$,N$^{2'}$,N$^7$,N$^7$,N$^{7'}$,N$^{7'}$-octakis(4-methoxyphenyl)-9,9'-spi-robi[9H-fluorene]-2,2',7,7'-tetramine) Over 20% power conversion efficiency (PCE) was achieved with this architecture (see FIG. 27).

Figure 28:
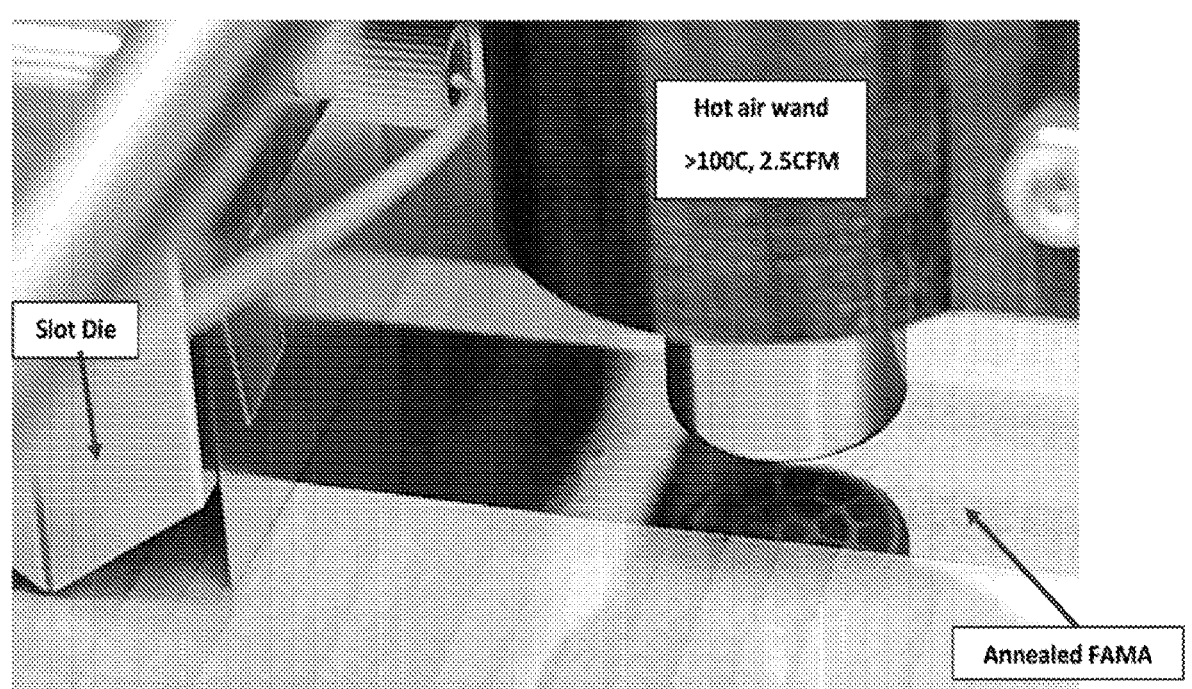
FIGS. 28 and 29 depict slot dye coating, drying and annealing off the film.
Figure 29:
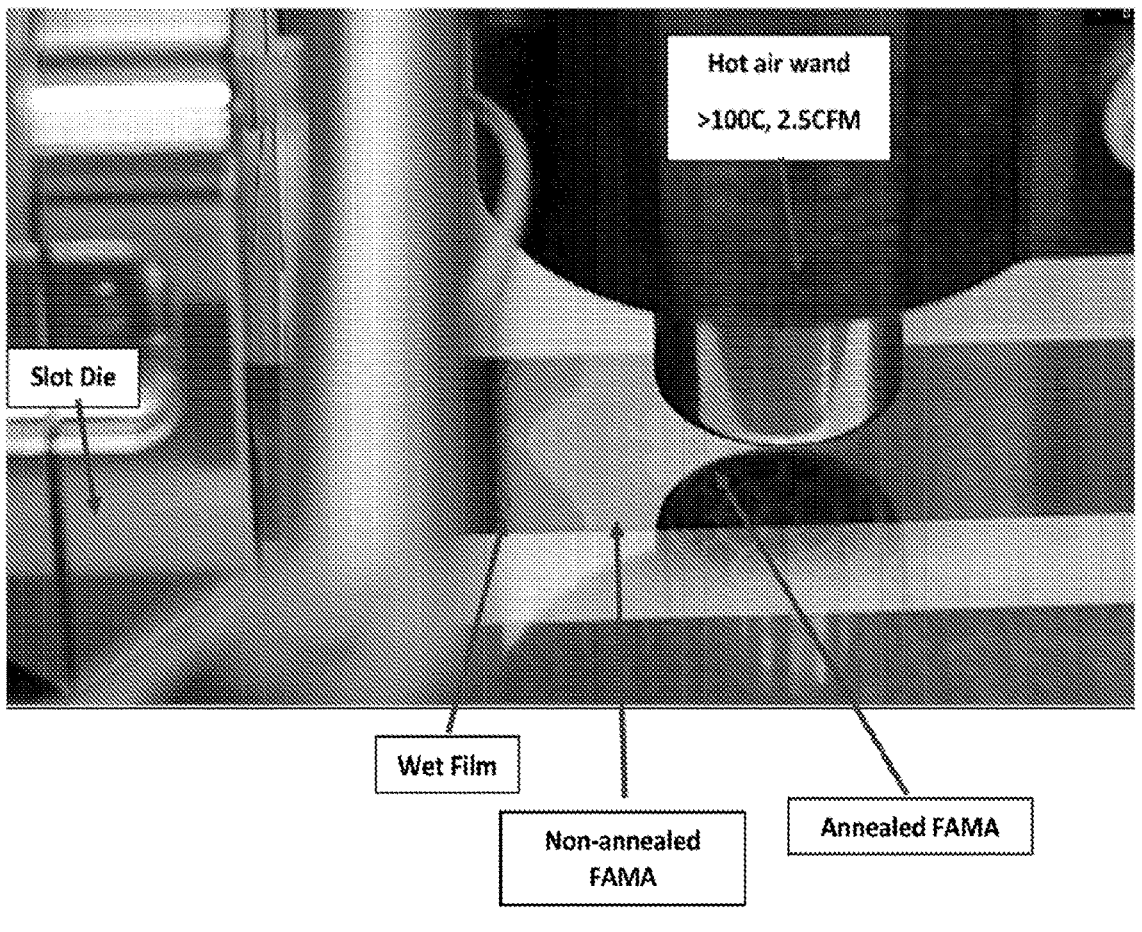

Coating performance of FA cation exchange inks was studied. Cation exchange inks are readily coatable with a standard slot die system. The FA cation ink is humidity sensitive and so a hot air wand was used to immediately dry and anneal the film with dry air (see FIGS. 28 and 29).

Figure 30:
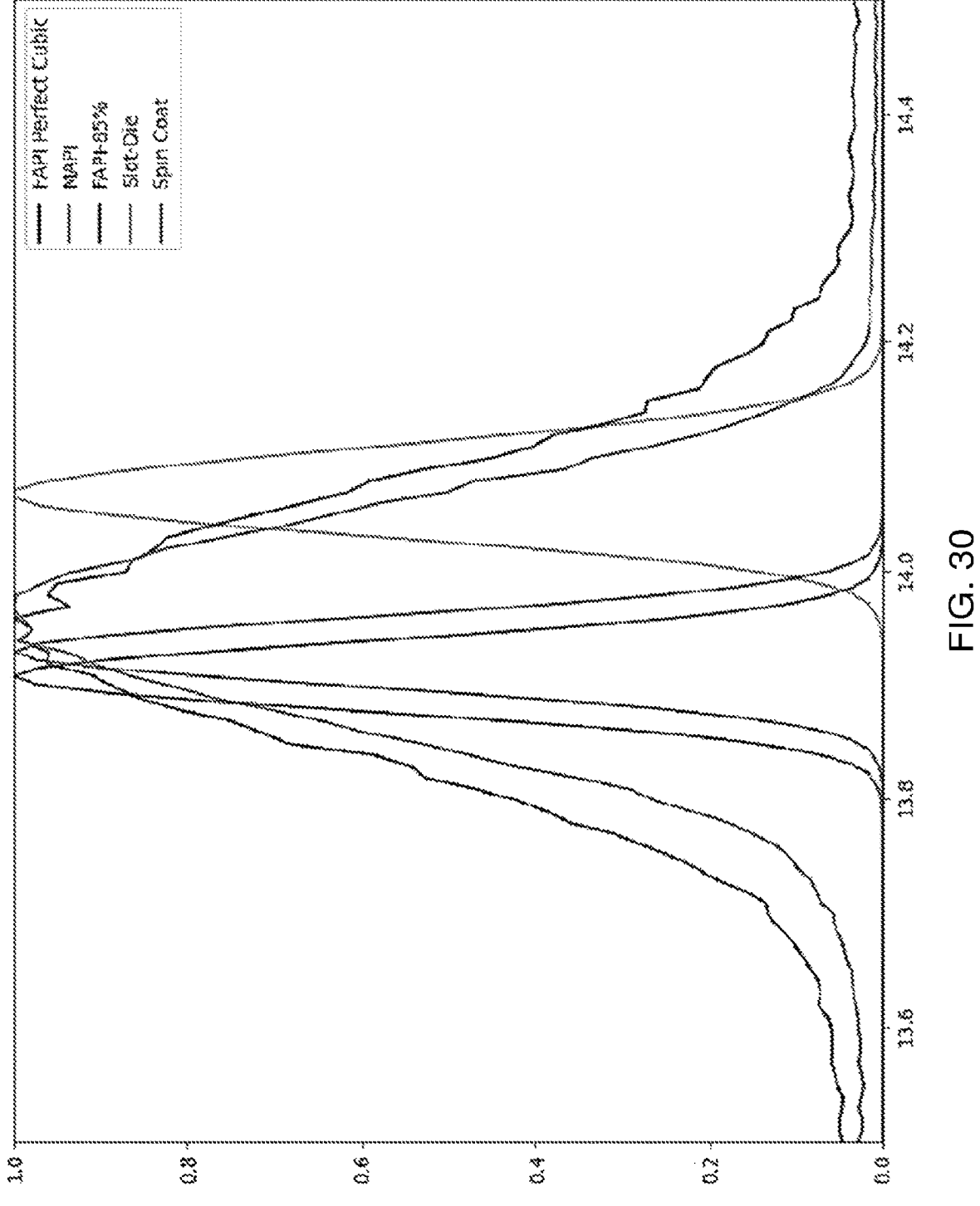
FIG. 30 depicts an x-ray diffraction spectrum of slot-die coated and spin-coated films.
Figures 31, 32:
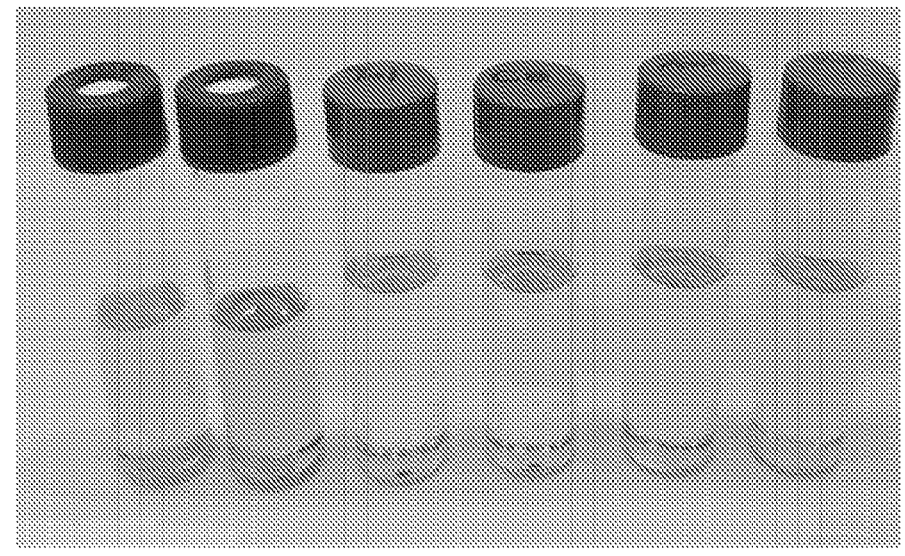
FIG. 31 depicts an x-ray diffraction spectrum of slot-die coated and spin-coated films.
FIG. 32 depicts dissolution of alkyl amine lead iodide precursors in various solvents.

XRD of slot-die films was examined. XRD phase analysis shows that slot die coated films show a similar phase to spin coated films (see FIG. 30). In addition, the slot-die coated films show no residual PbI$_2$, which may form under the spin coating process but not the slot-die coating process. Therefore, the slot-die films are more phase pure, which is an unexpected result of the fabrication method described herein (see FIG. 31).

Figure 33:
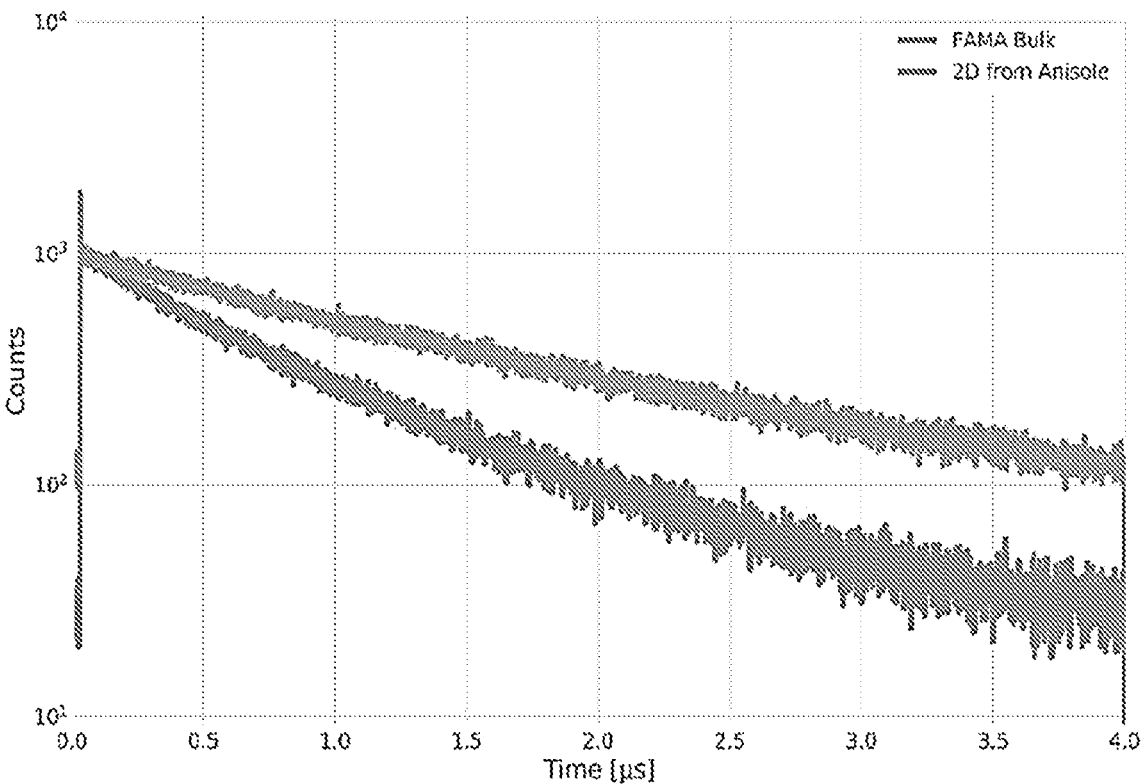
FIG. 33 depicts radiative lifetime of films.

Amine ligands extend the solubility of 2D perovskites for passivation. All high-performance perovskite solar cells utilize passivation layers to prevent ion migration and surface non-radiative pathways. Two-dimensional forming perovskite compounds can also form coordination complexes with an amine ligand. This extends the solubility of these precursors in less polar organic solvents. Phenylethylammonium Lead Triiodide dissolved in (from left to right): 0.5M in Acetonitrile, 0.5M in THF, 20 mM in Toluene, 20 mM in Chlorobenzene, 20 mM in Anisole, 20 mM in Dow PNP (see FIG. 32). Depositing these inks shows similar radiative lifetime improvement as standard 2D passivation techniques (see FIG. 33).

A method of ink formulation can be coupled with mechanical control of drying to make large area, uniform semiconductor thin films, in a single step. This preparation method, and coupled deposition can also be done in solvents like THF, which are more desirable at manufacturing scale. This method can be used to fabricate methylammonium lead iodide perovskite inks as well as copper thiocyanate based inks. Both utilize complexing amines in order to drive solubility.

As described, in this method, a two-step deposition method can exchange organic components in the as deposited semiconductor films. This widens range of possible material phase compositions in organometallic perovskites while simultaneously reducing thermal annealing times, and therefore scalability. In addition, it allows for doping in other systems, or for fast solid-state conversion.

As an example, this process, and results are demonstrated with a triple-cation, multi-halide organometallic lead perovskite for optoelectronic applications. Other systems which may take advantage of similar methods.

Multi-component organic-inorganic crystalline materials can be difficult to process via low cost methods such as solution processing due to the differences in solubility of each component. With multiple components, solubility of each component may limit final deposition and interactions with the solvent may provide chemical degradation pathways and products that end up in the final film. Using solvents that are safe for use and capable of being manufactured on industrial scales may also remove barriers to commercialization and lower overall costs.

Depositing two materials in which chemically react to form a thin film of desired material. Unlike other methods, the first material is in the same crystal structure as the final material, and is therefore an atomistic exchange and recrystallization rather than a chemical reaction and phase crystallization. This can allow for faster conversion and processing, circumventing traditional solid-state phase nucleation and growth. If chosen correctly, products from the original material will exchange and leave gaseously from the desired film. A general method is described in FIG. 34.

In one demonstrated example, multi-cation perovskites can be fabricated. Perovskites are a group of materials that have a perovskite crystal structure of the form ABX$_3$ (A=Organic or inorganic cation, B=Lead, X=halide or pseudo-halide). Multi-cation perovskites containing organic and inorganic components are interesting for optoelectronic purposes as solar cells and light emitting devices (LEDs). However, they are difficult to process at scale and are processed through the use of toxic solvents. This method allows for the use of safer solvents as well as large area uniformity.

Ink Preparation

Perovskite Ink (Material 1)

Figure 35:
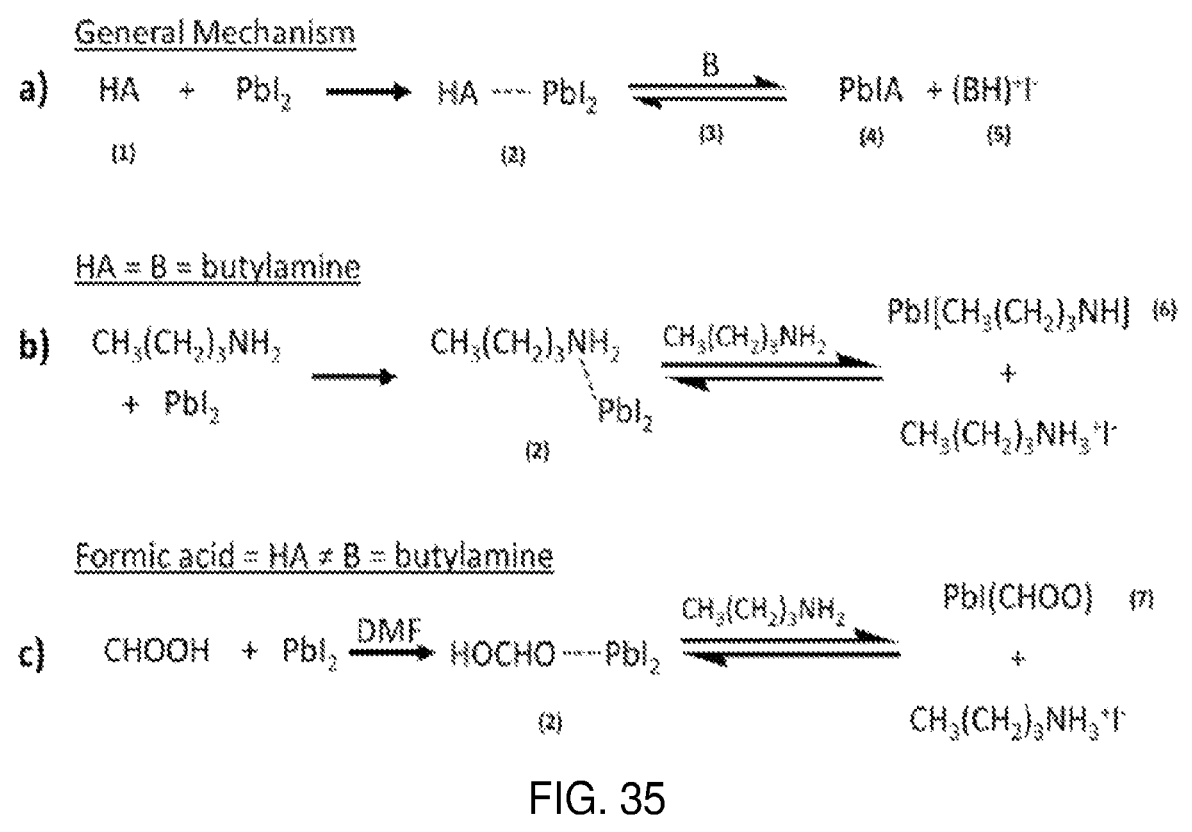

Ink preparation for the perovskite phase (Material 1) includes a complexing base, usually a short chain amine like methylamine or isopropylamine which is mixed with a solution of perovskite precursors, lead or tin halides or pseudo-halides and organic halide salts. The base complexes with the lead following a general reaction scheme shown below in FIG. 35, allowing for solubility. The process has been recently studied for butylamine, but takes place with most transition metal halides to varying degrees (Kerner et al., 2018). Additional solvents can be added to fully dissolve this complex in order to create a completely ionic solution. Four solvating systems have been found to work with this process, listed below with a description of the role of each in Table 1. The perovskite components are listed in Table 2.

TABLE 1

Ink solvents for initial perovskite deposition. Solid components are in Table 2 and compatible with all systems.

| Component | Phase | Amount | Description |
|---|---|---|---|
| | | Solution 1 | |
| THF | Liquid | 90% V | Main Solvent |
| Acetonitrile | Liquid | 10% V | Polar Solubility promoter |
| Methylamine | Gas | 0.5M | Complexing Base |
| | | Solution 2 | |
| THF | Liquid | 90% V | Main Solvent |
| Methanol | Liquid | 10% V | Polar Solubility promoter |
| Methylamine | Gas | 0.5M | Complexing Base |
| | | Solution 3 | |
| THF | Liquid | 95% V | Main Solvent |
| Acetonitrile | Liquid | 2.5% V | Polar Solubility promoter |
| Isopropylamine | Liquid | 2.5% V | Complexing Base |
| | | Solution 3 | |
| THF | Liquid | 95% V | Main Solvent |
| Methanol | Liquid | 2.5% V | Polar Solubility promoter |
| Isopropylamine | Liquid | 2.5% V | Complexing Base |
| | | Solution 4 | |
| THF | Liquid | 90% V | Main Solvent |
| Ethanol | Liquid | 10% V | Polar Solubility promoter |
| Methylamine | Gas | 0.5M | Complexing Base |

TABLE 2

Perovskite components for perovskite deposition (Material 1)

| Component | Phase | Amount | Description |
|---|---|---|---|
| Lead Iodide (PbI$_2$) | Solid | 0.5M | Lead source, iodine source |
| Methylammonium Iodide (MAI) | Solid | 0.25M | Methammonium source, iodine source |
| Methylammonium Bromide (MABr) | Solid | 0.25M | Methammonium source, bromine source |
| Methylammonium Chloride (MACl) | Solid | 0.075M | Crystallization modifier |
| Guanidinium Thiocyanate (GASCN) | Solid | 0.025M | Nucleation promoter |

Cation Exchange Ink (Material 2)

Ink preparation for the second material is also a mixed solvent system, with primary alcohols making up the majority of the solvent system and water added to increase solubility of the cation salts in longer chain alcohols (ethanol, propanol, butanol). Solid Components are listed in Table 4.

TABLE 3

Ink systems for cation exchange material (Material 2)

| Component | Phase | Amount | Description |
|---|---|---|---|
| | | Solution 1 | |
| Ethanol | Liquid | 98% V | Main Solvent |
| Water | Liquid | 2% V | Solubility promoter, Perovskite dopant |
| | | Solution 2 | |
| Butanol | Liquid | 95% V | Main Solvent |
| Water | Liquid | 5% V | Solubility promoter, Perovskite dopant |
| | | Solution 3 | |
| Butanol | Liquid | 95% V | Main Solvent |
| Formic Acid | Liquid | 5% V | Solubility promoter, Perovskite dopant |
| | | Solution 4 | |
| Proplyene Glycol Propyl Ether | Liquid | 95% V | Main Solvent |
| Formic Acid | Liquid | 5% V | Solubility promoter, Perovskite dopant |

TABLE 4

Solid components for cation exchange material ink

| Component | Phase | Amount | Description |
|---|---|---|---|
| Formamidinium Acetate | Liquid | 0.1M-0.75M | Formamidinium source, acetate source |
| Cesium Acetate | Liquid | 0.025M-0.5M | Cesium source, acetate source |

Ink Deposition

Ink depositions take place sequentially without any thermal annealing or thermal drying in between. Ink drying takes place at room temperature. An air knife or drying apparatus may be used in accordance with our previous disclosure. Thermal annealing then immediately takes place between 80° C. and 130° C. for 2 to 30 minutes to fully intersperse and re-crystalize all materials. Methylammonium Acetate is unstable at these temperatures and is expected off-gas from the film, or decompose and off-gas. In doing this, it therefore exchanges with formamidinium and cesium, leaving those behind in the crystal lattice. For devices, thermal annealing took place for 15 minutes. The chemical process is described in FIG. 36.

Figure 37:
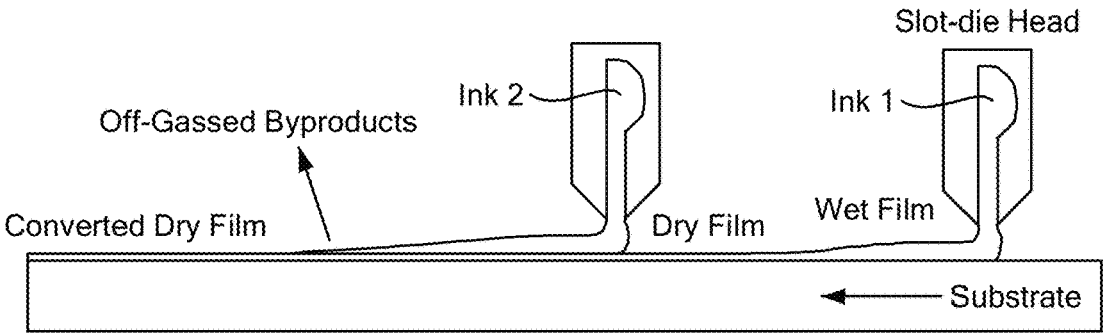
FIG. 37 depicts a two-step method transferred to large-area manufacturing with slot-die coating.

To integrate into roll-to-roll printing lines, this can entail a two-slot die head configuration, before a thermal oven as seen in FIG. 37. Geometry between heads can depend on speed and drying configurations, but manufacturing speeds in the range of 1-100 m/min should be possible with this technique.

Material and Device Results

X-Ray Diffraction

Figure 38:
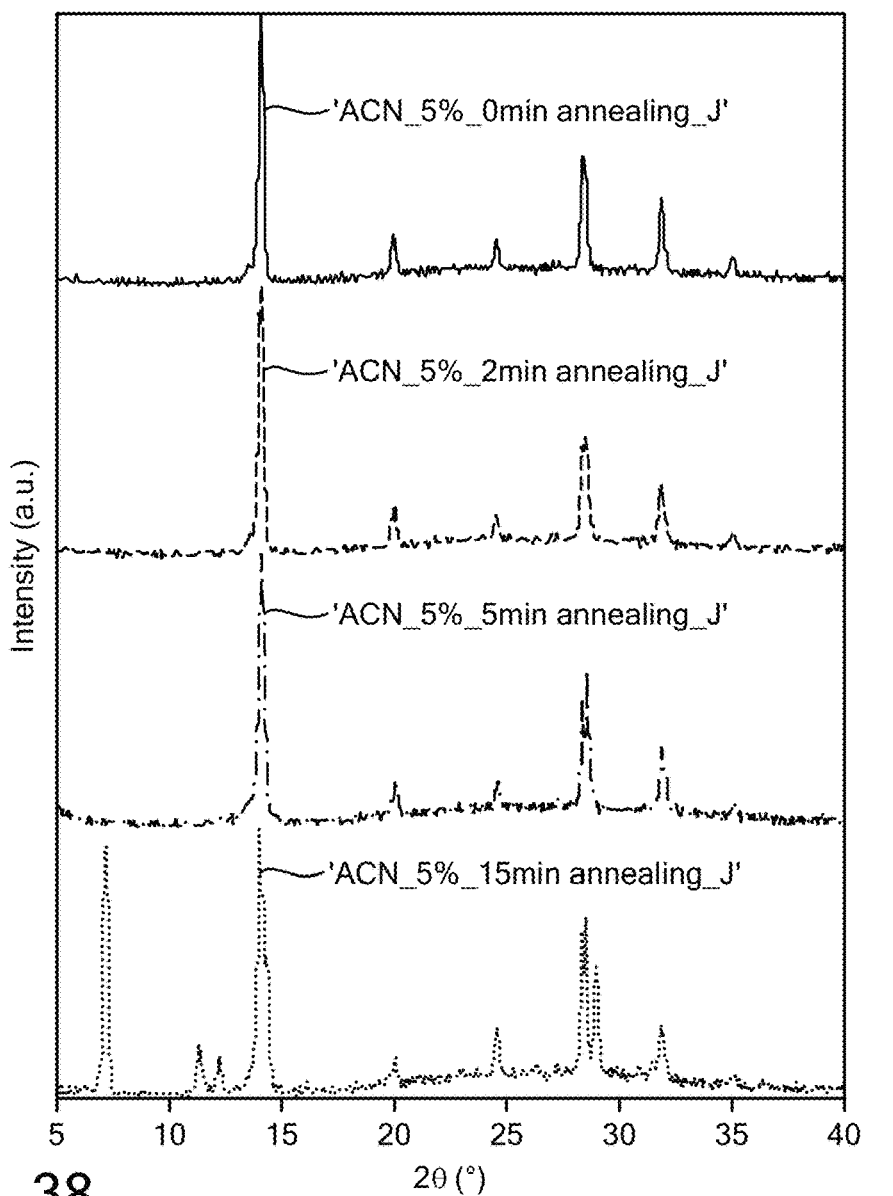
FIG. 38 depicts an x-ray diffraction spectrum of a film at different annealing times.

X-ray diffraction measurements show that thermal annealing and material conversion into final stoichiometry can be as low as 2 minutes, thereby showing the speed in which this method can be used to make usable material thin films. This is shown in FIG. 38.

Devices

Figure 39:
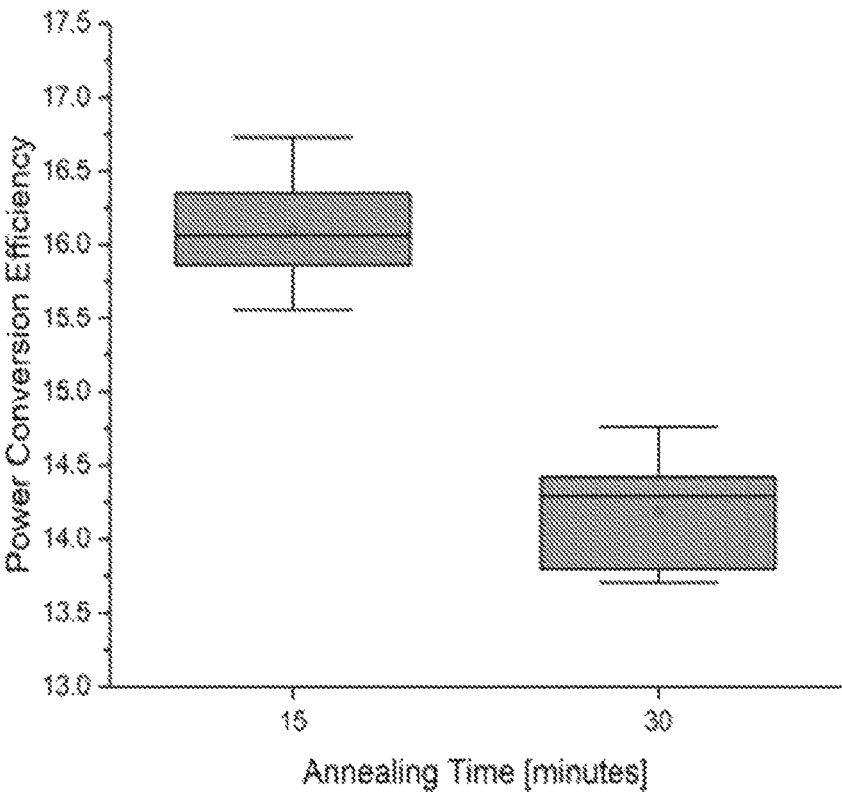
FIG. 39 depicts a range of solar cell device power conversion efficiency prepared with this method.
Figure 40:
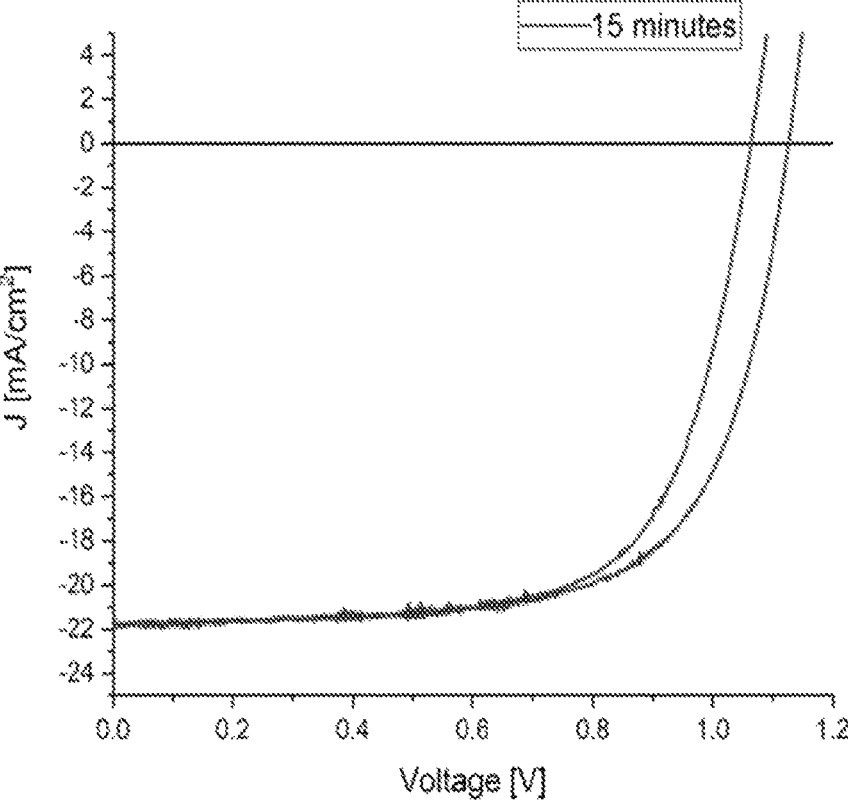
FIG. 40 depicts averaged current voltage-curve for 15 minute anneal time using this method.

This material preparation method was made into a standard n-i-p heterojunction solar cell and the efficiency was averaged over 12 samples. The range of efficiencies over the samples is shown in FIG. 39. The averaged current-curve for the 15 minutes of anneal time is shown in FIG. 40. This demonstrates that this method creates high quality active layer thin films for solar cell applications.

Extension to Other Systems

LEDs: Perovskite Based

Cesium Lead Bromide based LEDs have shown just as much promise as solar cell technology. Cesium lead bromide and its halide and cation derivatives are bandgap tunable and therefore show promise for red and green LEDs. Quantum confined nanoparticles and nanoplatelets can have emission in the blue. This method has the potential of using fast printing processes to deposit these materials, and therefore create fully printable displays for low cost information technology.

Batteries: LiPON

Lithium Phosphate doped with nitrogen (LiPON) is an alternative lithium battery solid state electrolyte that has shown reasonable stability and reasonable energy density. In this system, nitrogen acts as a crystal stabilizer and reduces degradation at the lithium electrode interface. It is a promising material in battery technology due to being a direct replacement for commercial liquid electrolytes.

Using this same technique, it may be possible to fabricate a lithium phosphate thin film via solution processing and thermal annealing similar to the perovskite system. Lithium acetate dissolves in most polar solvents. Due to being a metal salt, ammonia may be used to increase solubility. Ammonium phosphate is one of the only highly soluble phosphates known. Therefore, a two step method may look like the process shown in FIG. 41.

Figure 42:
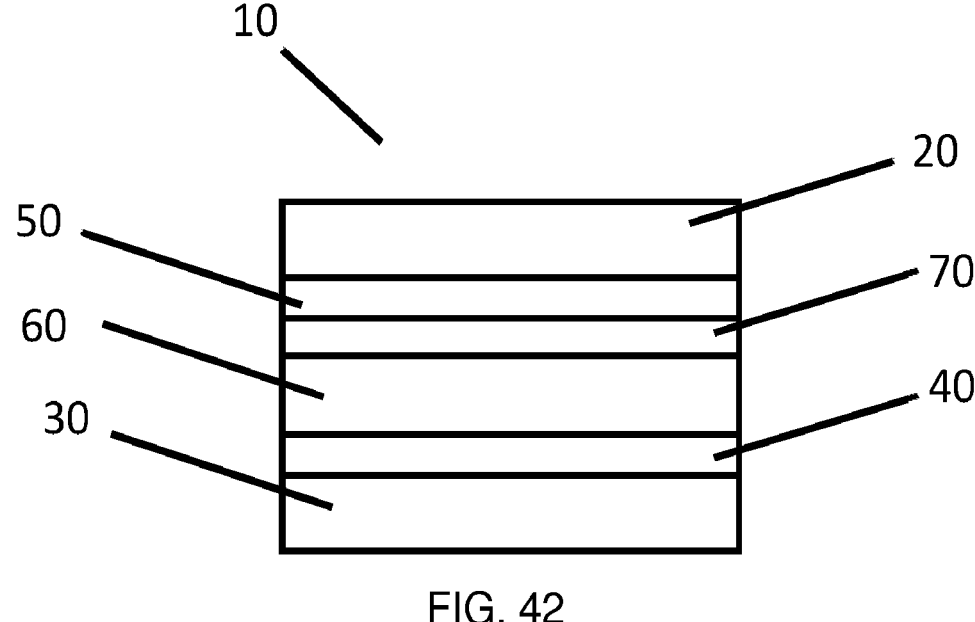
FIG. 42 depicts a photovoltaic device.
Figure 43:
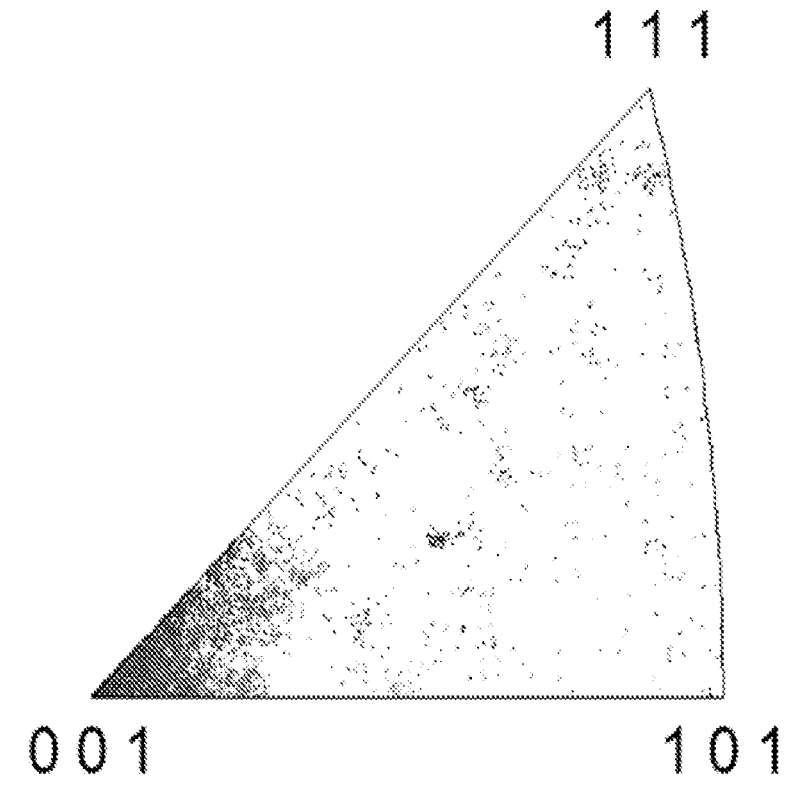
FIG. 43 depicts an electron backscatter diffraction (EBSD) scan of grain orientation of perovskite thin-films deposited using the method described herein.

FIG. 42 features a photovoltaic device 10. Device 10 includes electrode 20 and electrode 30. Hole transport layer 40 and electron transport layer 50 can contact respective electrodes. Between the transport layers 40, 50 can be a perovskite layer 60 and an optional barrier layer 70.

Physical Properties of Recrystallized Thin-Films

Methylammonium Lead Iodide (MAPI) thin-film are recrystallized with either Formamidinium (FA) Acetate or salts with formic acid to form a FA-rich perovskite film (FAMA) or with both Formamidinium and Cesium (Cs) Acetate and salts with formic acid to form a Cs doped FA-rich perovskite film (CsFAMA). The recrystallization treatment process is fully dynamic and any level of cation stoichiometry can be achieved through different treatment levels.

Grain Orientation

Figure 44:
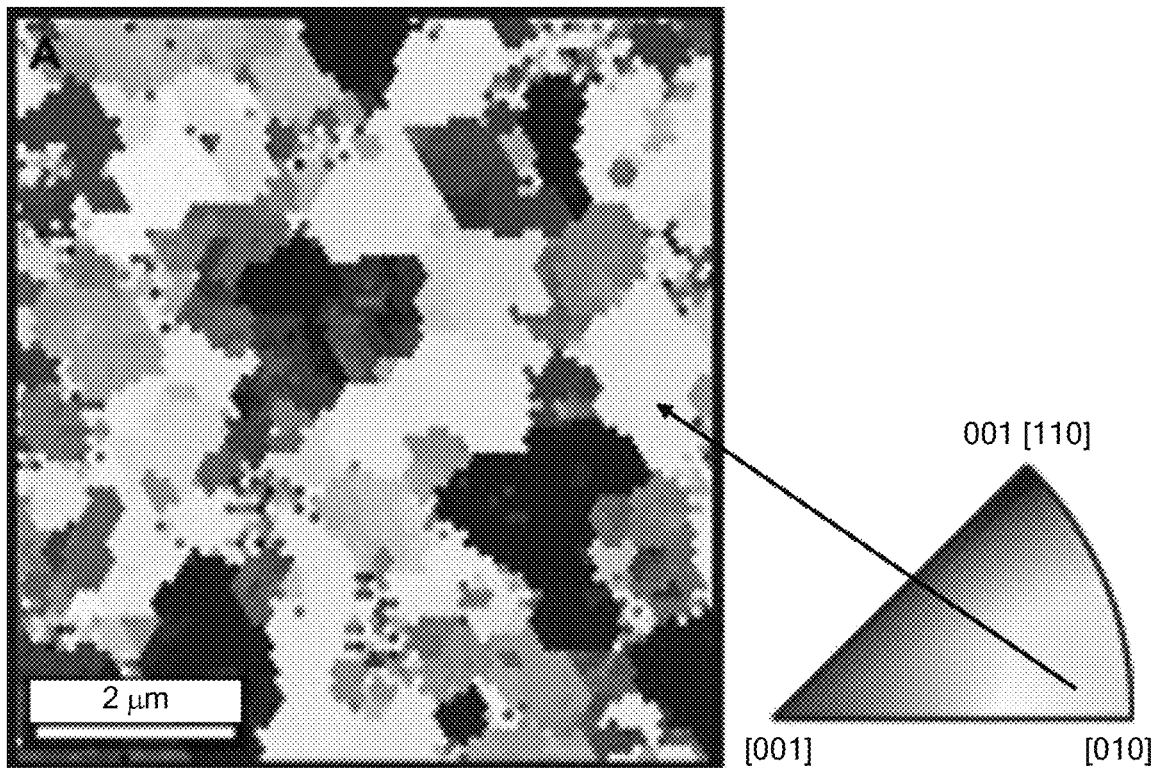
FIG. 44 is a micrograph depicting orientation of grains in a perovskite thin-film manufactured with a DMF/DMSO recipe.

Thin films deposited from the method described herein show highly oriented grains in the [100] plane unlike films deposited from traditional DMF and DMSO inks with an antisolvent wash. This can be seen through electron backs-catter diffraction (EBSD) taken on films deposited with this method compared to known DMF/DMSO methods as seen in FIG. 44 (see, S. Jariwala, et al., Joule, Volume 3, Issue 12, 2019, 3048-3060, which is incorporated by reference in its entirety). Films manufactured through DMF/DMSO are strongly oriented to the direction.

Grain Morphology

Figure 45:
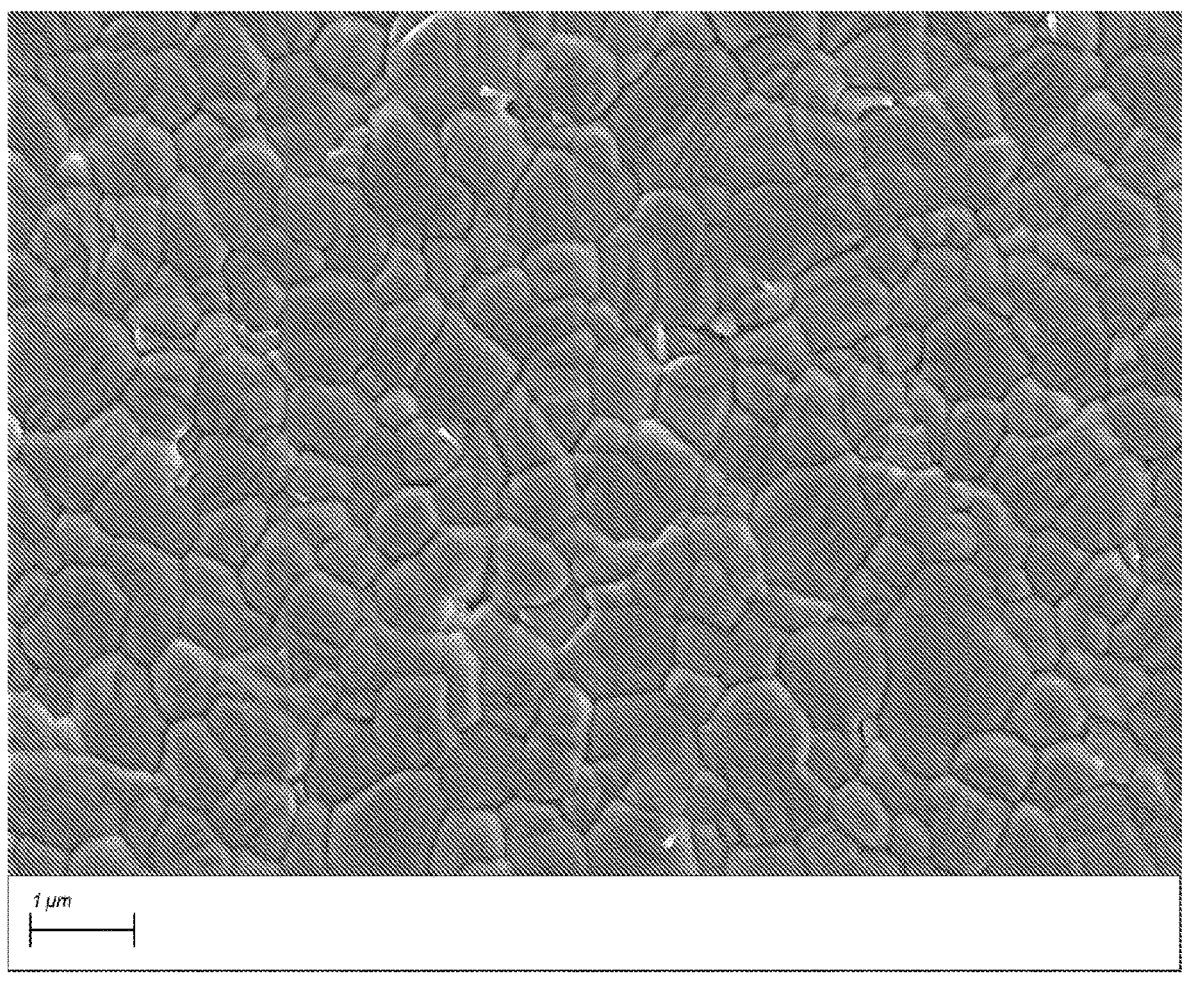
FIG. 45 is a micrograph depicting morphology of a perovskite thin-film using a DMF/DMSO fabrication route.
Figure 46:
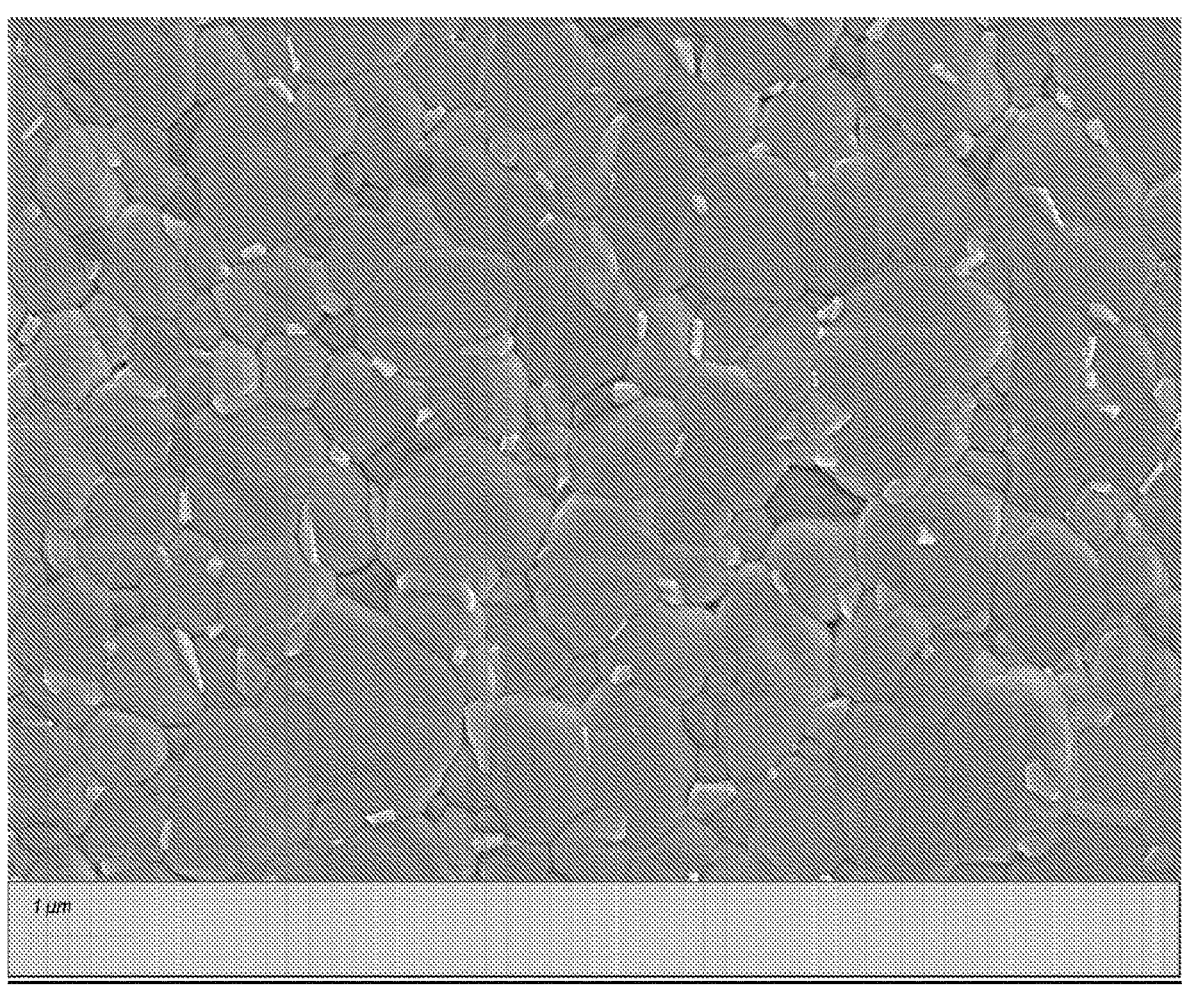
FIG. 46 is a micrograph depicting morphology of a perovskite thin-film using the method described herein.

Grain structures of perovskite thin-films prepared with this method are often larger than their DMF/DMSO counterparts. Shown in FIG. 45 is the grain morphology of a thin-film prepared with DMF/DMSO. Grains of a perovskite thin-film using this method are seen in FIG. 46.

Steady state PL emission shows a singular emission peak related to absorption onset. Films manufactured using this method are therefore uniform in terms of stoichiometry. See FIG. 47.

PV Device Performance

Figure 51:
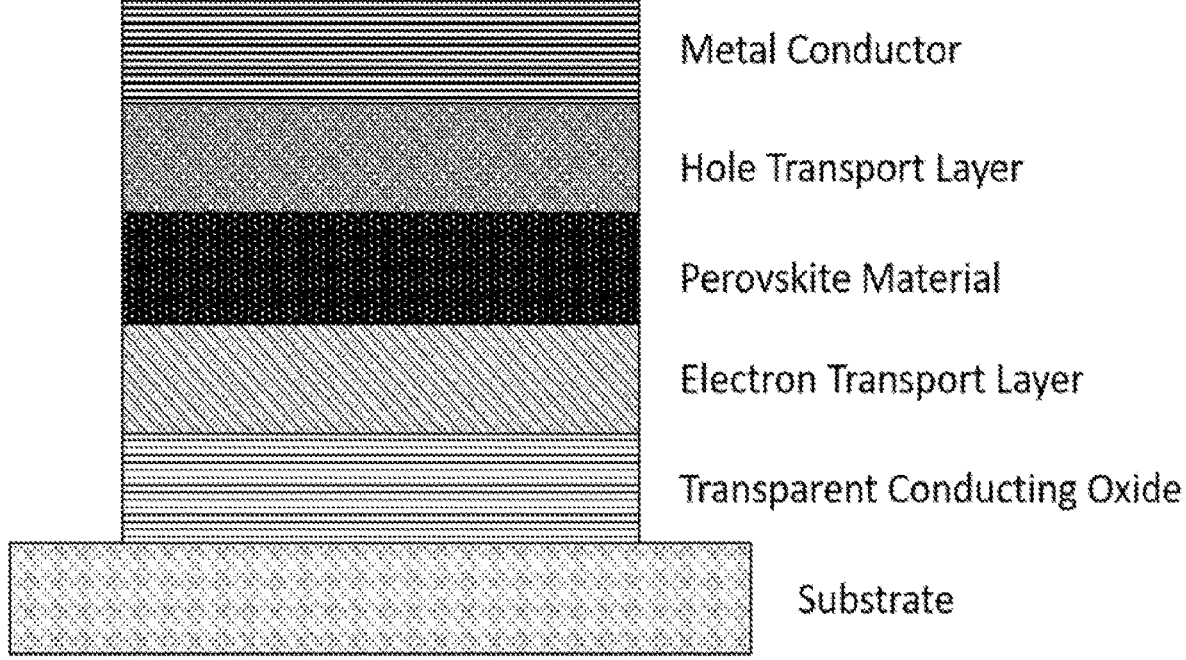
FIG. 51 depicts a schematic showing a general planar device architecture of a N-I-P based perovskite photovoltaic.
Figure 52:
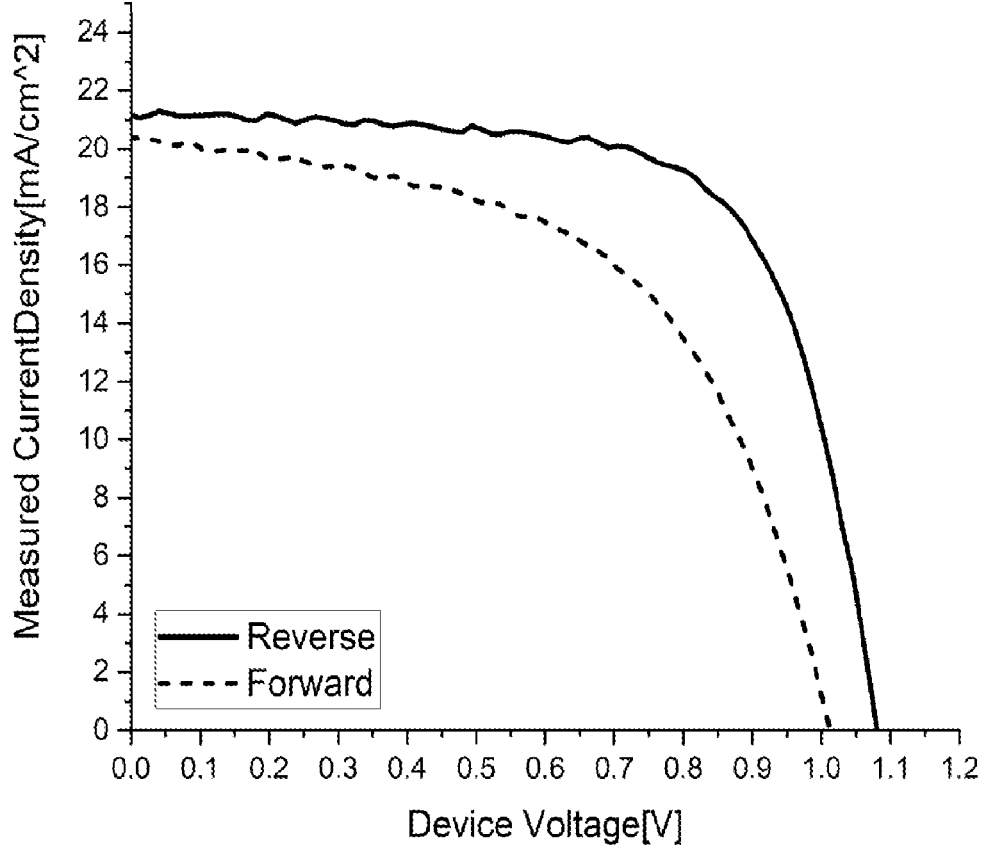
FIG. 52 is a graph depicting PV device performance using a perovskite thin-film made using the methods described herein.
Figure 53:
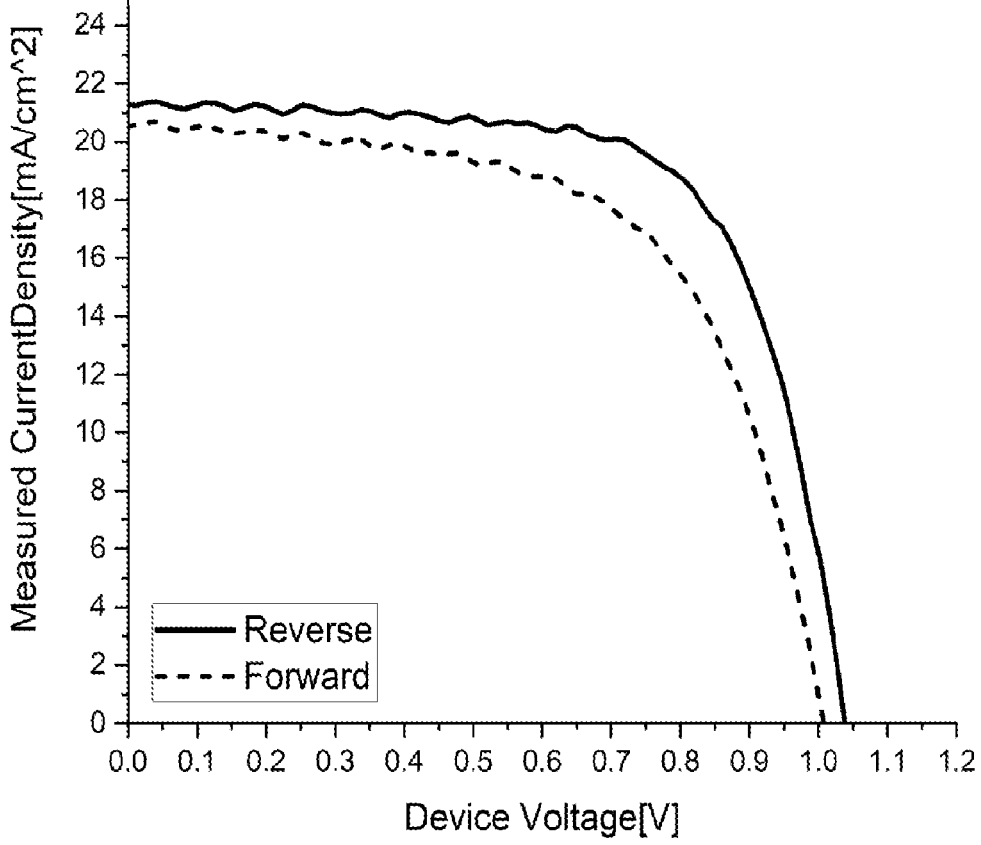
FIG. 53 is a graph depicting PV device performance using a perovskite thin-film made using a traditional DMF/DMSO procedure.
Figure 55:
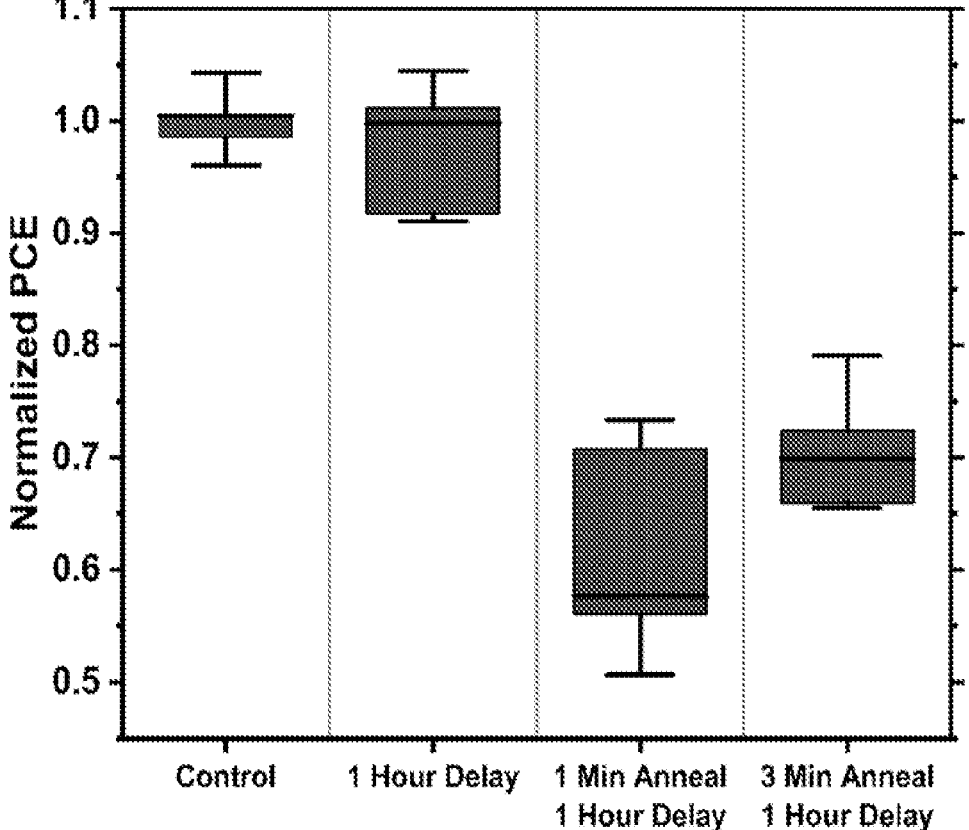
FIG. 55 is a graph depicting timing delays between first MAPI deposition and FA recrystallization under different conditions related to power conversion efficiency.

Photovoltaic devices manufactured with this method perform similarly to devices made with DMS/DMSO. Here a traditional N-I-P architecture was used as described in FIG. 51. A model device made using our method is shown in FIG. 55 and a device using standard DMF/DMSO is shown in FIG. 53.

Cesium Incorporation

Figure 54:
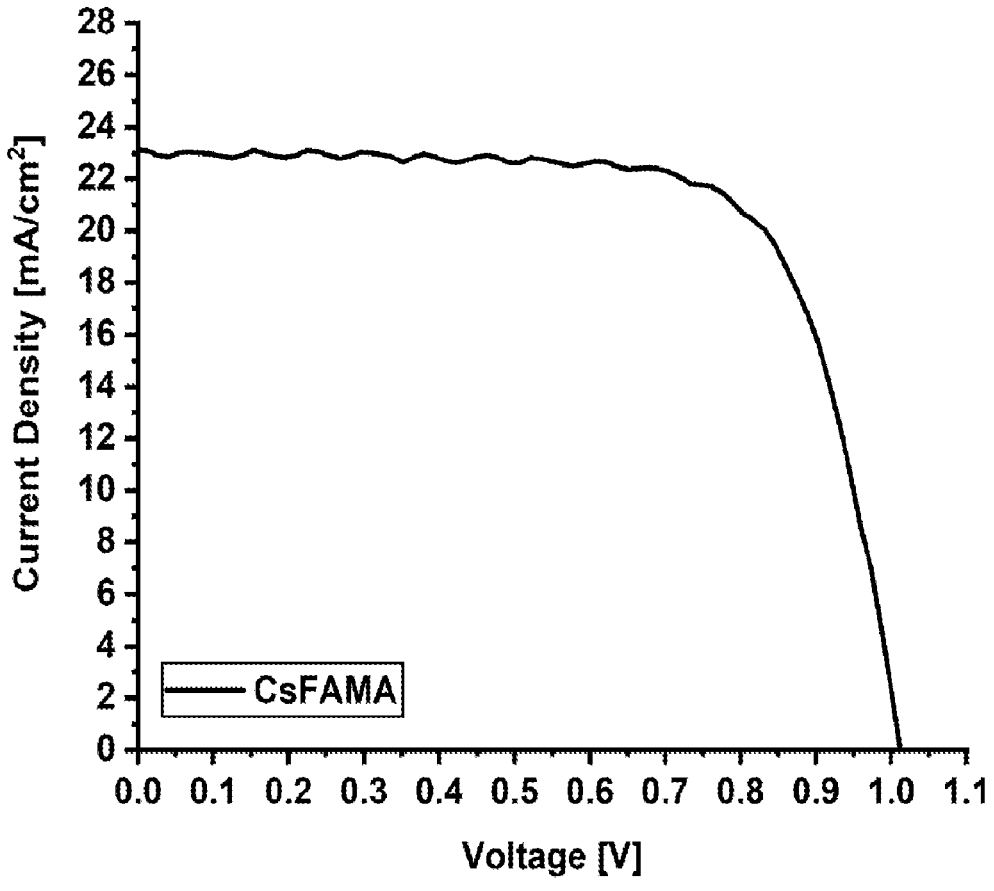
FIG. 54 is a graph depicting PV device performance using a perovskite thin-film incorporating cesium as well as formamidinium using the methods described herein.

In addition to the above examples, cesium may also be incorporated using this technique. A PV device incorporating cesium is seen in FIG. 54.

Timing Delays

Figure 56:
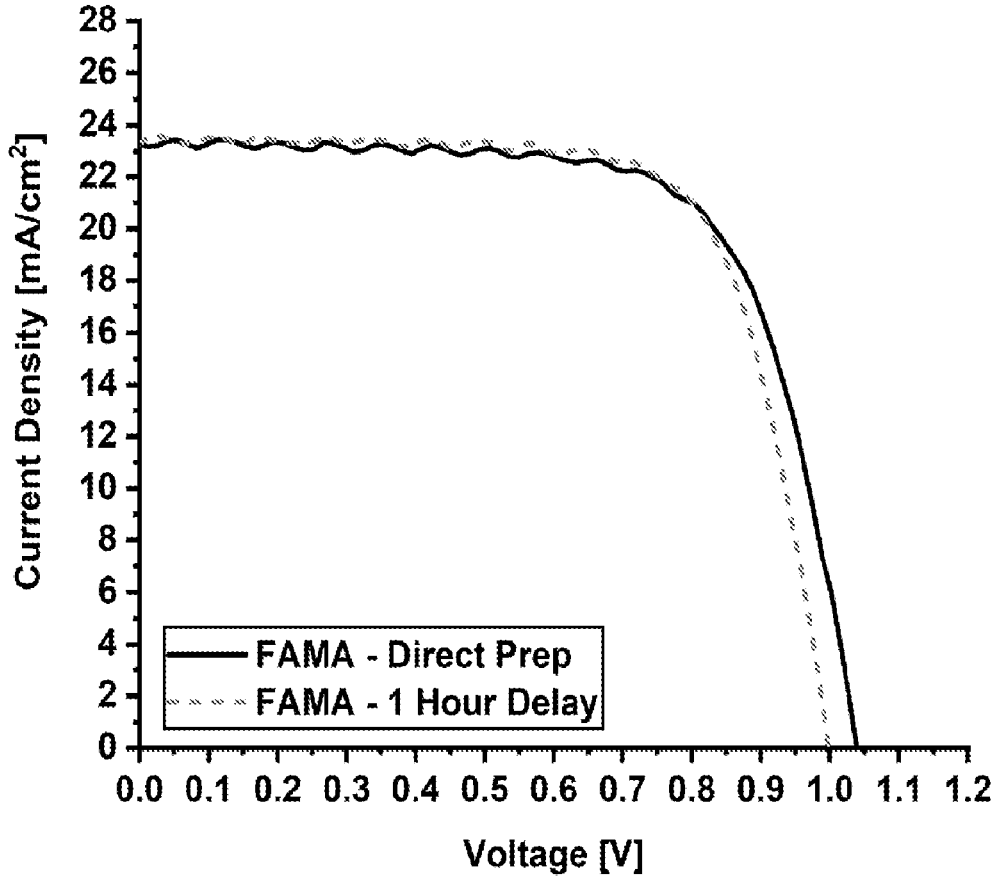
FIG. 56 is a graph depicting a device performance of a FAMA film prepared directly and a FAMA based device with a 1 hour delay between the MAPI and FA recrystallization steps.

There are no timing requirements between the first MAPI deposition and the recrystallization step. After the MAPI is deposited the second recrystallization treatment can happen up to an hour later with no significant negative effects so long as the film is not thermally annealed in between. This is seen in FIG. 55 and with device performance of representative devices seen in FIG. 56.

Additional MACL Treatment

Figure 57:
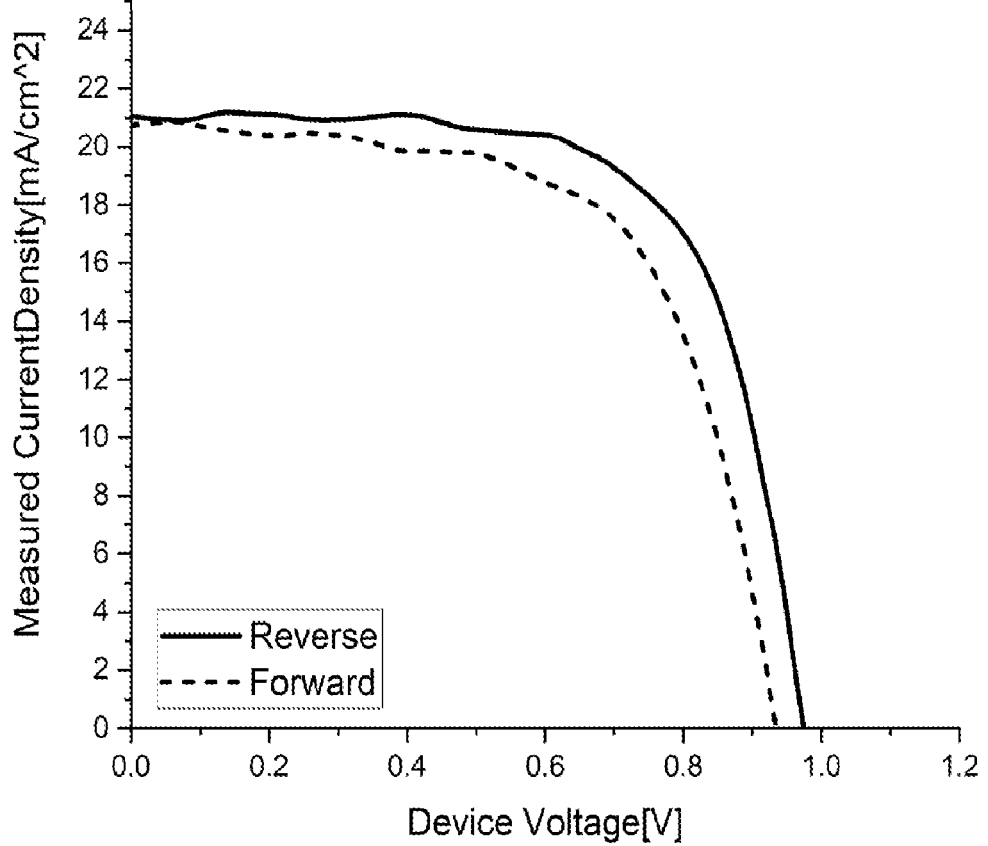
FIG. 57 is a graph depicting a CsFAMA device using a MACL post-treatment after recrystallization.

Additional methylammonium chloride (MACL) addition steps can be implemented to increase uniformity and lowers hysteresis in recrystallized films. Shown in FIG. 57 is a PV device recrystallized with FA and cesium and treated with additional MACL.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. It should also be understood that the appended drawings are not necessarily to scale, presenting a somewhat simplified representation of various features and basic principles of the invention.

What is claimed is:

1. A method of fabricating a semiconductor thin film comprising:

depositing a perovskite precursor in a first solvent on a substrate, the precursor forming a first perovskite layer on a surface of the substrate;

applying a recrystallization additive in a second solvent to the layer on the surface of the substrate to form a second layer on the substrate, wherein the first perovskite layer and the second layer are deposited sequentially without thermal treatment in between; and annealing the first layer and the second layer to exchange a cation of the recrystallization additive with a cation of the perovskite precursor to form a perovskite alloy film and a volatile byproduct.

2. The method of claim 1, wherein the first perovskite layer is a 2D perovskite layer.

3. The method of claim 1, wherein the perovskite precursor includes an alkyl ammonium lead halide.

4. The method of claim 3, wherein the halide is a chloride, a bromide or an iodide.

5. The method of claim 1, wherein the perovskite precursor includes a methylammonium lead iodide.

6. The method of claim 1, wherein the first solvent includes tetrahydrofuran, 2-methyltetrahydrofuran, a glycol ether, acetonitrile, methanol, ethanol, propanol, butanol, tris(dimethylamino)silane, bis(dimethylamino)dimethylsilane, hexamethyldisilazane, hexamethylphosphoramide (HMPA), dimethylformamide, dimethylsulfoxide, propylene carbonate, gamma butyrolactone, 1,3-dimethyl-2-imidazolidinone, N,N'-dimethylpropyleneurea, N-butylpyrrolidinone, or combinations thereof.

7. The method of claim 1, wherein the second solvent includes isopropanol, butanol, or a glycol ether.

8. The method of claim 7, wherein the glycol ether is propylene glycol propyl ether, propylene glycol methyl ether, propylene glycol butyl ether, ethylene glycol propyl ether, ethylene glycol methyl ether, ethylene glycol butyl ether, or combinations thereof.

9. The method of claim 1, wherein the recrystallization additive includes a formate salt, an acetate salt, or combinations thereof.

10. The method of claim 1, wherein the recrystallization additive includes a formamidinium formate, formamidinium acetate, cesium formate, cesium acetate, strontium formate, strontium acetate, ytterbium formate, ytterbium acetate, cerium formate, cerium acetate, germanium formate, germanium acetate, or combinations thereof.

11. The method of claim 1, wherein the perovskite alloy film includes a material having the formula (I)

where A is an organic cation, A' is an organic or an inorganic cation different from A', B' is a divalent metal cation or missing, and X is a halide ion.

12. The method of claim 11, wherein A' is cesium or formamidimium.

13. The method of claim 11, wherein a ratio of A:A' is tuned based on a cation content of the perovskite precursor and a cation content of the recrystallization additive.

14. The method of claim 11, wherein the volatile byproduct includes an ammonium acetate or an ammonium formate.

15. The method of claim 14, wherein the ammonium is methylammonium.

16. The method of claim 11, wherein depositing includes spin-coating, ink-jet printing, roll-to-roll printing, slot die coating, blade coating, or spray coating.

17. The method of any one of claim 11, wherein applying includes spin-coating, ink-jet printing, roll-to-roll printing, slot die coating, blade coating, or spray coating.

18. The method of claim 11, wherein annealing includes applying heat at an annealing temperature for an annealing time.

19. The method of claim 18, wherein the annealing temperature is between 30° C. and 200° C.

20. The method of claim 18, wherein the annealing time is between 20 seconds and 60 minutes.

21. The method of claim 1, wherein the time between the applying and the annealing is less than 60 minutes.

22. The method of claim 1, further comprising treating the layer with an annealing ink including an alkylammonium chloride in a third solvent that is not a solvent for the semiconductor film.

23. The method of claim 22, wherein the alkylammonium chloride includes methylammonium chloride.

24. The method of claim 22, wherein the third solvent includes propylene glycol methyl ether.

25. The method of claim 22, wherein the first solvent includes tetrahydrofuran.

26. The method of claim 22, wherein the second solvent includes an alcohol.

* * * * *